United States Patent
Araki et al.

(12) 
(10) Patent No.: US 7,163,982 B2
(45) Date of Patent: Jan. 16, 2007

(54) PROCESS FOR PREPARING FLUORINE-CONTAINING POLYMER AND METHOD OF FORMING FINE PATTERN USING SAME

(75) Inventors: Takayuki Araki, Settsu (JP); Tetsuhiro Kodani, Settsu (JP); Takuji Ishikawa, Settsu (JP)

(73) Assignee: Daiki Industries, Ltd., Osaka (JP)

( * ) Notice: Subject to any disclaimer, the term of this patent is extended or adjusted under 35 U.S.C. 154(b) by 331 days.

(21) Appl. No.: 10/914,203

(22) Filed: Aug. 10, 2004

(65) Prior Publication Data

US 2005/0049374 A1    Mar. 3, 2005

(30) Foreign Application Priority Data

Aug. 13, 2003 (JP) .............................. 2003-292899
Nov. 19, 2003 (JP) .............................. 2003-389289
Jan. 23, 2004 (JP) .............................. 2004-016166

(51) Int. Cl.
*C08F 8/32* (2006.01)

(52) U.S. Cl. .............................. 525/326.2; 525/326.4; 525/359.3; 525/378; 525/379

(58) Field of Classification Search ............. 525/326.2, 525/326.4, 359.3, 378, 379
See application file for complete search history.

(56) References Cited

U.S. PATENT DOCUMENTS 6,468,712 B1   10/2002   Fedynyshyn

FOREIGN PATENT DOCUMENTS

EP           1365290 A1    11/2003
WO    WO 02/065212 A1     8/2002

*Primary Examiner*—Bernard Lipman
(74) *Attorney, Agent, or Firm*—Sughrue Mion, PLLC

(57) ABSTRACT

There is provided a method of forming a fine pattern by using a practicable fluorine-containing polymer which has a high transparency to exposure light having a short wavelength such as $F_2$ laser and can undergo resolution of a fine pattern. The method comprises (I) a step for preparing a fluorine-containing polymer (A) having OH group which has a structural unit derived from a fluorine-containing norbornene derivative having OH group, (II) a step for preparing a fluorine-containing polymer (B) having a protective group by reacting a compound represented by X—$CH_2$OR, wherein X is Cl, Br or I; R is a hydrocarbon group having 1 to 30 carbon atoms in which a part or the whole of hydrogen atoms may be substituted with fluorine atoms, with the above-mentioned fluorine-containing polymer (A) having OH group in the presence of a base, (III) a step for preparing a resist composition comprising (a) the above-mentioned fluorine-containing polymer (B) having a protective group, (b) a photoacid generator and (c) a solvent, (IV) a step for forming a resist film comprising the above-mentioned resist composition on a substrate or on a given layer on the substrate, (V) a step for exposing by selectively irradiating a given area of the resist film with energy rays, and (VI) a step for subjecting the exposed resist film to developing to selectively remove the exposed portion of the resist film, thus forming a fine pattern.

12 Claims, 1 Drawing Sheet

PROCESS FOR PREPARING FLUORINE-CONTAINING POLYMER AND METHOD OF FORMING FINE PATTERN USING SAME

BACKGROUND OF THE INVENTION

The present invention relates to a method of forming a fine pattern in production of semiconductor equipment. Further the present invention relates to a process for preparing a fluorine-containing polymer for a resist which is used in forming a fine pattern.

Ultra fine fabrication is required for various electronic parts such as semiconductor integrated circuit, and a resist is widely used for a processing technology therefor. With the pursuit of multi functions and high density of electronic parts, ultra fine fabrication of a resist pattern to be formed is demanded. As the resist used for fabrication of such an ultra fine pattern, there are, for example, chemically amplifying resists disclosed in JP63-27829A, etc.

A chemically amplifying positive resist is, for example, a composition comprising a photoacid generator and a resin being soluble in a developing solution and having an alkali soluble group (—COOH group, —OH group, etc.), in which a group (protective group) having a dissolution inhibiting effect is introduced. In an un-exposed state, solubility in a developing solution (2.38% aqueous solution of tetramethylammonium hydroxide) is inhibited by the protective group.

When the resist film formed on a substrate is irradiated with light, X-ray, high energy electron beam or the like, a photoacid generator is decomposed at an exposed portion and an acid is generated and when the resist film is further subjected to heat-treating after the exposure, the acid acts as a catalyst to convert a protective group to an alkali soluble group. Therefore an intended pattern can be formed by dissolving and removing, with a developing solution, the exposed portion in which the protective group has been decomposed.

For forming a pattern using such a resist, a reduction projection exposure system usually called a stepper is generally used as an exposure system. As a result of a recent remarkable progress of multi functions and high density of electronic parts, a further fine circuit is demanded, which makes it necessary to form a fine pattern.

In the above-mentioned exposure system, since a pattern fabrication is carried out by projecting an optical image on a substrate, a limit of resolution depends on a wavelength of light used for the exposing.

For the fine fabrication, a wavelength of light source used for the exposing has been shortened. It is a matter of certainty that in production of a device coming after a giga bit memory era, $F_2$ laser having a wavelength of 157 nm will be mainly used as light source. Therefore, development of a chemically amplifying resist capable of forming a fine pattern using $F_2$ laser as light source has already been initiated.

However materials which have been used for conventional resist absorbs a large amount of $F_2$ laser having a wavelength of 157 nm. When $F_2$ laser is used for the exposing of a photosensitive composition prepared from such materials, sufficient amount of exposure light does not reach the bottom of the resist. Therefore uniform exposing in the direction of a depth of the photosensitive composition formed on the substrate cannot be carried out, and it is difficult to enhance resolution.

Various fluorine-containing polymers having a norbornene backbone have been studied as a resist polymer being excellent in transparency to $F_2$ laser. For example, in International Publication Nos. WO00/67072, WO03/006413 and WO03/007080, there are proposed fluorine-containing polymers prepared by copolymerizing norbornene derivatives having a functional group:

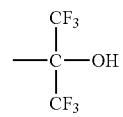

and a functional group:

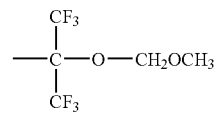

having the protected OH group. The synthesis of the fluorine-containing polymer having those protective groups is carried out by copolymerization after previously preparing a norbornene derivative having a group:

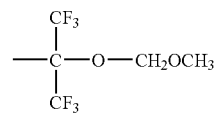

However though a resist film obtained from a resist composition comprising a fluorine-containing polymer having a structural unit derived from a norbornene derivative having a protective group introduced by a conventional method is excellent in transparency, there is a problem that when formation of a fine resist pattern is intended, sufficient resolution is difficult to obtain because solubility in a developing solution of the fluorine-containing polymer, in which the protective group has been decomposed by an acid generated from a photoacid generator at exposing, is insufficient.

The present invention was made based on new findings to solve the mentioned problems. An object of the present invention is to provide a method of forming a fine pattern by using, as a resist, a highly practicable fluorine-containing polymer which can undergo resolution of fine pattern and is highly transparent to exposure light having a short wavelength such as $F_2$ excimer laser.

SUMMARY OF THE INVENTION

The present invention is characterized in that a pattern is formed by using a fluorine-containing polymer having a protective group, in which the protective group enabling the polymer to act as a positive resist is introduced to a specific fluorine-containing polymer having OH group by a specific method, thereby making it possible to form a resist pattern having high resolution in the formation of fine pattern.

Namely, the first of the present invention relates to a method of forming a fine pattern comprising, in order:

(I) a step for preparing a fluorine-containing polymer (A) having OH group (hereinafter referred to as "polymer (A)") which has a structural unit derived from a OH-containing norbornene derivative (m2-1a) and having a moiety represented by the formula (1):

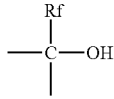
(1)

wherein Rf is a fluorine-containing alkyl group having 1 to 5 carbon atoms;

(II) a step for reacting a compound of the formula (3):

$$X\text{—}CH_2OR \quad (3)$$

wherein X is Cl, Br or I; R is a hydrocarbon group having 1 to 30 carbon atoms, in which a part or the whole of hydrogen atoms may be substituted with fluorine atoms, with the polymer (A) in the presence of a base, thereby preparing a fluorine-containing polymer (B) having a protective group (hereinafter referred to as "polymer (B)") which has a structural unit derived from a norbornene derivative (m2-1b) and having a moiety represented by the formula (2):

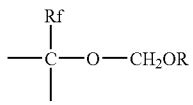
(2)

wherein Rf is as defined in (1) above, R is a hydrocarbon group having 1 to 30 carbon atoms, in which a part or the whole of hydrogen atoms may be substituted with fluorine atoms;

(III) a step for preparing a resist composition comprising:
(a) the polymer (B),
(b) a photoacid generator and
(c) a solvent;
(IV) a step for forming a resist film comprising the above-mentioned resist composition on a substrate or on a given layer on the substrate;
(V) a step for exposing by selectively irradiating given areas of the resist film with energy rays, and
(VI) a step for subjecting the exposed resist film to developing treatment and selectively removing the exposed portions of the resist film to form a fine pattern.

The second of the present invention relates to a process for preparing a fluorine-containing polymer (B1) having a protective group (hereinafter referred to as "polymer (B1)") by using a fluorine-containing polymer (A1) having OH group (hereinafter referred to as "polymer (A1)") which has a moiety represented by the formula (1):

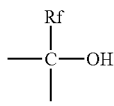
(1)

wherein Rf is a fluorine-containing alkyl group having 1 to 5 carbon atoms, and converting the moiety of the formula (1) to a moiety represented by the formula (2):

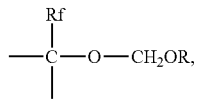
(2)

wherein Rf is as defined in the formula (1) above, R is a hydrocarbon group having 1 to 30 carbon atoms, in which a part or the whole of hydrogen atoms may be substituted with fluorine atoms, and the process for preparing the polymer (B1) having the moiety of the formula (2) is characterized in that at least one base selected from ammonia and organic amines and a compound of the formula (3):

$$X\text{—}CH_2OR \quad (3)$$

wherein X is Cl, Br or I; R is as defined in the formula (2), are reacted with the polymer (A1) in a solvent which can uniformly dissolve the mixture of the polymer (A1) and ammonia or organic amines.

The present invention also relates to a resist composition comprising:
(a-1) a fluorine-containing polymer having a structural unit M2-3B which is derived from a protective-group-containing norbornene derivative and has a moiety represented by the formula (5):

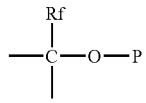
(5)

wherein Rf is a fluorine-containing alkyl group having 1 to 5 carbon atoms; —O—P is a protective group which can be converted to OH group by dissociation reaction with an acid,
(b-1) a photoacid generator and
(c-1) a solvent, in which the structural unit M2-3B is a structural unit derived from a protective-group-containing norbornene derivative in which the atomic group having the moiety of the formula (5) is bonded to a carbon atom or carbon atoms of norbornene ring and/or the moiety of the formula (5) forms a part of norbornene ring, wherein a percentage of exo-form (hereinafter referred to as "exo-percentage") of the atomic group bonded to the carbon atom(s) of norbornene ring and/or the —O—P atomic group directly bonded to norbornene ring satisfies (Equation 1).

$$90\% \text{ by mole} \leq \frac{Exo\text{-form}}{(Exo\text{-form} + Endo\text{-form})} \times 100 \leq 100\% \text{ by mole} \quad \text{(Equation 1)}$$

It is preferable that the fluorine-containing polymer (a-1) is a fluorine-containing polymer having a protective group which is represented by the formula (M-3):

$$\text{-(M1)-(M2)-(M2-3B)-(N)-} \quad \text{(M-3)}$$

wherein the structural unit M1 is a structural unit derived from a fluorine-containing ethylenic monomer (m1) having 2 or 3 carbon atoms and at least one fluorine atom;

the structural unit M2 is a structural unit derived from a norbornene derivative (m2) which may have fluorine atom;

the structural unit M2-3B is a structural unit derived from a protective-group-containing norbornene derivative (m2-3b) in which the atomic group having the moiety of the formula (5) is bonded to a carbon atom or carbon atoms of norbornene ring and/or the moiety of the formula (5) forms a part of norbornene ring, wherein an exo-percentage of the atomic group bonded to the carbon atom(s) of norbornene ring and/or the —O—P atomic group directly bonded to norbornene ring satisfies the above-mentioned (Equation 1);

the structural unit N is a structural unit derived from a monomer (n) copolymerizable with the monomers (m1), (m2) and (m2-3b);

the proportions of the structural units M1, M2, M2-3B and N are from 24 to 70% by mole, from 0 to 69% by mole, from 1 to 70% by mole and from 0 to 20% by mole, respectively, and provided that (M1)+(M2)+(M2-3B) is 100% by mole, a percent by mole ratio of (M1)/((M2)+(M2-3B)) is 30/70 to 70/30.

It is also preferable that the fluorine-containing polymer (a-1) is a fluorine-containing polymer having a protective group which is represented by the formula (M-4):

-(M1)-(M2-6A)-(M2-3B)-(M2)-(N)-  (M-4)

wherein the structural unit M2-6A is a structural unit derived from a OH-containing norbornene derivative (m2-6a) and having a moiety represented by the formula (1):

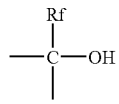

(1)

wherein Rf is as defined in the above-mentioned formula (1); the structural units M1, M2-3B, M2 and N are as defined in the above-mentioned formula (M-3);

the proportions of the structural units M1, M2-6A, M2-3B, M2 and N are from 24 to 70% by mole, from 1 to 69% by mole, from 1 to 69% by mole, from 0 to 68% by mole and from 0 to 20% by mole, respectively, and provided that (M1)+(M2-6A)+(M2-3B)+(M2) is 100% by mole, a percent by mole ratio of (M1)/((M2-6A)+(M2-3B)+(M2)) is 30/70 to 70/30.

The structural unit M2-3B is preferably a structural unit derived from a protective-group-containing norbornene derivative represented by the formula (m2-3b-1):

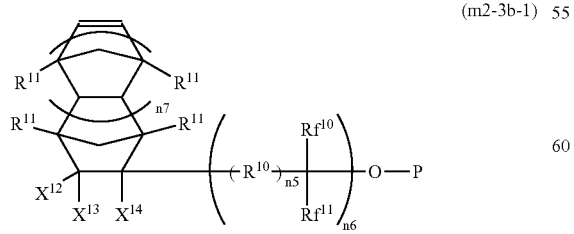

(m2-3b-1)

wherein —O—P is a protective group which can be converted to OH group by dissociation reaction with an acid;

$X^{14}$ is selected from a hydrogen atom, a fluorine atom or $CF_3$, and provided that n6 is 0, $X^{14}$ is $CF_3$; $X^{12}$ and $X^{13}$ are the same or different and each is a hydrogen atom or a fluorine atom; $R^{10}$ is a divalent organic group selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n5 and n6 are the same or different and each is 0 or 1; $Rf^{10}$ and $Rf^{11}$ are the same or different and each is a fluorine-containing alkyl group having 1 to 5 carbon atoms; each of $R^{11}$ is a hydrogen atom or an alkyl group having 1 to 10 carbon atoms; n7 is 0 or an integer of from 1 to 5, and an exo-percentage of the atomic group contained therein and represented by the formula (6):

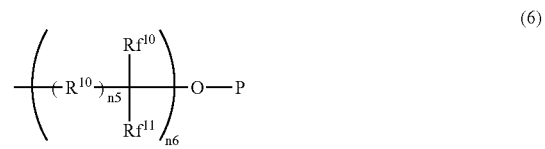

(6)

satisfies (Equation 2).

$$90\% \text{ by mole} \leq \frac{Exo\text{-form}}{(Exo\text{-form} + Endo\text{-form})} \times 100 \leq 100\% \text{ by mole}$$

(Equation 2)

In the formula (M-4), it is preferable that provided that (M2-6A)+(M2-3B) is 100% by mole, a percent by mole ratio of (M2-6A)/(M2-3B) is 40/60 to 90/10.

It is preferable that the structural unit M1 derived from the fluorine-containing ethylenic monomer (m1) is a structural unit derived from tetrafluoroethylene and/or chlorotrifluoroethylene.

The present invention also relates to a fluorine-containing polymer which has a number average molecular weight of from 1,000 to 100,000 and is represented by the formula (M-7):

-(M1)-(M2-8A)-(M2)-(N)-  (M-7)

wherein the structural unit M1 is a structural unit derived from a fluorine-containing ethylenic monomer (m1) having 2 or 3 carbon atoms and at least one fluorine atom;

the structural unit M2-8A is a structural unit derived from a OH-containing norbornene derivative represented by the formula (m2-8a):

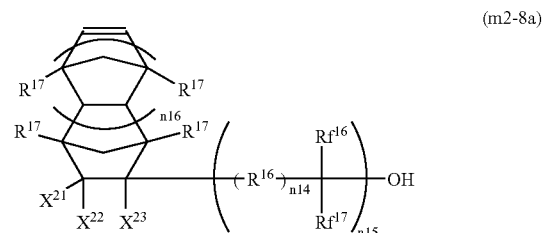

(m2-8a)

wherein $X^{23}$ is selected from a hydrogen atom, a fluorine atom or $CF_3$, and provided that n15 is 0, $X^{23}$ is $CF_3$; $X^{21}$ and $X^{22}$ are the same or different and each is a hydrogen atom or a fluorine atom; $R^{16}$ is a divalent organic group selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n14 and n15 are the same or different and each is 0 or 1; $Rf^{16}$ and $Rf^{17}$ are the same or different and each is a fluorine-containing alkyl group having 1 to 5 carbon atoms; each of $R^{17}$ is a hydrogen atom or an alkyl group having 1 to 10 carbon atoms; n16 is 0 or an integer of from 1 to 5, and an exo-percentage of the atomic group contained therein and represented by the formula (9):

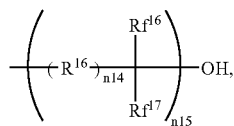
(9)

satisfies (Equation 4):

$$90\% \text{ by mole} \le \frac{Exo\text{-form}}{(Exo\text{-form} + Endo\text{-form})} \times 100 \le 100\% \text{ by mole;} \quad \text{(Equation 4)}$$

the structural unit M2 is a structural unit derived from a norbornene derivative (m2) which may have fluorine atom;

the structural unit N is a structural unit derived from a monomer (n) copolymerizable with the monomers (m1), (m2-8a) and (m2);

the proportions of the structural units M1, M2, M2-8A and N are from 24 to 70% by mole, from 0 to 69% by mole, from 1 to 70% by mole and from 0 to 20% by mole, respectively, and provided that (M1)+(M2)+(M2-8A) is 100% by mole, a percent by mole ratio of (M1)/((M2)+(M2-8A)) is 30/70 to 70/30.

It is preferable that the structural unit M1 derived from the fluorine-containing ethylenic monomer (m1) is a structural unit derived from tetrafluoroethylene and/or chlorotrifluoroethylene.

Further the present invention relates to a resist composition comprising:

(a-2) a fluorine-containing polymer having a structural unit M2-9A which is derived from a OH-containing norbornene derivative and has a moiety represented by the formula (1):

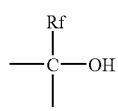
(1)

wherein Rf is a fluorine-containing alkyl group having 1 to 5 carbon atoms and a structural unit M2-6B which is derived from a protective-group-containing norbornene derivative and has a moiety represented by the formula (5):

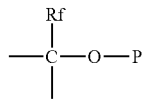
(5)

wherein Rf is a fluorine-containing alkyl group having 1 to 5 carbon atoms; —O—P is a protective group which can be converted to OH group by dissociation reaction with an acid, (b-1) a photoacid generator and (c-1) a solvent, in which the structural unit M2-9A is a structural unit derived from a fluorine-containing norbornene derivative having OH group in which the atomic group having the moiety of the formula (1) is bonded to a carbon or carbon atoms of norbornene ring and/or the moiety of the formula (1) forms a part of norbornene ring, wherein an exo-percentage of the atomic group bonded to the carbon atom(s) of norbornene ring and/or the —OH group directly bonded to norbornene ring satisfies (Equation 5).

$$90\% \text{ by mole} \le \frac{Exo\text{-form}}{(Exo\text{-form} + Endo\text{-form})} \times 100 \le 100\% \text{ by mole} \quad \text{(Equation 5)}$$

It is preferable that the structural unit M2-6B is a structural unit derived from a fluorine-containing norbornene derivative having a protective group in which the atomic group having the moiety of the formula (5):

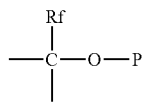
(5)

wherein Rf is a fluorine-containing alkyl group having 1 to 5 carbon atoms; —O—P is a protective group which can be converted to OH group by dissociation reaction with an acid, is bonded to a carbon atom or carbon atoms of norbornene ring and/or the moiety of the formula (5) forms a part of norbornene ring, wherein an exo-percentage of the atomic group bonded to the carbon atom(s) of norbornene ring and/or the —O—P atomic group directly bonded to norbornene ring satisfies (Equation 6).

$$90\% \text{ by mole} \le \frac{Exo\text{-form}}{(Exo\text{-form} + Endo\text{-form})} \times 100 \le 100\% \text{ by mole} \quad \text{(Equation 6)}$$

DETAILED DESCRIPTION

Figure 1A:
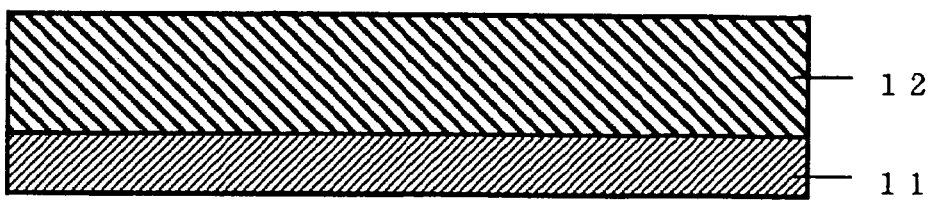
FIGS. 1(a), 1(b), 1(c), and 1(d), are cross-sectional views showing the method of forming a fine pattern of the present invention according to the steps thereof.

The present inventors have found that when the polymer (B) prepared by the process mentioned below is used for a resist composition, a rate of dissolution in a developing solution of the polymer after exposing of the resist film, namely after decomposing reaction of the protective group by an acid is greatly enhanced. The preparation process of the polymer (B) comprises a step for firstly preparing the polymer (A) which has a structural unit derived from a OH-containing norbornene derivative (m2-1a) and having a moiety represented by the formula (1):

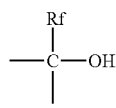
(1)

wherein Rf is a fluorine-containing alkyl group having 1 to 5 carbon atoms, and then converting, through polymer reaction, the OH group of the obtained polymer (A) to the moiety represented by the formula (2):

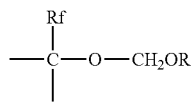
(2)

wherein Rf is as defined in the above formula (1), R is a hydrocarbon group having 1 to 30 carbon atoms in which a part or the whole of hydrogen atoms may be substituted with fluorine atoms.

Particularly in the polymer (B) prepared by the abovementioned process of the present invention, decomposition reaction by an acid advances more efficiently, and as a result, the protective group can be converted to OH group at high yield.

The polymer (A) which is used as a starting material for preparing the polymer (B) being capable of acting as a positive resist used in the present invention is the polymer having the above-mentioned structural unit derived from the OH-containing norbornene derivative (m2-1a). Namely, for example, hydrogen atom bonded to a carbon atom of norbornene ring may be substituted with a substituent having the moiety represented by the formula (1):

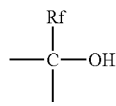
(1)

wherein Rf is a fluorine-containing alkyl group having 1 to 5 carbon atoms, or the moiety of the formula (1) may form a part of norbornene ring of the norbornene derivative.

The fluoroalkyl group represented by Rf in the moiety of the formula (1) is an alkyl group having 1 to 5 carbon atoms in which a part or the whole of hydrogen atoms are substituted with fluorine atoms, and by an effect of the substitution with fluorine atoms, acidity of OH group in the formula (1) is enhanced and solubility in a developing solution can be provided in resist application.

Therefore it is preferable that the Rf group is particularly a perfluoroalkyl group, from the point that acidity of OH group can be further enhanced. Examples thereof are groups represented by:

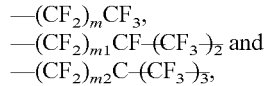

wherein m is 0 or an integer of from 1 to 4; m1 is 0, 1 or 2; m2 is 0 or 1. Preferred are —$CF_3$, —$C_2F_5$, —$CF_2CF(CF_3)_2$—$CH(CF_3)_2$ and the like. Particularly preferred are —$CF_3$ and —$C_2F_5$, and further preferred is —$CF_3$.

First mentioned below are examples of the OH-containing norbornene derivative in which, for example, hydrogen atom bonded to a carbon atom of norbornene ring is substituted with a substituent having the moiety of the formula (1).

The first preferred OH-containing norbornene derivatives are norbornene derivatives represented by the formula (m2-2a):

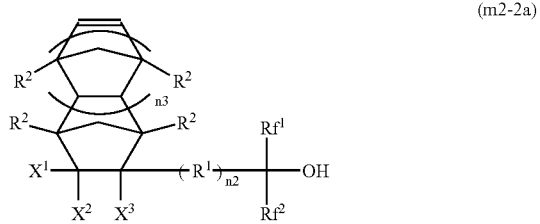
(m2-2a)

wherein $X^3$ is selected from a hydrogen atom, a fluorine atom or $CF_3$; $X^1$ and $X^2$ are the same or different and each is a hydrogen atom or a fluorine atom; $R^1$ is selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n2 is 0 or 1; $Rf^1$ and $Rf^2$ are the same or different and each is a fluorine-containing alkyl group having 1 to 5 carbon atoms; each of $R^2$ is a hydrogen atom or an alkyl group having 1 to 10 carbon atoms; n3 is 0 or an integer of from 1 to 5.

Particularly preferred are OH-containing norbornene derivatives represented by the formula (m2-3a):

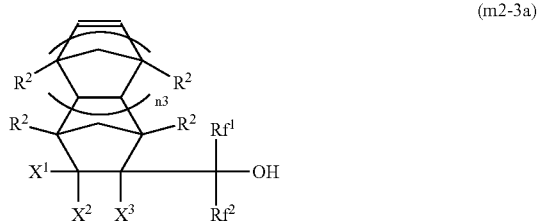
(m2-3a)

wherein $X^3$ is selected from a hydrogen atom, a fluorine atom or $CF_3$; $X^1$ and $X^2$ are the same or different and each is a hydrogen atom or a fluorine atom; $Rf^1$ and $Rf^2$ are the same or different and each is a fluorine-containing alkyl group having 1 to 5 carbon atoms; each of $R^2$ is a hydrogen atom or an alkyl group having 1 to 10 carbon atoms; n3 is 0 or an integer of from 1 to 5. Namely, the polymer (A)

which is prepared using those norbornene derivatives is particularly preferred since a rate of dissolution in a developing solution, that is, resolution can be improved effectively by the method of the present invention for introducing the protective group. In the formula (m2-3a), from the viewpoint of transparency and solubility in a developing solution of the obtained polymer, it is preferable that at least one of $X^1$, $X^2$ and $X^3$ is F or $CF_3$.

More preferred examples of the formula (m2-2a) are OH-containing norbornene derivatives represented by the formula (m2-4a):

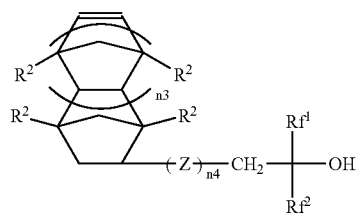

(m2-4a)

wherein Z is an oxygen atom or —$CH_2O$—; n4 is 0 or 1; $Rf^1$, $Rf^2$, $R^2$ and n3 are as defined in the formula (m2-2a).

In the formulae (m2-2a), (m2-3a) and (m2-4a), preferred examples of $Rf^1$ and $Rf^2$ are the same as those exemplified in the formula (1).

In the formulae (m2-2a), (m2-3a) and (m2-4a), each of $R^2$ is selected from a hydrogen atom or an alkyl group having 1 to 10 carbon atoms and may be the same or different. Each of $R^2$ is preferably a hydrogen atom or $CH_3$, and particularly preferred is a hydrogen atom.

Examples of the OH-group-containing norbornene derivatives represented by the formula (m2-3a) are, for instance,

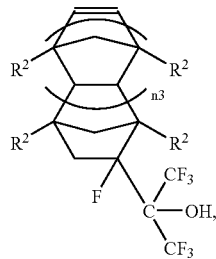 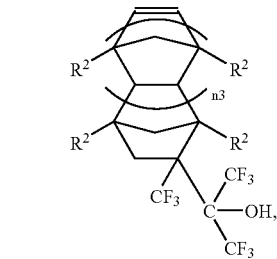 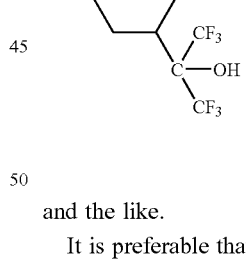

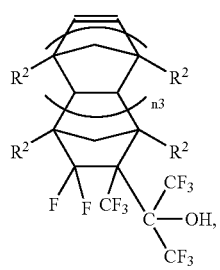

-continued

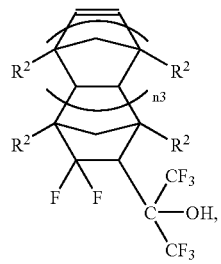 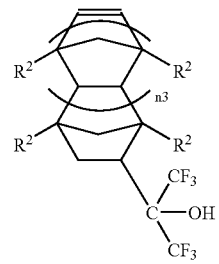

and the like, wherein $R^2$ are as defined in the formula (m2-3a), n3 is 0 or an integer of from 1 to 5.

More concretely there are preferably:

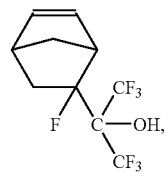 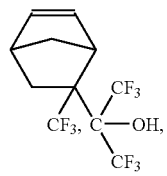

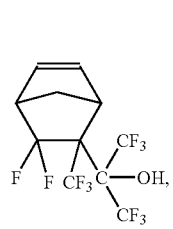 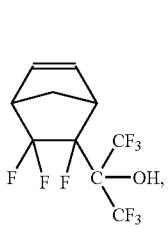

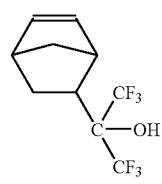 

and the like.

It is preferable that the fluorine-containing polymer used in the method of forming a pattern of the present invention has a structural unit derived from the fluorine-containing norbornene derivatives having OH group mentioned supra, thereby making it possible to effectively provide the polymer with transparency in a vacuum ultraviolet region, dry etching resistance and solubility in a developing solution which are necessary for a resist. It is preferable that the formula (m2-3a) is the OH-containing norbornene derivative in which $X^1$ and $X^2$ are H and $X^3$ is F or $CF_3$, the norbornene derivative having a fluorine-containing alcohol structure in which $X^1$ and $X^2$ are F and $X^3$ is F or $CF_3$, or the OH-containing norbornene derivative in which $Rf^1$ and $Rf^2$ are $CF_3$.

Examples of the OH-containing norbornene derivatives represented by the formula (m2-4a) are, for instance,

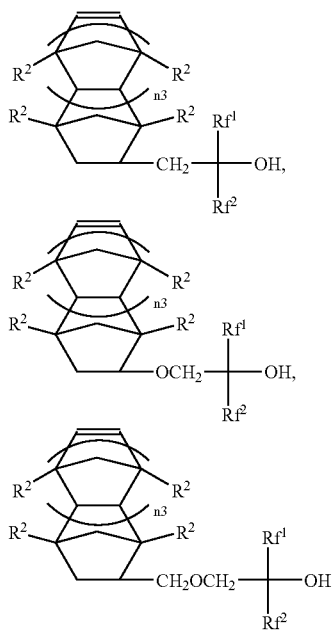

and the like, wherein $R^2$, $Rf^1$ and $Rf^2$ and n3 are as defined in the formula (m2-4a). More concretely there are preferably:

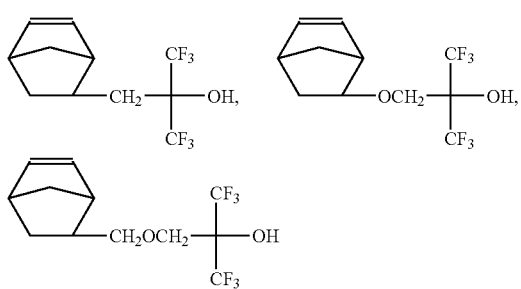

and the like.

Examples of the OH-containing norbornene derivative in which the moiety of the formula (1) having OH group forms a part of norbornene ring are norbornene derivatives represented by the formula (m2-5a):

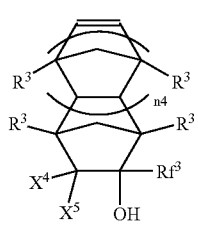

(m2-5a)

wherein $X^4$ and $X^5$ are the same or different and each is a hydrogen atom or a fluorine atom; $Rf^3$ is a fluorine-containing alkyl group having 1 to 5 carbon atoms; each of $R^3$ is a hydrogen atom or an alkyl group having 1 to 10 carbon atoms; n4 is 0 or an integer of from 1 to 5.

In the formula (m2-5a), preferred examples of $Rf^3$ are the same as those exemplified in the formula (1).

Preferred examples of $R^3$ are the same as those of $R^2$ exemplified in the formula (m2-2a).

Examples of the OH-containing norbornene derivatives represented by the formula (m2-5a) are, for instance,

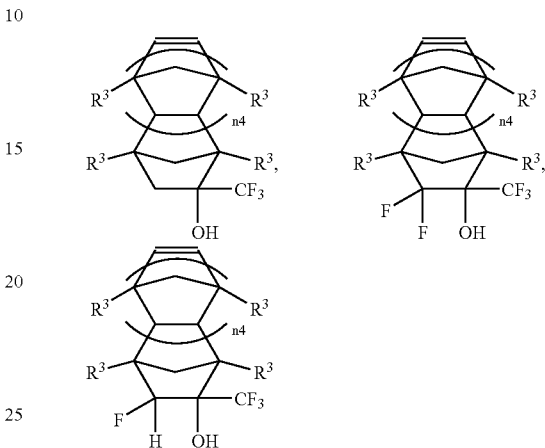

and the like, wherein $R^3$ and n4 are as defined in the formula (m2-5a).

More concretely there are:

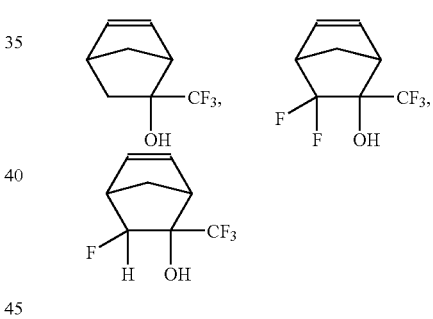

and the like.

In the method of forming a pattern of the present invention, the step (I) is a step for preparing the fluorine-containing polymer having OH group by homo-polymerization or copolymerization with other monomer using the above-mentioned OH-containing norbornene derivatives. Namely, the polymer (A) may be homopolymers (for example, those prepared by metathesis polymerization) of the exemplified OH-containing norbornene derivatives prepared by using a metal catalyst, polymers prepared by ring-opening polymerization or hydrogenated polymers thereof, or copolymers of the OH-containing norbornene derivative with an ethylenic monomer, for example, an acrylic monomer, α-olefin such as ethylene, propylene or vinyl chloride or fluorine-containing olefin.

Among them, preferred as a polymer for a resist are homopolymers of the OH-containing norbornene derivative and copolymers of the OH-containing norbornene derivative with an acrylic monomer or a fluorine-containing olefin, which are preferred from the viewpoint of excellent transparency and dry etching resistance.

Particularly preferred for resist application for $F_2$ laser are copolymers of the OH-containing norbornene derivative with a fluorine-containing olefin which are transparent to ultraviolet light having a short wavelength of 157 nm.

Preferred as the polymer (A) which comprises the OH-containing norbornene derivative and a fluorine-containing olefin are fluorine-containing polymers represented by the formula (M-1):

-(M1)-(M2-1A)-(M2)-(N)- (M-1)

wherein the structural unit M1 is a structural unit derived from a fluorine-containing ethylenic monomer (m1) having 2 or 3 carbon atoms and at least one fluorine atom;

the structural unit M2-1A is a structural unit derived from a OH-containing norbornene derivative (m2-1a) which has a moiety represented by the formula (1):

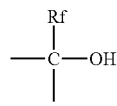

(1)

in which Rf is as defined in the formula (1) mentioned supra;

the structural unit M2 is a structural unit derived from a norbornene derivative (m2) which may have fluorine atom; and the structural unit N is a structural unit derived from a monomer (n) copolymerizable with the monomers (m1), (m2-1a) and (m2).

In the fluorine-containing polymers of the formula (M-1), the structural unit M1 is obtained from a fluorine-containing ethylenic monomer and is preferred from the point that good transparency can be imparted to the copolymer, particularly an effect of enhancing transparency to ultraviolet light having a short wavelength (for example, 157 nm) can be given to the copolymer.

Examples of the monomer introducing the structural unit M1 are:
$CF_2$=$CF_2$, $CF_2$=CFCl, $CH_2$=$CF_2$, CFH=$CH_2$, CFH=$CF_2$, $CF_2$=$CFCF_3$, $CH_2$=$CFCF_3$, $CH_2$=$CHCF_3$
and the like.

Among them, tetrafluoroethylene ($CF_2$=$CF_2$) and chlorotrifluoroethylene ($CF_2$=CFCl) are preferred from the viewpoint of good copolymerizability and a high effect of imparting transparency.

The structural unit M2-1A is the structural unit derived from the above-mentioned OH-containing norbornene derivative (m2-1a) and is preferably the structural unit derived from at least one OH-containing norbornene derivative selected from the group consisting of the norbornene derivatives of the above-mentioned formulae (m2-2a), (m2-3a), (m2-4a) and (m2-5a). Examples thereof are also the same as those mentioned supra.

The structural unit M2 is the structural unit derived from the norbornene derivative (m2) which may have fluorine atom except the structural unit M2-1A. The structural unit M2 is an optional component.

Examples thereof are, for instance, norbornenes (m2-1) which do not have a functional group and may have fluorine atom or norbornenes having a functional group which is a moiety having OH group except the moiety of the formula (1) or a functional group other than OH group.

Examples of the norbornenes (m2-1) having no functional group are:

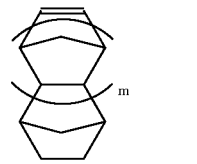

(m: 0 or an integer of from 1 to 5)

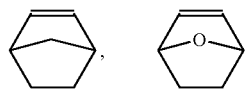

and norbornenes of the formula:

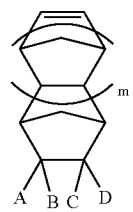

wherein each of A, B, C and D is H, F, an alkyl group having 1 to 10 carbon atoms or a fluorine-containing alkyl group having 1 to 10 carbon atoms; m is 0 or an integer of from 1 to 5; any one of A to D has fluorine atom. Examples thereof are:

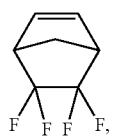 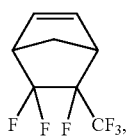 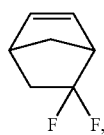

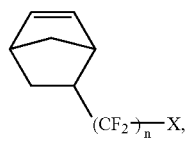 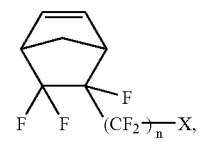

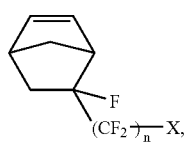 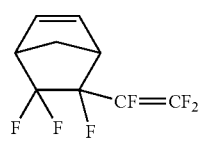

(n: 1 to 10, X: H, F or Cl)

and the like.

In addition, there are:

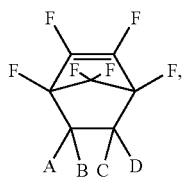 

and the like, wherein A, B, C and D are as defined above.

The introduction of the structural unit derived from the monomer (m2-1) is preferred from the point that dry etching resistance as well as transparency can be enhanced.

Further the introduction of the structural unit derived from the monomer (m2-1) is preferred from the point that the content of structural unit M2-1A of the OH-containing norbornene derivative can be adjusted without lowering dry etching resistance.

Among the norbornene derivatives having functional group, particularly preferred are norbornene derivatives (m2-2) having carboxylic acid or carboxylic acid derivative (—COOY$^2$) obtained by introducing, to the carboxylic acid, a protective group to be dissociated by an acid. Examples thereof are:

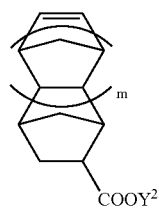 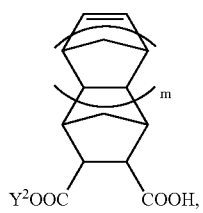

(m: 0 or an integer of from 1 to 5)

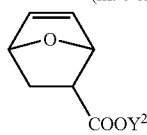

and also monomers (m2-2) in which a part or the whole of hydrogen atoms are substituted with fluorine atoms, which are preferred from the point that further transparency can be imparted to the polymer.

There are concretely fluorine-containing monomers represented by:

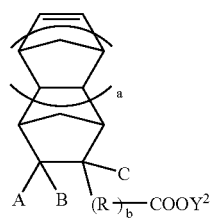

wherein each of A, B and C is H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 5; b is 0 or 1; COOY$^2$ is a COOH group or an acid-labile functional group which can be converted to carboxyl by an acid; when b is 0 or R does not have fluorine atom, any one of A to C is a fluorine atom or a fluorine-containing alkyl group.

In those monomers, it is preferable that any of A, B and C is a fluorine atom, and when a fluorine atom is not contained in A, B and C, it is preferable that the fluorine content of R is not less than 60%. It is further preferable that R is a perfluoroalkyl group because transparency can be imparted to the polymer.

Concretely there are:

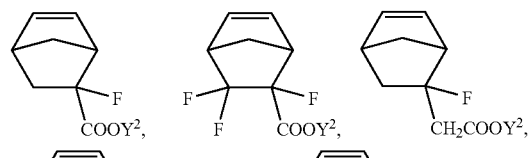

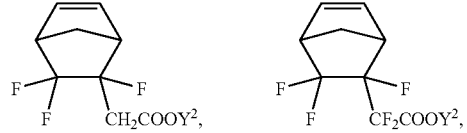

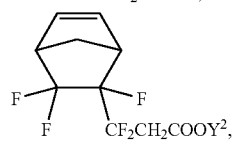

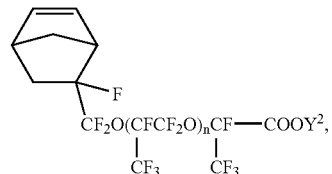

(n: 0 to 10)

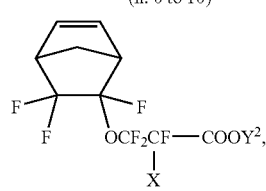

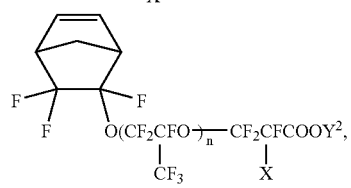

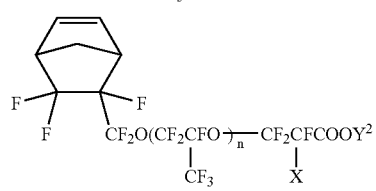

(n: 0 to 10, X: F or CF$_3$)

and the like.

Also there are fluorine-containing monomers represented by:

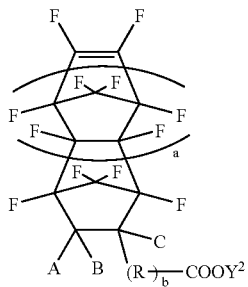

wherein each of A, B and C is H, F, an alkyl group having 1 to 10 carbon atoms or a fluorine-containing alkyl group having 1 to 10 carbon atoms; R is a divalent hydrocarbon group having 1 to 20 carbon atoms, a fluorine-containing alkylene group having 1 to 20 carbon atoms or a fluorine-containing alkylene group having 2 to 100 carbon atoms and ether bond; a is 0 or an integer of from 1 to 5; b is 0 or 1; $COOY^2$ is a COOH group or an acid-labile functional group which can be converted to carboxyl by an acid.

Concretely there are preferably monomers having norbornene ring such as:

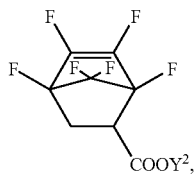 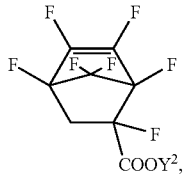

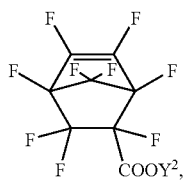 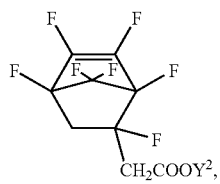

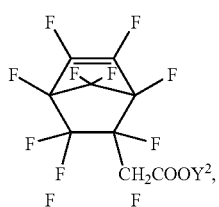 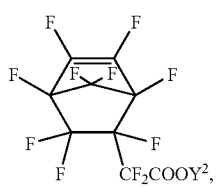

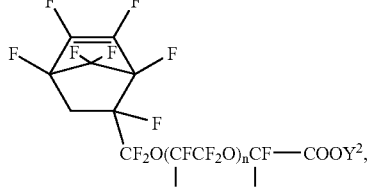

(n: 0 to 10)

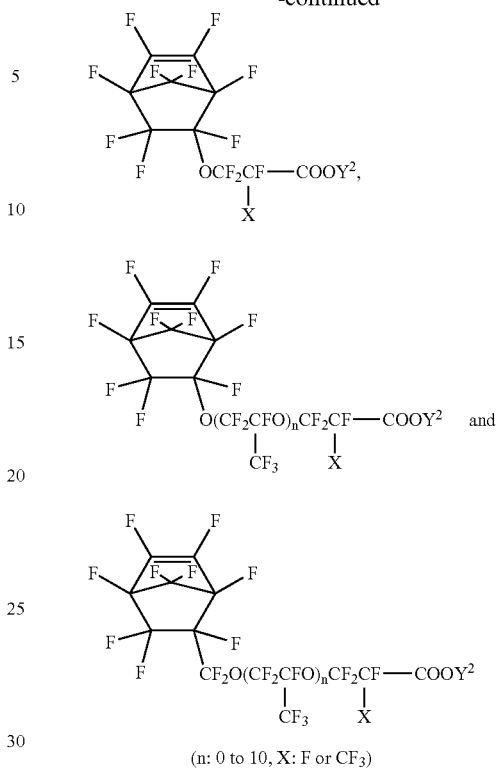

(n: 0 to 10, X: F or $CF_3$)

In the above-exemplified norbornene derivatives (m2-2) having the carboxylic acid derivative (—$COOY^2$), $Y^2$ is one selected from hydrocarbon groups having tertiary carbon which can be bonded directly to carboxyl. For example, there are t-butyl group, 1,1-dimethylpropyl group, adamantyl group, methyl adamantyl group, ethyl adamantyl group and the like, and preferred is t-butyl group from the viewpoint of particularly good acid dissociation reactivity.

The structural units derived from the above-exemplified monomers (m2-2) are copolymerizable with the monomers introducing the structural units M1 and M2-1A and have a COOH group or an acid-labile functional group $COOY^2$ which can be converted to carboxyl by an acid. Therefore the introduction thereof is preferred from the point that solubility in an aqueous alkaline solution (developing solution) can be further enhanced and at the same time, dry etching resistance of the whole polymer can be enhanced more.

The structural unit N is an optional component other than the structural units M1, M2-1A and M2 and is a structural unit derived from the monomer (n) copolymerizable with the monomers (m1), (m2-1a) and (m2).

The first preferred example of the structural unit N is a structural unit N-1 derived from an ethylenic monomer (n-1) having a COOH group or a carboxylic acid derivative ($COOY^1$) obtained by introducing, to the carboxylic acid, a protective group to be dissociated by an acid. The structural unit N-1 may have or may not have fluorine atom.

Example of the structural unit N is a structural unit N-1 represented by the formula (N-1):

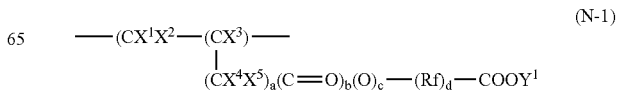

(N-1)

wherein COOY$^1$ is a COOH group or a group obtained by introducing, to the carboxylic acid, a protective group to be dissociated by an acid; X$^1$ and X$^2$ are the same or different and each is H or F; X$^3$ is H, F, Cl, CH$_3$ or CF$_3$; X$^4$ and X$^5$ are the same or different and each is H, F or CF$_3$; Rf is a fluorine-containing alkylene group having 1 to 40 carbon atoms or a fluorine-containing alkylene group having 2 to 100 carbon atoms and ether bond; a is 0 or an integer of from 1 to 3; b, c and d are the same or different and each is 0 or 1.

Examples of the monomer (n-1) having no fluorine atom (d=0) are as follows.

Acrylic Monomer:
CH$_2$=CHCOOY$^1$, CH$_2$=C(CH$_3$)COOY$^1$,
CH$_2$=CClCOOY$^1$, Maleic Acid Monomer:

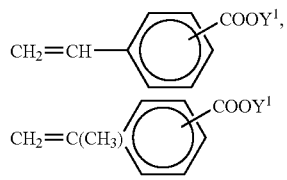

Allyl Monomer:
CH$_2$=CHCH$_2$COOY$^1$, CH$_2$=CHCH$_2$OCH$_2$CH$_2$COOY$^1$

Styrene Monomer:

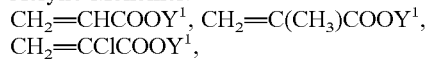

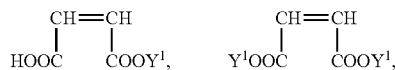

and the like.

Examples of the monomer (n-1) having fluorine atom in its trunk chain (d=0) are as follows.

Fluorine-containing Acrylic Monomer:
CH$_2$=CFCOOY$^1$, CH$_2$=C(CF$_3$)COOY$^1$, CF$_2$=CFCOOY$^1$ and CF$_2$=C(CF$_3$)COOY$^1$ Fluorine-containing Allyl Monomer:
CH$_2$=CFCF$_2$COOY$^1$, CF$_2$=CFCF$_2$COOY$^1$ and
CH$_2$=CHCF$_2$COOY$^1$, Fluorine-containing Styrene Monomer:

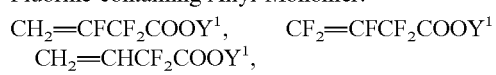

and the like.

Example of the monomer (n-1) having a fluoroalkyl group in its side chain (d=1) is preferably one represented by the formula (n-1a):

CH$_2$=CFCF$_2$O-Rf-COOY$^1$     (n-1a)

wherein COOY$^1$ and Rf are as defined in the above-mentioned formula (N-1), and is concretely:

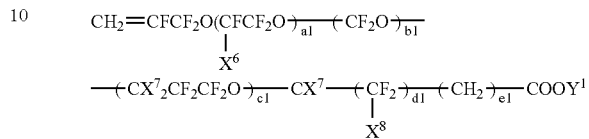

wherein a1+b1+c1 is from 0 to 30, d1 is 0 or 1, e1 is from 0 to 5, X$^6$ is F or CF$_3$, X$^7$ is H or F, X$^8$ is H, F or CF$_3$.

More concretely there are:

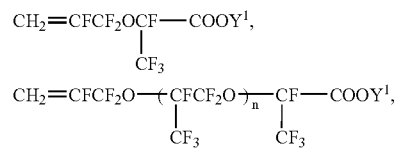

(n is an integer of from 1 to 30)
CH$_2$=CFCF$_2$O—(CF$_2$CF$_2$O)$_n$CF$_2$—COOY$^1$,
CH$_2$=CFCF$_2$O—(CF$_2$CF$_2$O)$_n$CF$_2$CF$_2$—COOY$^1$,
CH$_2$=CFCF$_2$O—(CH$_2$CF$_2$CF$_2$O)$_n$CH$_2$CF$_2$—COOY$^1$,
CH$_2$=CFCF$_2$O—(CF$_2$CF$_2$)$_n$COOY$^1$, (n is an integer of from 1 to 30) and the like.

Also the monomer n-1 is preferably one represented by the formula (n-1b):

CF$_2$=CFO-Rf-COOY$^1$     (n-1b)

wherein COOY$^1$ and Rf are as defined in the above-mentioned formula (N-1). The formula (n-1b) is concretely represented by:

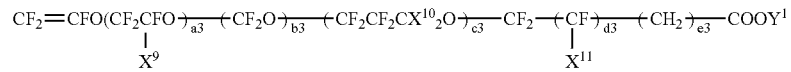

wherein a3+b3+c3 is from 0 to 30, d3 is from 0, 1 or 2, e3 is from 0 to 5, X$^9$ and X$^{11}$ are F or CF$_3$, X$^{10}$ is H or F.

More concretely there are:
CF$_2$=CFOCF$_2$CF$_2$—COOY$^1$,

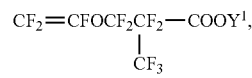

CF$_2$=CFO—(CF$_2$)$_n$COOY$^1$,
CF$_2$=CFOCF$_2$CF$_2$OCF$_2$COOY$^1$,
CF$_2$=CFOCF$_2$CF$_2$CH$_2$OCF$_2$CF$_2$—COOY$^1$, and the like.

Examples of other monomer (n-1) are, for instance:
$CF_2=CFCF_2-O-Rf-COOY^1$, $CF_2=CF-Rf-COOY^1$,
$CH_2=CH-Rf-COOY^1$, $CH_2=CHO-Rf-COOY^1$, (Rf is the same as Rf of the formula (N-1))

and the like. More concretely there are:
$CF_2=CF-CF_2OCF_2CF_2CF_2COOY^1$,

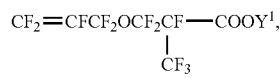

$CF_2=CFCF_2-COOY^1$, $CH_2=CHCF_2CF_2-COOY^1$,
$CH_2=CHCF_2CF_2CH_2COOY^1$,
$CH_2=_{CHCF2}CF_2CF_2CF_2-COOY^1$,
$CH_2=CHCF_2CF_2CF_2CF_2CH_2COOY^1$,
$CH_2=CH_2O-CH_2CF_2CF_2-COOY^1$,
$CH_2=CH_2OCH_2CF_2CF_2CH_2COOY^1$, and the like.

Examples of the $Y^1$ in the above-exemplified ethylenic monomers (n-1) having the carboxylic acid derivative ($COOY^1$) are preferably the same as those of $Y^2$ in the norbornene derivative (m2-2) having carboxylic acid derivative ($-COOY^2$).

The structural unit derived from the above-exemplified monomer (n-1) is copolymerizable with the monomers introducing the structural units M1, M2-1A and M2 and has a COOH group or an acid-labile functional group $COOY^1$ which can be converted to carboxyl by an acid. Therefore the introduction thereof is preferred from the point that solubility in an aqueous alkaline solution (developing solution) can be enhanced.

Examples of other ethylenic monomer (n-2) introducing the structural unit N are:

Acrylic Monomer (Excluding Monomers Introducing the Structural Unit N-1):

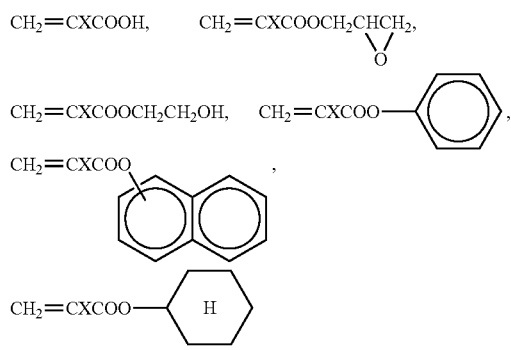

(X is selected from H, $CH_3$, F and $CF_3$)

Styrene Monomer:

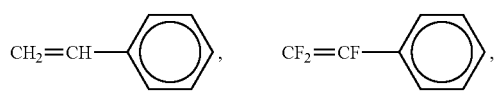

-continued

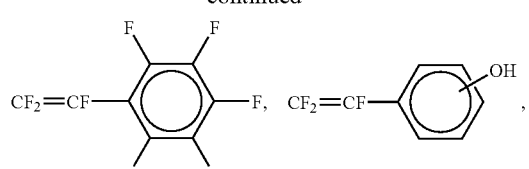

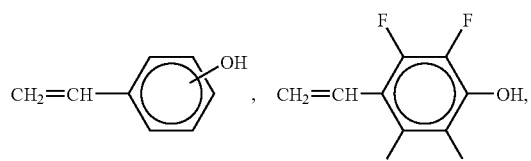

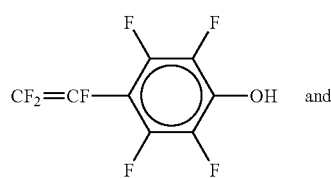

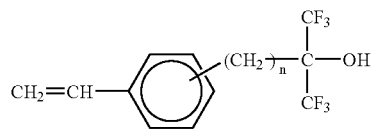

wherein n is 0 or an integer of 1 or 2.

Ethylene Monomer:
$CH_2=CH_2$, $CH_2=CHCH_3$, $CH_2=CHCl$ and the like.

Maleic Acid Monomer:

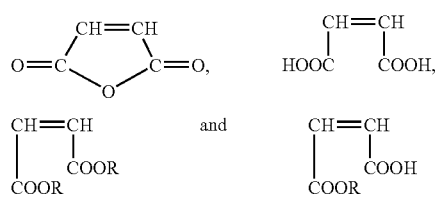

wherein R is a hydrocarbon group having 1 to 20 carbon atoms.

Allyl Monomer:
$CH_2=CHCH_2Cl$, $CH_2=CHCH_2OH$, $CH_2=CHCH_2COOH$, $CH_2=CHCH_2Br$ and the like.

Allyl Ether Monomer:
$CH_2=CHCH_2OR$ (R is a hydrocarbon group having 1 to 20 carbon atoms),
$CH_2=CHCH_2OCH_2(CF_2)_nX$ (n: from 1 to 10, X: H, Cl or F),
$CH_2=CHCH_2OCH_2CH_2COOH$,

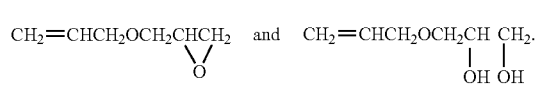

Other Monomers:

(R is an alkyl group which has 1 to 20 carbon atoms and may be substituted with fluorine.)

More concretely there are:

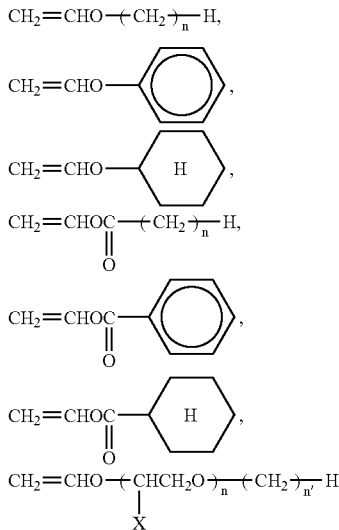

(n: from 1 to 20, n': from 0 to 5, X: H or $CH_3$), and the like.

The polymer (A) which is used in the method of forming a pattern of the present invention contains the structural unit M2-1A as an essential component, and is preferably a copolymer comprising the structural units M1 and M2-1A as essential components in $F_2$ resist application where transparency particularly to light having short wavelengths is required.

In addition to those structural units, optional structural units to be introduced to the polymer may be optionally selected depending on purposes for improving solubility (resolution) of the polymer in a developing solution, controlling water repellency, imparting heat resistance and improving solubility in a solvent and film forming property.

Provided that the sum of the structural units M1 and M2-1A and the structural unit M2 to be introduced as case demands is 100% by mole, a percent by mole ratio of (M1)/((M2-1A)+(M2)) is 20/80 to 80/20, preferably 30/70 to 70/30, more preferably 40/60 to 60/40.

The proportions of the structural units M1, M2-1A, M2 and N are from 14 to 80% by mole, from 1 to 80% by mole, from 0 to 79% by mole and from 0 to 30% by mole; preferably from 24 to 70% by mole, from 1 to 70% by mole, from 0 to 69% by mole and from 0 to 20% by mole; more preferably from 32 to 60% by mole, from 1 to 60% by mole, from 0 to 59% by mole and from 0 to 20% by mole; particularly preferably from 36 to 60% by mole, from 1 to 60% by mole, from 0 to 59% by mole and from 0 to 10% by mole, respectively.

Examples of the preferred polymer (A) which is used in the method of forming a pattern of the present invention are the following polymers.

Fluorine-containing Polymer Represented by the Formula (A-1):

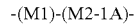

wherein M1 is the structural unit derived from the fluorine-containing ethylenic monomer (m1) having 2 or 3 carbon atoms and at least one fluorine atom; and M2-1A is the structural unit derived from the OH-containing norbornene derivative (m2-1a) which has the moiety of the above-mentioned formula (1).

The percent by mole ratio of the structural unit M1 to the structural unit M2-1A is usually 80/20 to 20/80, preferably 70/30 to 30/70, particularly preferably 60/40 to 40/60.

Examples of those monomers are preferably the same as those of the above-mentioned monomers (m1) and (m2-1a), respectively.

The fluorine-containing polymer (A-1) having OH group is excellent in transparency and dry etching resistance, and solubility in a developing solution can be improved by the method of introducing the protective group of the present invention.

Fluorine-containing Polymer Represented by the Formula (A-2):

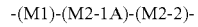

wherein M1 and M2-1A are as defined above; M2-2 is the structural unit derived from the norbornene derivative (m2-2) having a carboxylic acid or a carboxylic acid derivative ($—COOY^2$) obtained by introducing, to the carboxylic acid, a protective group $Y^2$ to be dissociated by an acid.

With respect to the proportions of the structural units M1, M2-1A and M2-2, provided that (M1)+(M2-1A)+(M2-2) is 100% by mole, a percent by mole ratio of (M1)/((M2-1A)+(M2-2)) is usually 80/20 to 20/80, preferably 70/30 to 30/70, particularly preferably 60/40 to 40/60, and provided that (M2-1A)+(M2-2) is 100% by mole, a percent by mole ratio of (M2-1A)/(M2-2) is usually 99/1 to 40/60, preferably 98/2 to 60/40, more preferably 97/3 to 80/20.

Examples of the monomers are preferably the same as those of the above-mentioned monomers (m1), (m2-1a) and (m2-2), respectively.

The fluorine-containing polymer (A-2) having OH group is preferred from the viewpoint of excellent dry etching resistance and solubility in a developing solution.

Fluorine-containing Polymer Having OH Group Represented by the Formula (A-3):

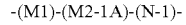

wherein M1 and M2-1A are as defined above; N-1 is the structural unit derived from the ethylenic monomer (n-1) having a COOH group or a carboxylic acid derivative ($COOY^1$) obtained by introducing, to the carboxylic acid, a protective group to be dissociated by an acid.

With respect to the proportions of the structural units M1, M2-1A and N-1, provided that (M1)+(M2-1A)+(N-1) is 100% by mole, a percent by mole ratio of ((M1)+(N-1))/(M2-1A) is usually 80/20 to 20/80, preferably 70/30 to 30/70, particularly preferably 60/40 to 40/60, and the proportions of the structural units M1, M2-1A and N-1 are from 14 to 79% by mole, from 1 to 79% by mole and from 1 to 30% by mole; preferably from 24 to 69% by mole, from 1 to 69% by mole and from 1 to 20% by mole; more preferably from 32 to 58% by mole, from 1 to 58% by mole and from 2 to 20% by mole; particularly preferably from 36 to 57% by mole, from 1 to 57% by mole and from 3 to 10% by mole, respectively.

Examples of the monomers are preferably the same as those of the above-mentioned monomers (m1), (m2-1a) and (n-1), respectively.

The fluorine-containing polymer (A-3) having OH group is preferred from the viewpoint of excellent solubility in a developing solution.

The polymer (A) which is used in the method of forming a fine pattern of the present invention is excellent in transparency at a wavelength of 157 nm, and it is preferable that the polymer has an absorption coefficient at 157 nm of not more than 2.0 $\mu m^{-1}$, preferably not more than 1.5 $\mu m^{-1}$, particularly preferably not more than 1.0 $\mu m^{-1}$, further preferably not more than 0.5 $\mu m^{-1}$. The polymer is preferred since as the absorption coefficient at a wavelength of 157 nm decreases, a good resist pattern can be formed when the polymer is used for a $F_2$ photoresist composition.

The number average molecular weight of the fluorine-containing polymer (A) prepared by polymerization in the step (I) of the method of forming a pattern of the present invention is from 1,000 to 100,000, preferably from 2,000 to 50,000, more preferably from 2,000 to 10,000, and the weight average molecular weight thereof is from 2,000 to 200,000, preferably from 3,000 to 50,000, more preferably from 3,000 to 10,000.

In the present invention, the polymer (A) of the formula (M-1) is prepared by (co)polymerizing, through known method, the fluorine-containing ethylenic monomer (m1), OH-containing norbornene derivative (m2-1a) and as case demands, monomers (m2) and (n1).

The polymerization can be carried out by solution polymerization in an organic solvent dissolving the monomers, suspension polymerization in an aqueous medium in the presence or absence of a proper organic solvent, emulsion polymerization by adding an emulsifying agent to an aqueous medium, bulk polymerization without a solvent, or the like. Particularly preferred are solution polymerization and suspension polymerization using an organic solvent.

The solvent for polymerization is not limited particularly, and a hydrocarbon solvent, fluorine-containing solvent (flon-based solvent), chlorine solvent, alcohol solvent, ketone solvent, acetic acid ester solvent, ether solvent and the like can be used preferably.

Among them, a fluorine-containing solvent and a chlorine solvent are preferred from the point that solubility of monomers and radical polymerization initiator is good and the polymerization reaction can be advanced successfully. Concretely preferred are one or more solvents selected from hydrofluorocarbons, hydrochlorocarbons, fluorochlorocarbons and hydrochlorofluorocarbons.

The polymerization is initiated by bringing the monomers into contact with a polymerization initiator, preferably an organic peroxide and then heating (at a temperature inherent to each organic peroxide) or irradiating active energy rays such as light or ionizing radiation.

The polymerization initiator is not limited particularly, and organic peroxides and azo initiators are preferred. Preferred as the organic peroxide are one or more selected from diacyl peroxides, oxy peresters, peroxy ketals, dialkyl peroxides and peroxy dicarbonates.

Among them, oxy peresters and diacyl peroxides are more preferred because radical polymerization reaction can be accelerated and transparency of the obtained polymer in a vacuum ultraviolet region can be improved more. Further those initiators are preferred since hydrophilic property of the polymer itself is enhanced and particularly solubility in a developing solution of the fluorine-containing polymer having OH group (after exposing or releasing of the protective group) is enhanced.

Examples of the preferred oxy peresters are those having alkyl such as 1,1,3-tetramethylbutyl peroxyneodecanate, 1-cyclohexyl-1-methylethyl peroxyneodecanate, tert-hexyl peroxyneodecanate, tert-butyl peroxyneodecanate, tert-hexyl peroxypivalate, tert-butyl peroxypivalate, 1,1,3,3-tetramethylbutylperoxy-2-ethylhexanoate, 2,5-dimethyl-2,5-bis(2-ethylhexanoylperoxy)hexane, 1-cyclohexyl-1-methylethylperoxy-2-ethylhexanoate, tert-hexylperoxy-2-ethylhexanoate, tert-butylperoxy-2-ethylhexanoate, tert-butyl peroxyisobutyrate, tert-butyl peroxymalenic acid, tert-hexyl peroxyisobutyl monocarbonate, tert-butyl peroxy-3,5,5-trimethyl hexanoate, tert-butylperoxy laurate, tert-butyl peroxyisobutyl monocarbonate, tert-butyl peroxyacetate and the like.

More preferred are oxy peresters having cycloaliphatic ring since dry etching resistance can be improved. Preferred examples are 1-cyclohexyl-1-methylethyl peroxyneodecanate, 1-cyclohexyl-1-methylethylperoxy-2-ethylhexanoate and the like.

Examples of the preferred diacyl peroxide are isobutyryl peroxide, 3,5,5-trimethylhexanoyl peroxide, octanoyl peroxide, lauroyl peroxide, steroyl peroxide, succinic acid peroxide and the like.

Examples of the peroxy dicarbonate are di-n-propylperoxy dicarbonate, diisopropyl peroxydicarbonate, bis(4-tert-butylcyclohexyl) peroxydicarbonate, di-2-ethoxymethyl peroxydicarbonate, di-2-ethylhexyl peroxydicarbonate, di-2-methoxybuyl peroxydicarbonate, di(3-methyl-3-methoxybutyl) peroxydicarbonate and the like.

Examples of the peroxy ketal are, for instance, 1,1-bis(tert-hexylperoxy)-3,3,5-trimethylcyclohexane, 1,1-bis(tert-hexylperoxy)-cyclohexane, 1,1-bis(tert-butylperoxy)-3,3,5-trimethylcyclohexane, 1,1-bis(tert-butylperoxy)-cyclohexane, 1,1-bis(tert-butylperoxy)-cyclododecane, 2,2-bis(tert-butylperoxy)valerate, 2,2-bis(4,4-tert-butylperoxycyclohexyl)propane and the like.

Also from the viewpoint of transparency, it is preferable to use peroxides having a fluorine atom. Among them, more preferred are diacyl peroxides having a fluorine atom. Concretely there are preferably pentafluoropropionoyl peroxide: $(CF_3CF_2COO)_2$, heptafluorobutyryl peroxide: $(CF_3CF_2CF_2COO)_2$ and 7H-dodecafluoroheptanoyl peroxide: $(CHF_2CF_2CF_2CF_2CF_2CF_2COO)_2$.

Examples of the azo compounds are dimethyl-2,2'-azobisisobutyrate, 2,2'-azobis(2,4,4-trimethylpentane), 2,2'-azobis(2-methylpropane), dibutyl-2,2'-azobisisobutyrate and the like.

Also the polymerization initiators having a hydrophilic functional group are preferred from the point that the hydrophilic functional group can be introduced to an end of the polymer and developing characteristics can be improved. Examples thereof are preferably succinic acid peroxide, 2,2'-azobis{2-methyl-N-[1,1-bis(hydroxymethyl)-2-hydroxyethyl]propionamide}, 2,2'-azobis{2-methyl-N-[2-(hydroxybutyl)]propionamide}, 2,2'-azobis[2-methyl-N-(2-(hydroxyethyl)propionamide], 2,2'-azobis{2-[1-(hydroxyethyl)-2-imidazoline-2-yl]propane}dihydrochloride, 2,2'-azobis[N-(2-carboxyethyl)-2-methylpropionamidine], 2,2'-azobis(2-methylpropionamideoxime), 4,4'-azobis(4-cyanovaleric acid), dimethyl-2,2'-azobis(2-methylpropionate), 1,1'-azobis (1-acetoxy-1-phenylethane) and the like.

When preparing the polymer of the present invention comprising the structural units derived from the fluorine-containing ethylenic monomer (m1) and OH-containing norbornene derivative (m2-1a), it is preferable to use the organic peroxide having a 10-hour half life temperature of from 5° to 130° C., further from 15° to 100° C., particularly from 30° to 80° C., from the viewpoint of good polymerization reaction.

Components and amounts thereof of the obtained copolymer can be adjusted by components and amounts of starting monomers.

The molecular weight of the copolymer can be controlled by the content of monomers used for the polymerization, the content of organic peroxide, the content of a chain transfer agent and a polymerization temperature.

The amount of the organic peroxide based on the monomers to be used is optionally selected depending on kind of the monomers and intended composition and molecular weight of the polymer, and is from 0.005 to 10 parts by weight, preferably from 0.01 to 5 parts by weight, more preferably from 0.1 to 1 part by weight based on 100 parts by weight of the monomers. In view of another aspect, the amount of the organic peroxide is from 0.01 to 10% by mole, preferably from 0.05 to 5% by mole, more preferably from 0.1 to 2% by mole based on the molar amount of the monomers to be used.

If the amount of the organic peroxide is too small, the polymerization reaction is difficult to advance sufficiently, un-reacted monomers remain in the polymer and an oligomer component is produced, thereby causing coloration of the polymer and lowering of transparency, which is not preferred. If the amount of the organic peroxide is too large, lowering of a molecular weight of the polymer arises, transparency is lowered and un-reacted organic peroxide remains in the polymer, thereby causing coloration of the polymer and lowering of transparency, which is not preferred.

In the present invention, a chain transfer agent may be used as case demands for the purposes of adjusting the molecular weight or controlling the structure of the end group.

Examples thereof are preferably, for instance, hydrocarbons such as pentane, hexane, methane and ethane, alcohols such as methanol, ethanol and i-propanol, acetic acid esters such as ethyl acetate and isopropyl acetate, perfluoro compounds having an iodine atom or a bromine atom, and the like. Further use of a chain transfer agent having a hydrophilic group such as OH or COOH is effective because developing characteristics can be improved.

The amount of the chain transfer agent is optionally selected depending on kind of monomers to be used and intended composition and molecular weight of the polymer, and is from 0.01 to 20% by mole, preferably from 0.05 to 10% by mole, more preferably from 0.1 to 5% by mole, particularly preferably from 0.2 to 2% by mole based on the molar amount of the monomers to be used.

If the amount of the chain transfer agent is too small, there is a case where a sufficient effect of improving solubility in a developing solution cannot be obtained, and if the amount of the chain transfer agent is too large, there is a case where polymerization reaction is difficult to advance smoothly and the polymerization reaction stops or a rate of polymerization is lowered, and as a result, a low molecular weight component remains in the polymer.

Those polymerization initiator and chain transfer agent may be present together from the initial stage of the polymerization reaction or may be introduced continuously or intermittently as the polymerization reaction advances.

In the present invention, the polymerization reaction temperature can be optionally selected, for example, depending on 10-hour half life temperature of the respective organic peroxides and further depending on intended reaction time, and is generally from 0° to 150° C., preferably from 5° to 120° C., more preferably from 10° to 100° C.

The composition of monomer mixtures for copolymerization may be selected according to polymerization reactivity and copolymerization reactivity of each monomer and characteristics to be imparted to the obtained fluorine-containing polymer.

In the step (II) of the method of forming a fine pattern of the present invention, the protective group is introduced using the mentioned polymer (A).

Namely, the step (II) is a step for preparing the polymer (B) which has the structural unit derived from the norbornene derivative (m2-1b) and having a moiety represented by the formula (2):

wherein Rf is as defined in the formula (1), R is a hydrocarbon group having 1 to 30 carbon atoms in which a part or the whole of hydrogen atoms are substituted with fluorine atoms, by reacting the compound represented by the formula (3):

wherein X is Cl, Br or I; R is a hydrocarbon group having 1 to 30 carbon atoms in which a part or the whole of hydrogen atoms are substituted with fluorine atoms, with the polymer (A) in the presence of a base.

The base used in the step (II) is a compound which can generate OH ion in an aqueous solution (solvent), for example, at least one selected from bases having a pH value of not less than 7 or a pKb value of not more than 7, preferably a pH value of not less than 8 or a pKb value of not more than 6, more preferably a pH value of not less than 9 or a pKb value of not more than 5.

The base may be either of an inorganic base and organic base. The inorganic base is selected from ammonia and salts such as an alkali metal, hydrides of alkali metal, hydrides of alkaline earth metal, hydroxides of alkali metal or alkaline earth metal, carbonates of alkali metal, carbonates of alkaline earth metal, acetate of alkali metal, acetate of alkaline earth metal, formate of alkali metal, formate of alkaline earth metal, oxalate of alkali metal and oxalate of alkaline earth metal. Examples of the organic base are organic amines except diarylamine and triarylamine, organic metals comprising an alkali metal, alkoxides, phenoxides, hydroxides of quaternary ammonium salts, triphenylmethylsodium, lithium compounds of primary or secondary alkylamines and the like.

Among them, it is preferable to use the organic bases from the viewpoint of reactivity and from the point that the amount of introduced protective groups (protection ratio) can be controlled as desired and the protective groups can be introduced uniformly into OH groups of the polymer (A) without uneven distribution. In production of semi-conductor device, mixing of alkali metal ion and alkaline earth metal ion in the polymer and further in the resist is not preferred. If there is the mixing, a step for eliminating the metal is required. Therefore when producing the semiconductor device, particularly a base not containing a metal is preferred.

In the above-mentioned examples, preferred are at least one selected from ammonia, organic amines and hydroxides of quaternary ammonium salts, and particularly preferred are ammonia and organic amines.

Organic amines encompasses heterocyclic bases (pyridine, etc.), alkaloid, amidines, DBU and the like in addition to usual primary amines, secondary amines, tertiary amines and amines having an aromatic ring.

Further among them, tertiary amines are preferred from the viewpoint of reactivity.

Particularly preferred are tertiary amines in which at least one of hydrocarbon groups bonded to nitrogen atom is a branched alkyl group, concretely tertiary amines represented by the formula (4):

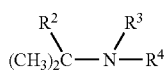
(4)

wherein R is H or $CH_3$; $R^3$ and $R^4$ are the same or different and each is a hydrocarbon group having 1 to 6 carbon atoms.

Namely, at least one of hydrocarbon groups bonded to nitrogen atom is an isopropyl group or tert-butyl group. Concretely preferred is at least one selected from dimethylisopropylamine, diethylisopropylamine, diisopropylmethylamine, diisopropylethylamine, dimethyl-tert-butylamine, diethyl-tert-butylamine and the like.

Also those selected from the inorganic salts exemplified above can be used, and among them, alkali metals, hydrides of alkali metals and hydrides of alkaline earth metals are preferred.

Examples thereof are preferably sodium metal, lithium metal, potassium metal, sodium halide, lithium halide, potassium halide, cesium halide, calcium halide, magnesium halide and the like.

Namely, the use of the above-mentioned alkali metals, hydrides of alkali metals and hydrides of alkaline earth metals is preferred since it is possible to adjust to an intended protection ratio only by an equivalent amount or a little excessive amount of the compound of the formula (3):

X—$CH_2OR$ (3)

to an amount of OH groups corresponding to the intended protection ratio. On the contrary, in the case of using, as the base, salts of other alkali metals or alkaline earth metals, for example, hydroxides of alkali metals or alkaline earth metals, the compound of the formula (3) is decomposed partially and thus the amount of the compound of the formula (3) must be not less than twice the molar amount of OH groups corresponding to the intended protection ratio.

Among them, hydrides of alkali metals are particularly preferred from the point that those hydrides are easily dispersed or dissolved in a solvent at the time of reaction, and as a result, those hydrides contact to the reaction mixture of the polymer (A) and the compound of the formula (3) sufficiently and the reaction advances smoothly. Concretely sodium halide and lithium halide are preferred, and sodium halide is particularly preferred.

In the compound of the formula (3) which is used in the step (II), the hydrocarbon group R is optionally selected depending on kind and structure of the intended protective group.

Concretely examples of preferred R are:
—$CH_3$, —$(CH_2)_nCH_3$, —$CH(CH_3)_2$, —$(CH_2)_nCH(CH_3)_2$, —$C(CH_3)_3$, —$(CH_2)_nC(CH_3)_3$, wherein n is an integer of from 1 to 5,

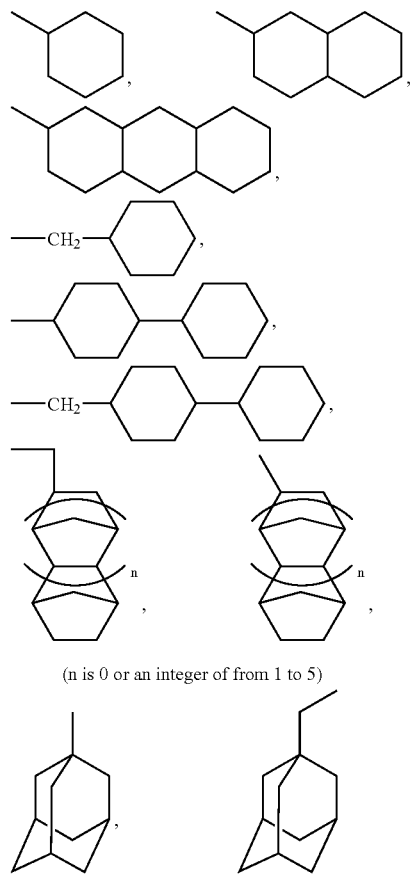

and the like.

X acts as a substituent in the reaction for introducing the protective group, and is selected from halogen atoms other than a fluorine atom. Particularly preferred is a chlorine atom.

In the present invention, the amount of the protective groups (protection ratio) can be controlled by adjusting an amount of at least one of the reacting compound of the formula (3) and the base, preferably by adjusting the amounts of both of the compound of the formula (3) and the base.

Namely, at least one of the amounts of the compound of the formula (3) and the base is determined according to the amount of the polymer (A) and the intended protection ratio.

Concretely the compound of the formula (3) and the base may be used in the number of moles corresponding to the amount of the polymer (A) and the intended protection ratio, or in the number of moles excess to the number of moles corresponding to the protection ratio depending on the reactivity under the respective reaction conditions.

It is preferable that the reaction for introducing the protective groups is carried out in a medium which uniformly dissolves the polymer (A), and the reaction advances by admixing, in the solution, the compound of the formula (3) and base in the above-mentioned number of moles.

It is particularly preferable to mix the compound of the formula (3) to the solution of the polymer (A) and then act the base on the mixture, because uneven distribution of the protection reaction is hardly caused in the polymer.

The present inventors have found problem that even in case of a solution of the polymer (A) uniformly dissolved therein before the reaction, by mixing the base thereto, the polymer (A) or the mixture containing the polymer (A) is precipitated, and as a result, if the polymer or the mixture containing the polymer is precipitated even partially, an intended protection ratio cannot be obtained even if the reaction is continued, and also uneven distribution of the protection ratio in the polymer is increased. The present inventors have made intensive studies to solve the problem.

As a result, when the reaction was carried out in a solvent uniformly dissolving the mixture obtained after mixing the base to the polymer (A), the reaction was advanced smoothly and there could be obtained the polymer (B) having an intended protection ratio in which uneven distribution of the protection ratio was less in the polymer.

Namely, it is important to select the solvent which uniformly dissolves the mixture obtained by mixing the base to the polymer (A).

It is preferable that the solvent is selected from, for example, aprotic organic solvents having a dielectric constant of not less than 15, preferably not less than 20, particularly preferably not less than 25, further preferably not less than 30 at room temperature (20° C.).

Examples of the solvent are, for instance, nitrile solvents, ketone solvents, amide solvents and the like.

Examples of the nitrile solvent are, for instance, acetonitrile, isobutyronitrile, butyronitrile, benzonitrile, lactonitrile and the like.

Examples of the ketone solvent are, for instance, acetone, ethyl methyl ketone, acetophenone, 2-pentanone, 3-pentanone, methyl isobutyl ketone, cyclohexanone and the like.

Examples of the amide solvent are, for instance, N,N-dimethylformamide, N,N-dimethylacetamide and the like.

Examples of other solvents having a high dielectric constant are, for instance, dimethyl sulfoxide, sulfolane, ethylene carbonate and the like.

It is preferable to use at least one of those exemplified solvents.

Among them, nitrile solvents, ketone solvents and amide solvents are preferred from the viewpoint of reactivity and easy isolation and refining of the obtained polymer (B).

On the other hand, ether solvents are preferred as a solvent other than the above-mentioned solvents having a high dielectric constant. The use of those ether solvents is preferred from the point that the reaction for introducing the protective groups advances smoothly, coloring of the polymer (B) after the reaction is inhibited and storage stability of the polymer (B) can be improved.

Examples of the ether solvents are dialkyl ethers such as diethyl ether and diisopropyl ether, ethylene glycol dialkyl ethers such as monoglyme, diglyme and tetraglyme, propylene glycol dialkyl ethers, cyclic ethers such as tetrahydrofuran and dioxane and the like. Among them, tetrahydrofuran, dioxane and monoglyme are preferred, and particularly preferred are tetrahydrofuran and dioxane.

Further when those ether solvents are used, it is preferable that the base is used in an excessive molar amount based on the number of moles of the compound of the formula (3) to be used (or the number of moles corresponding to the intended protection ratio of the polymer (B)).

The use of the base in such an amount is preferred since suspension of the protection reaction due to precipitation of the polymer can be inhibited and also the protection reaction rate can be improved.

The base is used in the number of moles two times, preferably three times, more preferably four times the number of moles of the compound of the formula (3).

The above-exemplified bases can be used as the base, and preferred is at least one selected from organic amines, particularly tertiary amines since storage stability of the polymer (B) can be improved.

The reaction temperature is optionally selected within a range of from −20° C. to 200° C., and the reaction is carried out preferably at a temperature of from 0° C. to 150° C., more preferably from 10° C. to 100° C. When the tertiary amine of the formula (4) is used as the base, the reaction advances sufficiently at a temperature around 10° C. to 50° C., further around room temperature (15° C. to 30° C.).

In the step (II) of the present invention, protective groups corresponding to the compound of the formula (3) used in the reaction can be introduced to a part or the whole of OH groups of the fluorine-containing polymer having OH groups by the above-mentioned method of introducing the protective group.

Concretely there is obtained the polymer (B) having the introduced protective group such as:

—OCH$_2$OCH$_3$,    —OCH$_2$O(CH$_2$)$_n$CH$_3$,    —OCH$_2$OCH(CH$_3$)$_2$, —(OCH$_2$OCH$_2$)$_n$CH(CH$_3$)$_2$, —OCH$_2$OC(CH$_3$)$_3$, —OCH$_2$O(CH$_2$)$_n$C(CH$_3$)$_3$, (n is an integer of from 1 to 5)

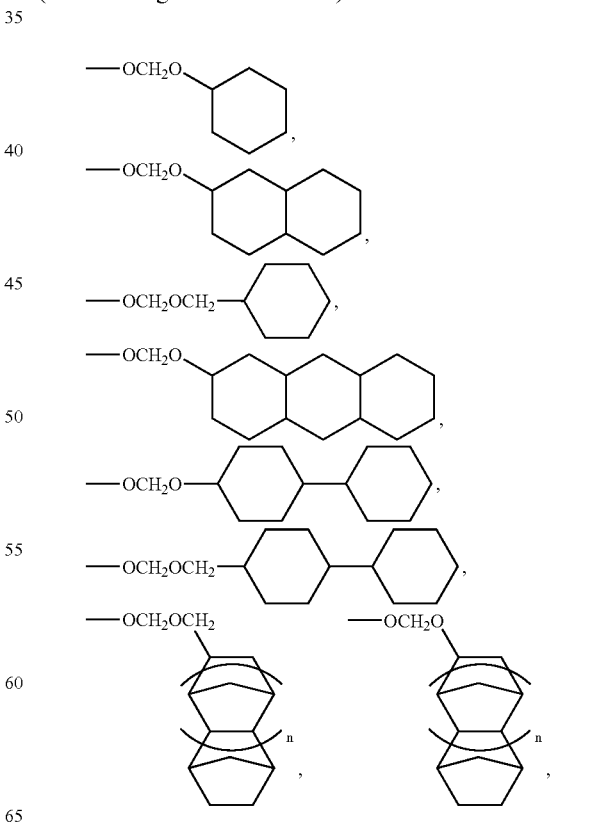

(n is 0 or an integer of from 1 to 5)

—OCH₂O

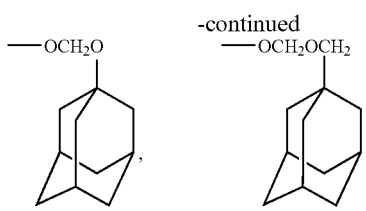

or the like.

Among them, —OCH₂OCH₃ and —OCH₂OC₂H₅ are preferred since transparency at a wavelength of 157 nm is excellent and it is possible for the polymer to act as a positive resist at high sensitivity.

Examples of the preferred polymer (B) which is prepared in the step (II) of the present invention are the above-exemplified preferred polymers (A) obtained in the step (I) in which the above-mentioned preferred protective group is introduced. Concretely preferred are fluorine-containing polymers represented by the formula (M-2):

-(M1)-(M2-1A)-(M2-1B)-(M2)-(N)- wherein the structural unit M1 is a structural unit derived from a fluorine-containing ethylenic monomer (m1) having 2 or 3 carbon atoms and at least one fluorine atom;

the structural unit M2-1A is a structural unit derived from a OH-containing norbornene derivative (m2-1a) which has a moiety represented by the formula (1):

 (1)

wherein Rf is as defined in the formula (1) mentioned supra; the structural unit M2-1B is a structural unit derived from a norbornene derivative (m2-1b) which has a moiety represented by the formula (2-1):

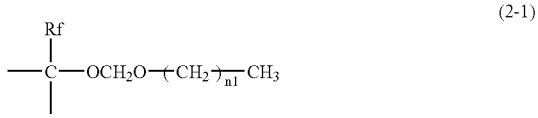 (2-1)

wherein Rf is as defined in the formula (1), n1 is 0 or 1;

the structural unit M2 is a structural unit derived from a norbornene derivative (m2) which may have fluorine atom;

the structural unit N is a recurring unit derived from a monomer (n) copolymerizable with the monomers (m1), (m2-1a), (m2-1b) and (m2);

the proportions of the structural units M1, M2-1A, M2-1B, M2 and N are from 24 to 70% by mole, from 0 to 69% by mole, from 1 to 70% by mole, from 0 to 69% by mole and from 0 to 20% by mole, respectively, and provided that (M1)+(M2-1A)+(M2-1B)+(M2) is 100% by mole, a percent by mole ratio of (M1)/{(M2-1A)+(M2-1B)+(M2)} is 30/70 to 70/30.

With respect to the structural units M1, M2-1A, M2 and N in the polymer of the formula (M-2), examples of the structural units raised in the polymer (A) can be similarly used preferably.

With respect to the structural unit M2-1B, there can be used the above-mentioned preferred examples of the structural unit M2-1A derived from the OH-containing norbornene derivative in which the moiety represented by the above-mentioned formula (2-1) is introduced.

The polymer (B) which is obtained by the method of introducing the protective group of the present invention exhibits good solubility in a developing solution in the developing (step VI) after the exposing (step V) which is explained infra. As a result, a fine pattern having high resolution can be obtained.

In the step (III), the resist composition comprising:

(a) the above-mentioned polymer (B), (b) a photoacid generator, and (c) a solvent is prepared using the polymer (B) obtained in the step (II).

In the resist composition of the present invention, there are preferably exemplified the same examples of the photoacid generator (b) as those of the photoacid generator (b) raised in International Publication No. 01/74916. Those photoacid generators can also be used effectively in the present invention.

The photoacid generator is a compound which generates acid or cation by irradiation of light. Examples thereof are, for instance, organic halogen compounds, sulfonic acid esters, onium salts (particularly fluoroalkyl onium salts having iodine, sulfur, selenium, tellurium, nitrogen or phosphorus as a center element), diazonium salts, disulfone compounds, sulfonediazides and a mixture thereof.

More preferred examples thereof are as follows.

(1) TPS Compound:

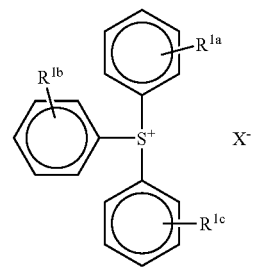

wherein $X^-$ is $PF_6^-$, $SbF_6^-$, $CF_3SO_3^-$, $C_4F_9SO_3^-$ or the like; $R^{1a}$, $R^{1b}$ and $R^{1c}$ are the same or different and each is $CH_3O$, H, t-Bu, $CH_3$, OH or the like.

(2) DPI Compound:

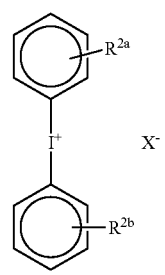

wherein $X^-$ is $CF_3SO_3^-$, $C_4F_9SO_3^-$, $CH_3$-φ-$SO_3^-$, $SbF_6^-$,

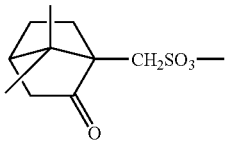

or the like; $R^{2a}$ and $R^{2b}$ are the same or different and each is H, OH, $CH_3$, $CH_3O$, t-Bu or the like.

(3) Sulfonate Compound:

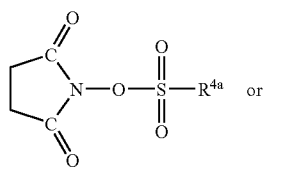

or

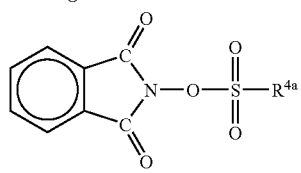

wherein $R^{4a}$ is:

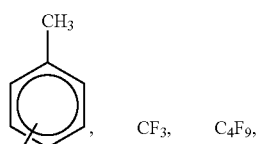, $CF_3$, $C_4F_9$,

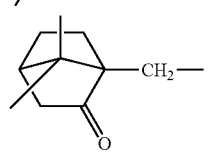

or the like.

The content of photoacid generator (b) used for the photoresist composition in the present invention is preferably from 0.1 to 30 parts by weight, more preferably from 0.2 to 20 parts by weight, particularly preferably from 0.5 to 10 parts by weight based on 100 parts by weight of the polymer (B).

If the content of photoacid generator (b) is lower than 0.1 part by weight, sensitivity is lowered, and if the content of photoacid generator (b) is higher than 30 parts by weight, an amount of light absorbed by the photoacid generator is increased and light does not reach a substrate sufficiently and therefore resolution tends to be lowered.

Also to the resist composition of the present invention may be added an organic base being capable of acting as a base on an acid generated from the photoacid generator (b). Examples of preferred organic base are the same as those exemplified in International Publication No. 01/74916. Those organic bases can also be used effectively in the present invention.

The organic base is an organic amine compound selected from nitrogen-containing compounds. Examples thereof are, for instance, pyridine compounds, pyrimidine compounds, amines substituted by hydroxyalkyl group having 1 to 4 carbon atoms, amino phenols and the like. Particularly preferred are amines having hydroxyl.

Examples thereof are butylamine, dibutylamine, tributylamine, triethylamine, tripropylamine, triamylamine, pyridine and the like.

The content of organic base used for the photoresist composition of the present invention is preferably from 0.1 to 100% by mole, more preferably from 1 to 50% by mole based on the content of photoacid generator (b). If the content of organic base is lower than 0.1% by mole, resolution is lowered, and if the content of organic base is higher than 100% by mole, sensitivity tends to be lowered.

The resist composition of the present invention may contain, as case demands, additives disclosed in International Publication No. 01/74916, for example, various additives which have been usually used in this field, such as dissolution inhibitor, sensitizer, dye, adhesion betterment material and water storage material.

Also in the resist composition of the present invention, examples of preferred solvent (c) are the same as those of the solvent (c) exemplified in International Publication No. 01/74916. Those solvents can also be used effectively in the present invention.

Examples thereof are preferably cellosolve solvents, ester solvents, propylene glycol solvents, ketone solvents, aromatic hydrocarbon solvents and solvent mixtures thereof. Also in order to enhance solubility of the polymer (B), fluorine-containing solvents, namely, fluorine-containing hydrocarbon solvents such as $CH_3CCl_2F$ (HCFC-141b) and fluorine-containing alcohols may be used together.

The amount of the solvent (c) is selected depending on kind of solids to be dissolved, kind of a substrate to be coated, an intended coating thickness, etc. From the viewpoint of easy coating, it is preferable that the solvent is used in such an amount that the concentration of the whole solids of the photoresist composition becomes from 0.5 to 70% by weight, preferably from 1 to 50% by weight.

Mentioned below is the explanation of the method of forming a pattern of the step (IV) to the step (VI) on reference to the drawing in the case where the resist composition of the present invention is used.

FIG. 1 is a cross-sectional view showing the method of forming a fine pattern of the present invention.

(IV) Step for Forming a Resist Film

First, as shown in FIG. 1(a), the photosensitive composition obtained from the fluorine-containing resin is coated on a substrate 11 by a rotary coating method or the like in a coating thickness of from 0.01 to 5 μm, preferably from 0.05 to 0.5 μm, more preferably from 0.1 to 0.3 μm.

Next, pre-baking treatment is carried out at a pre-determined temperature of not more than 150° C., preferably from 80° to 130° C. to form a resin layer (layer of photosensitive composition), namely a resist layer 12.

Non-limiting examples of the above-mentioned substrate are, for instance, a silicon wafer, glass substrate, silicon wafer or glass substrate provided with organic or inorganic anti-reflection films, silicon wafer provided with insulation films, electrode and wiring on a surface thereof and having steps, mask blank, semiconductor wafer of III–V group compound such as GaAs and AlGaAs, semiconductor wafer of II–VI group compound, piezoelectric wafer of crystal, quartz or lithium tantalate and the like.

The coating film of the resist composition of the present invention is preferably one having high transparency in a vacuum ultraviolet region. Concretely it is preferable that an absorption coefficient at a wavelength of 157 nm is not more than 2.5 µm⁻¹, preferably not more than 2.0 µm⁻¹, particularly preferably not more than 1.50 µm⁻¹, further preferably not more than 1.0 µm⁻¹. The coating film can be used effectively for a lithography process using $F_2$ laser (157 nm).

(V) Step for Exposing

Figure 1B:
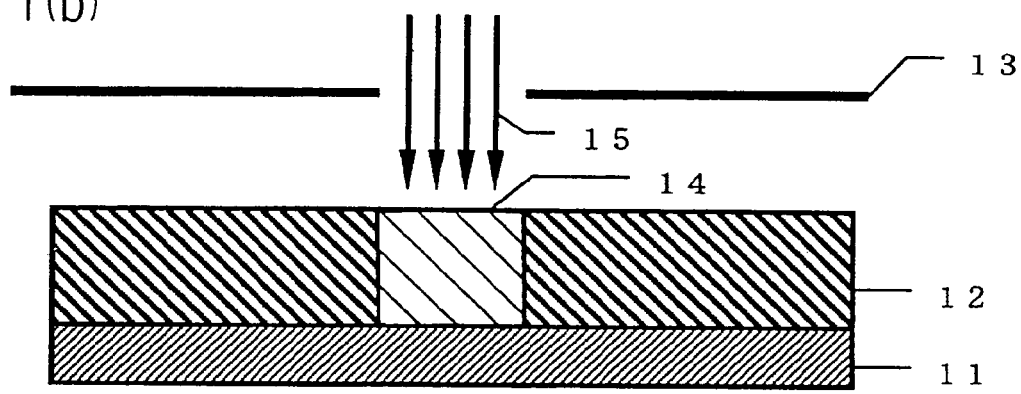

Then as shown in FIG. 1(b), a pattern is drawn on the resist layer 12 by irradiating energy rays, for example, $F_2$ laser as shown by an arrow 15 through a mask 13 having a desired pattern, thus selectively exposing a specific area 14.

In that case, it is possible to carry out exposing of a pattern by using, as an exposure light, energy rays (or chemical radiation), namely, X-ray, high energy electron beam, synchrotron radiation, characteristic radiation of high pressure mercury lamp, excimer laser other than $F_2$ laser or the like or to directly expose the resist film to the pattern by scanning with electron beam, ion beam or the like without using the mask. The effect of the present invention is exhibited most when $F_2$ laser is used as exposure light.

Figure 1C:
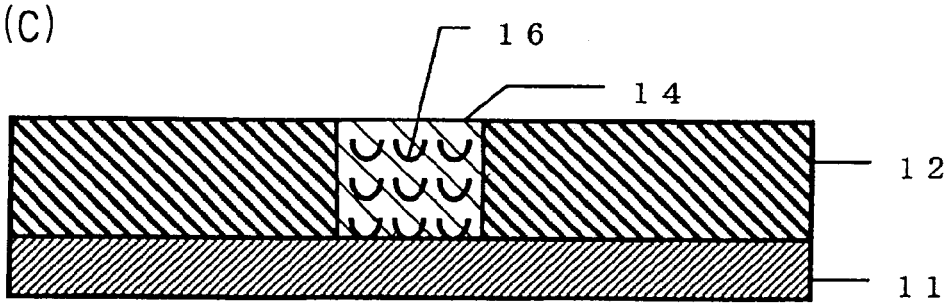

Subsequently by carrying out baking at a temperature of from 70° to 160° C., preferably from 90° to 140° C., for about 30 seconds to about 10 minutes after the exposing, a latent image 16 is formed on the exposed area 14 of the resist film as shown in FIG. 1(c). At that time, an acid generated by the exposing acts as a catalyst to decompose the dissolution-inhibiting group (protective group), thereby increasing solubility in a developing solution and making the exposed area of the resist film soluble in a developing solution.

(VI) Step for Developing

Then when the resist film 12 baked after the exposing is subjected to developing with a developing solution, the un-exposed portion of the resist film 12 remains on the substrate because its solubility in the developing solution is low but the exposed area 14 is dissolved in the developing solution as mentioned above.

As a developing solution, an aqueous solution of 2.38% by weight of tetramethylammonium hydroxide is used preferably. Further in order to adjust wettability to the resist film, a surfactant and alcohol such as methanol, ethanol, propanol or butanol may be added to the aqueous solution of 2.38% by weight of tetramethylammonium hydroxide.

Figure 1D:
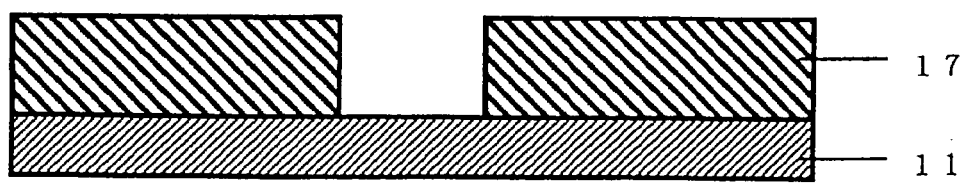

Next, after washing out the developing solution with pure water, lower alcohol or a mixture thereof, the substrate is dried and thus a desired resist pattern 17 can be formed as shown in FIG. 1(d).

While the above-mentioned explanation is made with respect to the case of using $F_2$ laser as the energy ray, ArF laser is also suitable as the energy ray used for the method of forming a fine pattern of the present invention.

Also KrF laser is suitable as the energy ray used for the method of forming a fine pattern of the present invention.

High energy electron beam is also suitable as the energy ray used for the method of forming a fine pattern of the present invention.

Also high energy ion beam is suitable as the energy ray used for the method of forming a fine pattern of the present invention.

Also X-ray generated from synchrotron radiation is suitable as the energy ray used for the method of forming a fine pattern of the present invention.

Though the above-mentioned explanation is made with respect to the case of forming the resist film on the substrate 11, the formation of the resist film is not limited to the case of forming the resist film on a so-called substrate. The resist film may also be formed on a specific layer such as an electrically conductive film, insulating film or the like which is formed on the substrate. Also it is possible to form an antireflection film, for example, DUV-30, DUV-32, DUV-42 and DUV44 available from Brewer Science Co., Ltd. on the substrate. The resist film may be formed on a substrate treated with an adhesion improver, thus making it possible to enhance adhesion of the photosensitive composition to the substrate. The substrate is also not limited to those for production of semiconductor devices and includes various substrates for production of electronic devices as mentioned above.

Also when an intended fine pattern of an electrically conductive film or an insulating film is formed by using the so-formed fine resist pattern as a mask and etching a specific layer under the mask and then other steps are carried out, semiconductor devices and electronic devices can be produced. Since those steps are well known, explanation thereof is omitted.

The second of the present invention relates to the process for preparing the fluorine-containing polymer having a protective group by converting the OH group of the fluorine-containing polymer having OH group to an alkoxy methyl ether group which is a specific protective group.

Namely, the present invention relates to the process for preparing the polymer (B1) by using the polymer (A1) having a moiety represented by the formula (1):

wherein Rf is a fluorine-containing alkyl group having 1 to 5 carbon atoms, and converting the moiety of the formula (1) to a moiety represented by the formula (2):

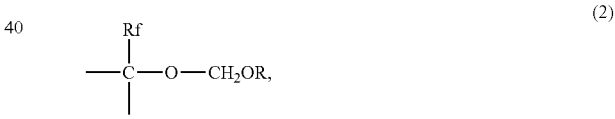

wherein Rf is as defined in (1) above, R is a hydrocarbon group having 1 to 30 carbon atoms, in which a part or the whole of hydrogen atoms may be substituted with fluorine atoms, and the process for preparing the polymer (B1) having the moiety of the formula (2) is characterized in that at least one base selected from ammonia and organic amines and the compound of the formula (3):

wherein X is Cl, Br or I; R is as defined in the formula (2), are reacted with the polymer (A1) in a solvent which can uniformly dissolve the mixture of the polymer (A1) and ammonia or organic amines.

The polymer (A1) which is used in the process of the present invention for preparing the polymer (B1) may be not only the above-mentioned polymers having the structural unit derived from the OH-containing norbornene derivative but also a fluorine-containing polymer having the moiety of the formula (1) in the polymer trunk chain or polymer side chain.

The polymer (A1) may be, for example, a polymer having a recurring unit obtained by cyclic polymerization of a fluorine-containing diene having the structure of the formula (1) which is disclosed in International Publication No. W002/065212 or a fluorine-containing polymer having a structural unit derived from a fluorine-containing ethylenic monomer having the structure of the formula (1) which is disclosed in International Publication No. W002/066526.

In the process of the present invention for preparing the polymer (B1), at least one selected from ammonia and organic amines is used as a base.

Among them, tertiary amines are preferred from the point that reactivity is high, an amount of introduced protective groups (protection ratio) can be controlled as intended and the protective groups can be introduced equally to the OH groups in the polymer (A1) without uneven distribution. Also tertiary amines are preferred from the point that metal ion is difficult to mix to the polymer and further to the resist.

Preferred examples of the organic amine are the same as those exemplified supra, and particularly preferred are tertiary amines represented by the formula (4):

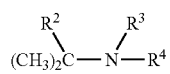

(4)

wherein $R^2$ is H or $CH_3$, $R^3$ and $R^4$ are the same or different and each is a hydrocarbon group having 1 to 6 carbon atoms.

Namely, at least one of hydrocarbon groups bonded to nitrogen atom is an isopropyl group or tert-butyl group. Concretely preferred is at least one selected from dimethylisopropylamine, diethylisopropylamine, diisopropylmethylamine, diisopropylethylamine, dimethyl-tert-butylamine, diethyl-tert-butylamine and the like.

Among them, diisopropylalkylamines are preferred, and particularly preferred are diisopropylmethylamine and diisopropylethylamine.

The compound represented by the formula (3) used for the reaction is optionally selected depending on an intended protective group. Concretely the same compounds as exemplified supra can be used preferably.

In the process of the present invention for preparing the polymer (B1), it is important that the process is carried out in a solvent which can uniformly dissolve the mixture obtained by mixing the polymer (A1) with the above-mentioned base, thereby advancing the reaction smoothly and making it possible to obtain the polymer (B1) having an intended protection ratio and less uneven distribution of the protection ratio in the polymer.

Namely, it is important to select a solvent which can uniformly dissolve the mixture of the polymer (A1) and the base.

It is preferable that the solvent is selected from, for example, aprotic organic solvents having a dielectric constant of not less than 15, preferably not less than 20, particularly preferably not less than 25, further preferably not less than 30 at room temperature (20° C.).

Examples of the solvent are, for instance, nitrile solvents, ketone solvents, amide solvents and the like.

Examples of the nitrile solvent are, for instance, acetonitrile, isobutyronitrile, butyronitrile, benzonitrile, lactonitrile and the like.

Examples of the ketone solvent are, for instance, acetone, ethyl methyl ketone, acetophenone, 2-pentanone, 3-pentanone, methyl isobutyl ketone, cyclohexanone and the like.

Examples of the amide solvent are, for instance, N,N-dimethylformamide, N,N-dimethylacetamide and the like.

Examples of other solvents having a high dielectric constant are, for instance, dimethyl sulfoxide, sulfolane, ethylene carbonate and the like.

It is preferable to use at least one of those exemplified solvents.

Among them, nitrile solvents, ketone solvents and amide solvents are preferred from the viewpoint of reactivity and easy isolation and refining of the obtained polymer (B1).

On the other hand, ether solvents are preferred as a solvent other than the solvents having a high dielectric constant. The use of those ether solvents is preferred from the point that the reaction for introducing the protective group advances smoothly, coloring of the polymer (B1) after the reaction is inhibited and storage stability of the polymer (B1) can be improved.

Examples of the ether solvents are dialkyl ethers such as diethyl ether and diisopropyl ether, ethylene glycol dialkyl ethers such as monoglyme, diglyme and tetraglyme, propylene glycol dialkyl ethers, cyclic ethers such as tetrahydrofuran and dioxane and the like. Among them, tetrahydrofuran, dioxane and monoglyme are preferred, and particularly preferred are tetrahydrofuran and dioxane.

Further when those ether solvents are used, it is preferable that the base is used in an excessive molar amount based on the number of moles of the compound of the formula (3) to be used (or the number of moles corresponding to the intended protection ratio of the polymer (B1)).

The use of the base in such an amount is preferred since suspension of the protection reaction due to precipitation of the polymer is inhibited and also the protection reaction rate is improved.

The base is used in the number of moles two times, preferably three times, more preferably four times the number of moles of the compound of the formula (3).

The reaction temperature is optionally selected within a range of from −20° C. to 200° C., and the reaction is carried out preferably at a temperature of from 0° C. to 150° C., more preferably from 10° to 100° C. When tertiary amine of the formula (4) is used as the base, the reaction advances sufficiently at a temperature of from 10° to 50° C., further around room temperature (15° to 30° C.).

For the other reaction conditions, refer to the explanation on the step (II) mentioned supra.

In the above-mentioned method of forming a fine pattern, the present inventors have made intensive studies with respect to stereostructure of the polymer (B) obtained by the step (II) from the polymer (A) which has a structural unit derived from the OH-containing norbornene derivative (m1-a).

As a result, the present inventors have firstly found that in the polymer (A), the atomic group having the moiety of the formula (1) bonded to the carbon atom(s) of norbornene ring of the structural unit derived from the OH-containing norbornene derivative (m1-a), or the —OH group directly bonded to norbornene ring has two kinds of stereoisomers of endo-form and exo-form, and secondarily have found that according to the process of the step (II), in the polymer (A), the structural unit derived from the norbornene derivative having OH group (or an atomic group having OH group) in the exo-form reacts preferentially.

When attention is directed only to the structural unit M2-3B in the so-obtained polymer (B) which is derived from the protective-group-containing norbornene derivative and has a moiety represented by the formula (5):

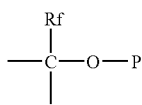

(5)

wherein Rf is a fluorine-containing alkyl group having 1 to 5 carbon atoms; —O—P is a protective group which can be converted to OH group by dissociation reaction with an acid, the present inventors have found that the structural unit M2-3B is a structural unit derived from the protective-group-containing norbornene derivative in which in its endo-exo stereoisomers, the atomic group having the moiety of the formula (5) bonded to the carbon atom(s) of norbornene ring and/or the —O—P atomic group has a high exo-percentage represented by (Equation 1).

$$90\% \text{ by mole} \leq \frac{Exo\text{-form}}{(Exo\text{-form} + Endo\text{-form})} \times 100 \leq 100\% \text{ by mole} \quad \text{(Equation 1)}$$

In the norbornene derivative, the atomic group (-PG) having the moiety of the formula (5) bonded to the ring structure is in either of endo-form or exo-form. In the endo-form, the atomic group (PG) having the moiety of the formula (5) is located inside the norbornene ring as shown by the formula (5A):

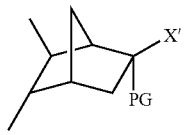

(5A)

wherein PG is the atomic group having the moiety of the formula (5); X' is selected from a hydrogen atom, a fluorine atom or CF$_3$, and in the exo-form, the atomic group (PG) having the moiety of the formula (5) is located outside the norbornene ring as shown by the formula (5B):

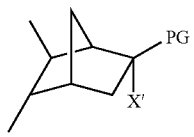

(5B)

wherein PG and X' are as defined above. The difference and proportions of those stereoisomers can be detected and quantitatively analyzed by $^{19}$F-NMR, etc.

When using the resist composition prepared using the fluorine-containing polymer having the structural unit derived from the protective-group-containing norbornene derivative which has a high exo-percentage, a fine pattern having high resolution can be formed.

On the other hand, the present inventors have succeeded in synthesizing a protective-group-containing norbornene derivative (monomer) which has an exo-percentage as high as that represented by (Equation 1), and by polymerizing the derivative (monomer), could obtain a fluorine-containing polymer having a structural unit derived from the protective-group-containing norbornene derivative which has a high exo-percentage as mentioned above.

The present inventors also have found that when the fluorine-containing polymer having a protective group obtained by polymerizing the protective-group-containing norbornene derivative (monomer) which has a high exo-percentage is used for a resist composition, a fine pattern having high resolution can be formed as compared with conventional one having a low exo-percentage (high endo-percentage).

In the fluorine-containing polymer having a protective group in which the atomic group having the moiety of the formula (5) bonded to carbon atom(s) of norbornene ring or the —O—P atomic group directly bonded to norbornene ring is in exo-form at a high ratio, dissociation reactivity of the protective group by an acid is higher than that of the endo-form, and therefore it can be considered that in the exposing step (step V) of photolithography process, the protective group (—O—P) is converted to OH group more efficiently on the portion irradiated with light and in the following developing step (step VI), good dissolution ability is exhibited.

On the contrary, it can be considered that when the moiety having the protective group is in endo-form, since dissociation reactivity by an acid is insufficient, the dissociation reaction (deprotection reaction) is difficult to advance completely in the exposing step (step V) and un-reacted protective groups remain partly without deprotection and in the following developing step (step VI), dissolution ability becomes insufficient and as a result, resolution is lowered.

Namely, the third of the present invention relates to the resist composition comprising:

(a-1) a fluorine-containing polymer having the structural unit M2-3B which is derived from the protective-group-containing norbornene derivative and has the moiety of the formula (5):

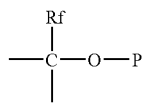

(5)

wherein Rf is a fluorine-containing alkyl group having 1 to 5 carbon atoms; —O—P is a protective group which can be converted to OH group by dissociation reaction with an acid, (b-1) a photoacid generator and (c-1) a solvent, in which the structural unit M2-3B is a structural unit derived from the protective-group-containing norbornene derivative in which the atomic group having the moiety of the formula (5) is bonded to a carbon atom or carbon atoms of norbornene ring and/or the moiety of the formula (5) forms a part of norbornene ring, wherein an exo-percentage of the atomic group bonded to the carbon atom(s) of norbornene ring and/or the —O—P atomic group directly bonded to norbornene ring satisfies (Equation 1).

$$90\% \text{ by mole} \leq \frac{Exo\text{-form}}{(Exo\text{-form} + Endo\text{-form})} \times 100 \leq 100\% \text{ by mole} \quad \text{(Equation 1)}$$

In the third invention, attention is directed to the moiety having a protective group, and the fluorine-containing polymer having the structural unit which is derived from the protective-group-containing norbornene derivative and has a high exo-percentage shown by Equation 1 is used. It is preferable that the exo-percentage:

$$\frac{Exo\text{-form (mol)}}{(Exo\text{-form} + Endo\text{-form}) \text{ (mol)}} \times 100\% \text{ by mole}$$

is not less than 95% by mole, more preferably not less than 97% by mole, particularly preferably not less than 99% by mole, and particularly preferred is a structural unit having an exo-percentage of substantially 100% by mole. If the exo-percentage is too low, resolution becomes insufficient at forming a resist pattern, and therefore too low exo-percentage is not preferred since a precise fine pattern cannot be obtained.

In the resist composition of the present invention, the fluorine-containing polymer (a-1) is the fluorine-containing polymer having the structural unit of the norbornene derivative having the moiety of the above-mentioned formula (5) and has the above-mentioned specific stereostructure. In the fluorine-containing polymers satisfying those requirements, the same effect is exhibited in resolution.

In the present invention, the moiety (protective group) of the formula (5) which is bonded to norbornene ring is particularly preferably an acetal compound represented by the formula (5-1):

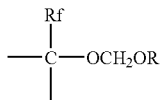
(5-1)

wherein Rf is as defined in the formula (5), R is a hydrocarbon group having 1 to 30 carbon atoms, in which a part or the whole of hydrogen atoms may be substituted with fluorine atoms; or an acetal compound represented by the formula (5-2):

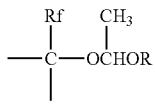
(5-2)

wherein Rf is as defined in the formula (5), R is a hydrocarbon group having 1 to 30 carbon atoms, in which a part or the whole of hydrogen atoms may be substituted with fluorine atoms, from the viewpoint of transparency.

Examples of preferred R in the formula (5-1) and the formula (5-2) are —CH$_3$, —(CH$_2$)$_n$CH$_3$, —CH(CH$_3$)$_2$, —(CH$_2$)$_n$CH(CH$_3$)$_2$, —C(CH$_3$)$_3$, —(CH$_2$)$_n$C(CH$_3$)$_3$, wherein n is an integer of from 1 to 5,

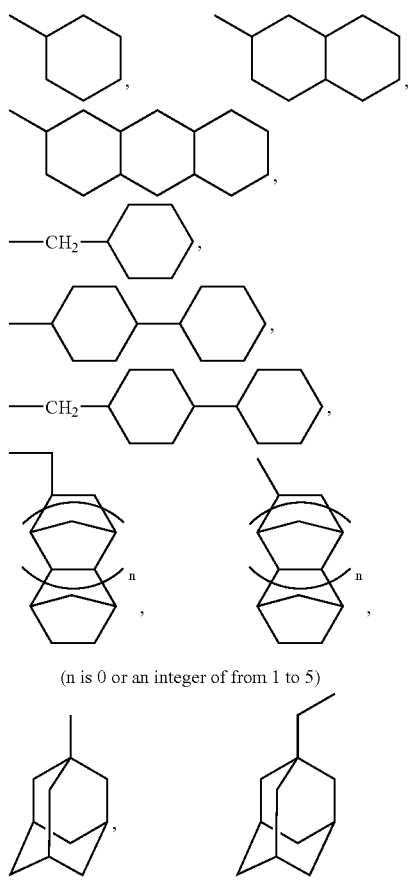

and the like.

Further examples of the preferred moiety of the formula (5) are an alkoxy carbonate group represented by the formula (5-3):

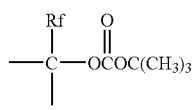
(5-3)

wherein Rf is as defined in the formula (5), and an alkoxyl group represented by the formula (5-4):

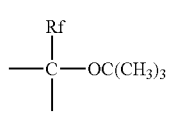
(5-4)

wherein Rf is as defined in the formula (5).

The fluoroalkyl group represented by Rf in the formulae (5), (5-1), (5-2), (5-3) and (5-4) is an alkyl group having 1 to 5 carbon atoms in which a part or the whole of hydrogen atoms are substituted with fluorine atoms, and by an effect of the substituting fluorine atoms, acidity of OH group in the formula (1) can be enhanced and solubility in a developing solution can be imparted in the use for resist application.

Therefore it is particularly preferable that the Rf group is a perfluoroalkyl group since acidity of OH group can be enhanced more. Examples thereof are groups represented by:

—$(CF_2)_m CF_3$,
—$(CF_2)_{m1} CF$–$(CF_3)_2$ and
—$(CF_2)_{m2} C$–$(CF_3)_3$, wherein m is 0 or an integer of from 1 to 4; m1 is 0, 1 or 2; m2 is 0 or 1. Concretely there are preferably —$CF_3$, —$C_2F_5$, —$CF_2CF(CF_3)_2$—$CH(CF_3)_2$ and the like, and particularly preferred are —$CF_3$, —$C_2F_5$ and further preferred is —$CF_3$.

Preferable examples of the fluorine-containing polymer (a-1) is a fluorine-containing polymer having a protective group which is represented by the formula (M-3):

-(M1)-(M2)-(M2-3B)-(N)-  (M-3)

wherein the structural unit M1 is a structural unit derived from a fluorine-containing ethylenic monomer (m1) having 2 or 3 carbon atoms and at least one fluorine atom;

the structural unit M2 is a structural unit derived from a norbornene derivative (m2) which may have fluorine atom;

the structural unit M2-3B is a structural unit derived from a protective-group-containing norbornene derivative (m2-3b) in which the atomic group having the moiety of the formula (5) is bonded to a carbon atom or carbon atoms of norbornene ring and/or the moiety of the formula (5) forms a part of norbornene ring, wherein the atomic group having the moiety of the formula (5) bonded to the carbon atom(s) of norbornene ring and/or the —O—P atomic group directly bonded to norbornene ring has a high exo-percentage represented by (Equation 1) in its endo-exo stereoisomers;

the structural unit N is a structural unit derived from a monomer (n) copolymerizable with the monomers (m1), (m2) and (m2-3b);

the proportions of the structural units M1, M2, M2-3B and N are from 24 to 70% by mole, from 0 to 69% by mole, from 1 to 70% by mole and from 0 to 20% by mole, respectively, and provided that (M1)+(M2)+(M2-3B) is 100% by mole, a percent by mole ratio of (M1)/((M2)+(M2-3B)) is 30/70 to 70/30.

The fluorine-containing polymer of the formula (M-3) contains, as essential components, the structural unit M1 derived from the fluorine-containing ethylenic monomer (m1) and the structural unit M2-3B derived from the protective-group-containing norbornene derivative (m2-3b). The structural unit M2 derived from the norbornene derivative (m2) and the structural unit N derived from the monomer (n) are optional components.

Preferred examples of the structural unit M2 derived from the norbornene derivative (m2) are the structural unit M2-1A derived from the OH-containing norbornene derivative, the structural unit M2-1 derived from the norbornene derivative (m2-1) having no functional group and the structural unit M2-2 derived from the norbornene derivative (m2-2) having a carboxylic acid or a carboxylic acid derivative (—$COOY^2$) obtained by introducing, to the carboxylic acid, a protective group undergoing dissociation by an acid, like the fluorine-containing polymer (M-1) having OH group mentioned supra. Preferred examples of the respective structural units are also the same as those exemplified in the fluorine-containing polymer (M-1) having OH group mentioned supra.

Among them, the structural unit M2 is preferably the structural unit M2-1A derived from the OH-containing norbornene derivative since solubility in a developing solution can be imparted to the fluorine-containing polymer without lowering transparency of the polymer and after preparing a resist composition, a fine pattern having high resolution can be formed.

Namely, more preferred as the fluorine-containing polymer (a-1) are fluorine-containing polymers having a protective group represented by the formula (M-4):

-(M1)-(M2-6A)-(M2-3B)-(M2)-(N)-  (M-4)

wherein the structural unit M2-6A is a structural unit derived from a OH-containing norbornene derivative (m2-6a) and having a moiety represented by the formula (1):

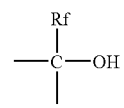

(1)

wherein Rf is as defined in the above-mentioned formula (1);

the structural units M1, M2-3B, M2 and N are as defined in the above-mentioned formula (M-3);

the proportions of the structural units M1, M2-6A, M2-3B, M2 and N are from 24 to 70% by mole, from 1 to 69% by mole, from 1 to 69% by mole, from 0 to 68% by mole and from 0 to 20% by mole, respectively, and provided that (M1)+(M2-6A)+(M2-3B)+(M2) is 100% by mole, a percent by mole ratio of (M1)/((M2-6A)+(M2-3B)+(M2)) is 30/70 to 70/30.

Those fluorine-containing polymers are preferred from the viewpoint of excellent transparency and dry etching resistance, and since transparency particularly to light of 193 nm and 157 nm in a vacuum ultraviolet region is high, the polymers are useful for ArF resist and $F_2$ resist and are preferred particularly as a fluorine-containing polymer for $F_2$ resist.

The structural unit M2-6A derived from the OH-containing norbornene derivative (m2-6a) is preferably a structural unit derived from at least one selected from the group consisting of the OH-containing norbornene derivatives of the formulae (2-2a), (2-3a), (2-4a) and (2-5a) in the fluorine-containing polymer (M-1) having OH group. Preferred examples thereof are also the same as those mentioned supra.

The structural unit M1 derived from the fluorine-containing ethylenic monomer (m1) in the formulae (M-3) and (M-4) is obtained from the fluorine-containing ethylenic monomer and is preferred since good transparency can be imparted to the obtained copolymer and particularly there can be provided an effect of enhancing transparency to ultraviolet light having short wavelengths (for example, 157 nm).

Examples of the monomer introducing the structural unit M1 are $CF_2$=$CF_2$, $CF_2$=$CFCl$, $CH_2$=$CF_2$, $CFH$=$CH_2$, $CFH$=$CF_2$, $CF_2$=$CFCF_3$, $CH_2$=$CFCF_3$, $CH_2$=$CHCF_3$ and the like.

Among them, tetrafluoroethylene ($CF_2=CF_2$) and chlorotrifluoroethylene ($CF_2=CFCl$) are preferred from the viewpoint of good copolymerizability and high effect of imparting transparency.

In the fluorine-containing polymer (a-1), preferred example of the structural unit M2-3B derived from the protective-group-containing norbornene derivative is a structural unit in which the atomic group having the moiety of the formula (5) ((5-1), (5-2), (5-3) or (5-4)) is bonded to norbornene ring or the moiety of the formula (5) ((5-1), (5-2), (5-3) or (5-4)) forms a part of norbornene ring.

The structural unit M2-3B is concretely a structural unit derived from the protective-group-containing norbornene derivative which is represented by the formula (m2-3b-1):

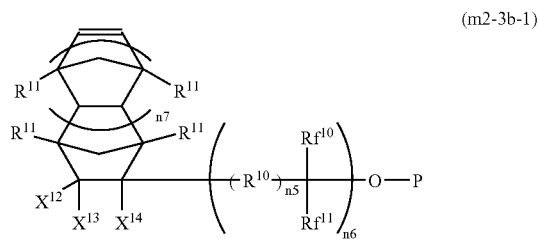

(m2-3b-1)

wherein —O—P is a protective group which can be converted to OH group by dissociation reaction with an acid; $X^{14}$ is selected from a hydrogen atom, a fluorine atom or $CF_3$, and provided that n6 is 0, $X^{14}$ is $CF_3$; $X^{12}$ and $X^{13}$ are the same or different and each is a hydrogen atom or a fluorine atom; $R^{10}$ is a divalent organic group selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n5 and n6 are the same or different and each is 0 or 1; $Rf^{10}$ and $Rf^{11}$ are the same or different and each is a fluorine-containing alkyl group having 1 to 5 carbon atoms; each of $R^{11}$ is a hydrogen atom or an alkyl group having 1 to 10 carbon atoms; n7 is 0 or an integer of from 1 to 5, and an exo-percentage of the atomic group contained therein and represented by the formula (6):

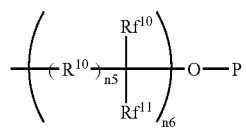

(6)

satisfies (Equation 2).

$$90\% \text{ by mole} \leq \frac{Exo\text{-form}}{(Exo\text{-form} + Endo\text{-form})} \times 100 \leq 100\% \text{ by mole} \quad \text{(Equation 2)}$$

The exo-percentage:

$$\frac{Exo\text{-form (mole)}}{(Exo\text{-form} + Endo\text{-form}) \text{ (mole)}} \times 100\% \text{ by mole}$$

is preferably not less than 95% by mole, more preferably not less than 97% by mole, particularly preferably not less than 99% by mole. Particularly the structural unit having an exo-percentage of substantially 100% by mole is preferred.

Those fluorine-containing polymers used for the resist composition of the present invention can effectively impart, to the resist, transparency in a vacuum ultraviolet region, dry etching resistance and solubility in a developing solution which are required for the resist.

The structural unit derived from the norbornene derivative of the formula (m2-3b-1) is preferably the structural unit derived from the protective-group-containing norbornene derivative, in which $X^{12}$ and $X^{13}$ are H and $X^{14}$ is F or $CF_3$ or the structural unit derived from the protective-group-containing norbornene derivative, in which $X^{12}$ and $X^{13}$ are F and $X^{14}$ is F or $CF_3$.

In the formula (m2-3b-1), preferred examples of $Rf^{10}$ and $Rf^{11}$ are the same as those exemplified in the above-mentioned formula (5), and $CF_3$ is particularly preferred.

Also in the formula (m2-3b-1), each of $R^{11}$ is selected from a hydrogen atom or an alkyl group having 1 to 10 carbon atoms and may be the same or different. Preferred $R^{11}$ is a hydrogen atom or $CH_3$, and particularly preferred is a hydrogen atom.

The first of preferred protective-group-containing norbornene derivative (m2-3b-1) is a norbornene derivative represented by the formula (m2-3b-2):

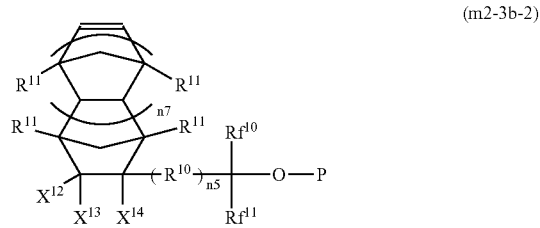

(m2-3b-2)

wherein —O—P is a protective group which can be converted to OH group by dissociation reaction with an acid; $X^{14}$ is selected from a hydrogen atom, a fluorine atom or $CF_3$; $X^{12}$ and $X^{13}$ are the same or different and each is a hydrogen atom or a fluorine atom; $R^{10}$ is a divalent organic group selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n5 is 0 or 1; $Rf^{10}$ and $Rf^{11}$ are the same or different and each is a fluorine-containing alkyl group having 1 to 5 carbon atoms; each of $R^{11}$ is a hydrogen atom or an alkyl group having 1 to 10 carbon atoms; n7 is 0 or an integer of from 1 to 5.

Concretely preferred is a protective-group-containing norbornene derivative which is represented by the formula (m2-3b-3):

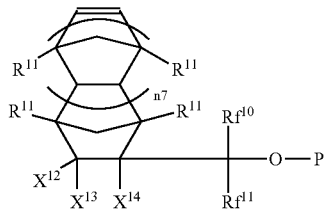
(m2-3b-3)

wherein —O—P, $X^{12}$, $X^{13}$, $X^{14}$, $Rf^{10}$, $Rf^{11}$, $R^{11}$ and n7 are as defined in the above formula (m2-3b-1).

In the formulae (m2-3b-1) and (m2-3b-2), it is preferable that at least one of $X^{12}$, $X^{13}$ and $X^{14}$ is F or $CF_3$ from the viewpoint of transparency and solubility in a developing solution when forming into a polymer and then a resist.

The norbornene derivative of the formula (m2-3b-2) is further preferably a protective-group-containing norbornene derivative which is represented by the formula (m2-3b-4):

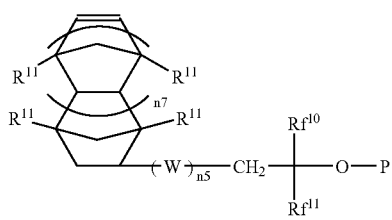
(m2-3b-4)

wherein W is an oxygen atom or —$CH_2O$—; O—P, $Rf^{10}$, $Rf^{11}$, $R^{11}$, n5 and n7 are as defined in the above formula (m2-3b-2).

Examples of the protective-group-containing norbornene derivative of the formula (m2-3b-3) are, for instance:

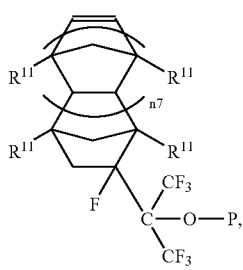

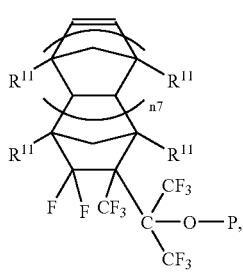

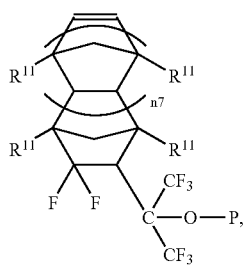 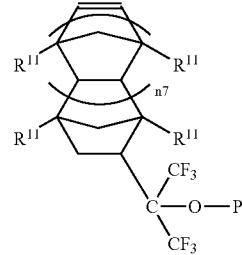

and the like, wherein $R^{11}$, —O—P and n7 are as defined in the formula (m2-3b-3), and concretely there are preferably:

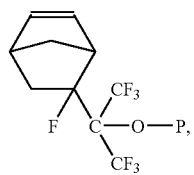 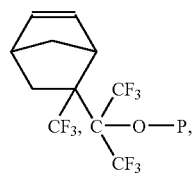

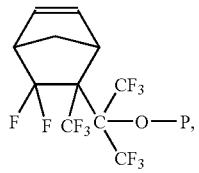 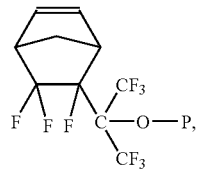

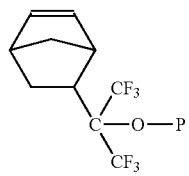

and the like, wherein —O—P is as defined in the formula (m2-3b-3).

Examples of the protective-group-containing norbornene derivative of the formula (m2-3b-4) are, for instance:

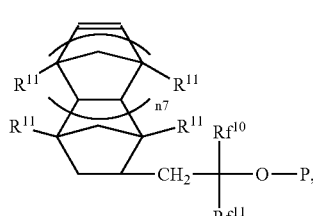

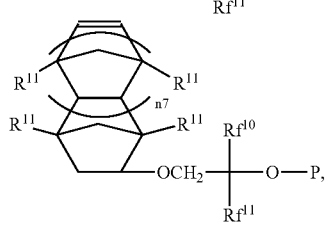

-continued

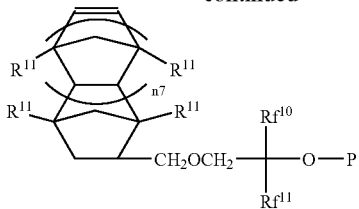

and the like, wherein —O—P, $R^{11}$, $Rf^{10}$, $Rf^{11}$ and n7 are as defined in the formula (m2-3b-3), and concretely there are preferably:

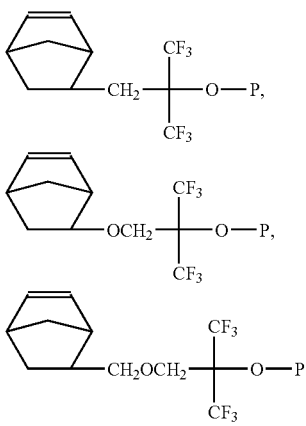

and the like, wherein —O—P is as defined in the formula (m2-3b-3).

The protective-group-containing norbornene derivative of the formula (m2-3b-1) may be a norbornene derivative having a structure in which the moiety of the formula (5) having a protective group forms a part of norbornene ring. Example thereof is a norbornene derivative represented by the formula (m2-3b-5):

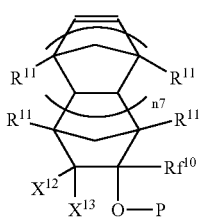 (m2-3b-5)

wherein —O—P is a protective group which can be converted to OH group by dissociation reaction with an acid; $X^{12}$ and $X^{13}$ are the same or different and each is a hydrogen atom or a fluorine atom; $Rf^{10}$ is a fluorine-containing alkyl group having 1 to 5 carbon atoms; each of $R^{11}$ is a hydrogen atom or an alkyl group having 1 to 10 carbon atoms; n7 is 0 or an integer of from 1 to 5.

In the formula (m2-3b-5), examples of $Rf^{10}$ are preferably the same as those exemplified in the above-mentioned formula (5), and particularly preferred is $CF_3$.

Examples of $R^{11}$ are preferably the same as those exemplified in the above-mentioned formula (m2-3b-1).

Examples of the protective-group-containing norbornene derivative of the formula (m2-3b-5) are, for instance:

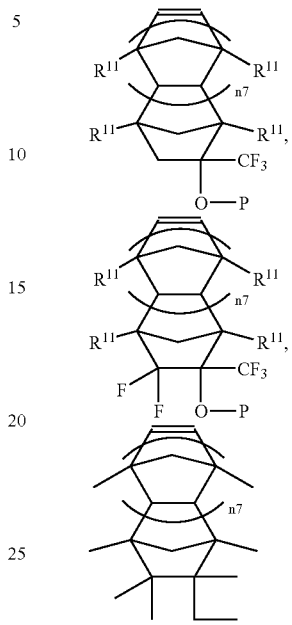

and the like, wherein $R^{11}$, n7 and —O—P are as defined in the formula (m2-3b-5), and concretely there are:

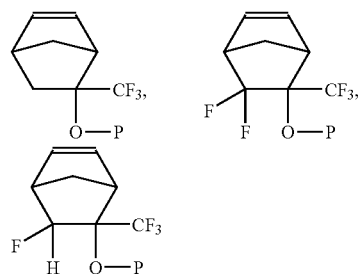

and the like, wherein —O—P is as defined in the formula (m2-3b-5).

The fluorine-containing polymer (a-1) used for the resist composition of the present invention is characterized in that the polymer has a structural unit derived from the norbornene derivative having —O—P group exemplified above, and the moiety (PG group) having —O—P group in the structural unit derived from the norbornene derivative consists of exo-form or comprises not less than 90% by mole of exo-form.

The number average molecular weight of the fluorine-containing polymer (a-1) is from 1,000 to 100,000, preferably from 2,000 to 50,000, more preferably from 2,000 to 10,000, and the weight average molecular weight of the fluorine-containing polymer (a-1) is from 2,000 to 200,000, preferably from 3,000 to 50,000, more preferably from 3,000 to 10,000.

With respect to the proportions of each structural unit of the fluorine-containing polymer of the formula (M-4), provided that (M1)+(M2-6A)+(M2-3B)+(M2) is 100% by mole, a percent by mole ratio of (M1)/((M2-6A)+(M2-3B)+

(M2)) is 30/70 to 70/30, preferably 35/65 to 65/35, more preferably 40/60 to 60/40, further preferably 40/60 to 50/50.

Too large proportion of the structural unit M1 is not preferred because solubility in a developing solution after the dissociation with an acid is lowered, and too small proportion of the structural unit M1 is not preferred because transparency to light having a wavelength of 157 nm is lowered.

Also in the fluorine-containing polymer of the formula (M-4), provided that (M2-6A)+(M2-3B) is 100% by mole, a percent by mole ratio of (M2-6A)/(M2-3B) is preferably 40/60 to 90/10, more preferably 50/50 to 85/15, particularly preferably 60/40 to 85/15, further preferably 65/35 to 80/20. Too large proportion of the structural unit M2-6A is not preferred because an un-exposed portion is dissolved by developing and a thickness of the un-exposed portion is decreased too much. Too large proportion of the structural unit M2-3B is not preferred because resolution becomes insufficient and the pattern becomes T-top in shape.

The fluorine-containing polymer (a-1) having a high exo-percentage which is used for the resist composition of the present invention may be prepared, as mentioned above, by firstly synthesizing the fluorine-containing polymer having OH group which has a high exo-percentage by polymerization using a OH-containing norbornene derivative having a high exo-percentage (an exo-percentage of not less than 90% by mole) and then introducing a protective group (—O—P) through polymer reaction. Also the fluorine-containing polymer having a protective group may be prepared by polymerization using a protective-group-containing norbornene derivative which has a high exo-percentage (an exo-percentage of not less than 90% by mole).

In the preparation of the fluorine-containing polymer (a-1) using a protective-group-containing norbornene derivative which has a high exo-percentage, the polymerization method, polymerization initiator and its amount, polymerization solvent, polymerization temperature, chain transfer agent and its amount and preferred examples thereof are the same as in the preparation process of the fluorine-containing polymer having OH group mentioned supra.

The fluorine-containing polymer (a-1) which is used for the resist composition of the present invention is excellent in transparency at a wavelength of 157 nm, and it is preferable that the polymer has an absorption coefficient at 157 nm of not more than 2.0 $\mu m^{-1}$, preferably not more than 1.5 $\mu m^{-1}$ particularly preferably not more than 1.0 $\mu m^{-1}$, further preferably not more than 0.5 $\mu m^{-1}$. The polymer is preferred since as the absorption coefficient at a wavelength of 157 nm decreases, a good resist pattern can be formed when the polymer is used for a $F_2$ photoresist composition.

In the resist composition of the present invention, the same photoacid generator and solvent as in the preparation step (III) of the resist composition in the above-mentioned method of forming a fine pattern can be preferably used as the photoacid generator (b-1) and the solvent (c-1).

The resist composition of the present invention may contain optional additives other than the components mentioned above, for example, various additives which have been usually used in this field, such as a base, dissolution inhibitor, sensitizer, dye, adhesion betterment material and water storage material as mentioned supra.

A fine pattern having higher resolution can be formed by carrying out:

(IV) the step for forming a resist film of the above-mentioned resist composition on a substrate or on a specific layer on the substrate;

(V) the step for exposing by selectively irradiating given areas of the resist film with energy rays, and (VI) the step for subjecting the exposed resist film to developing treatment and selectively removing the exposed portions of the resist film to form a fine pattern, by using the resist composition of the present invention in the same manner as mentioned supra.

With respect to the methods of the above-mentioned steps (IV), (V) and (VI), conditions therefor, substrate and equipment to be used, those mentioned supra in the method of forming a fine pattern can be used similarly.

In the above-mentioned method of forming a fine pattern, a fine pattern having higher resolution can be formed by using the fluorine-containing polymer (a-1) having a specific stereostructure of the present invention in the resist composition.

Among the fluorine-containing polymers used in the resist composition of the present invention, the following specific fluorine-containing polymers are novel polymers which have not been disclosed in any literatures and patent publications.

Namely, the novel polymers of the present invention are the fluorine-containing polymers having a protective group which have a number average molecular weight of from 1,000 to 100,000 and are represented by the formula (M-5):

-(M1)-(M2)-(M2-4B)-(N)-   (M-5)

wherein the structural unit M1 is a structural unit derived from a fluorine-containing ethylenic monomer (m1) having 2 or 3 carbon atoms and at least one fluorine atom;

the structural unit M2 is a structural unit derived from a norbornene derivative (m2) which may have fluorine atom;

the structural unit M2-4B is a structural unit derived from a protective-group-containing norbornene derivative which is represented by the formula (m2-4b):

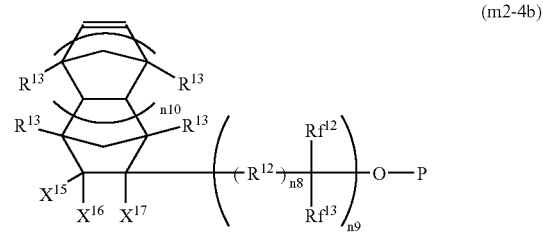

wherein —O—P is a protective group which can be converted to OH group by dissociation reaction with an acid; $X^{17}$ is selected from a hydrogen atom, a fluorine atom or $CF_3$, and provided that n9 is 0, $X^{17}$ is $CF_3$; $X^{15}$ and $X^{16}$ are the same or different and each is a hydrogen atom or a fluorine atom; $R^{12}$ is a divalent organic group selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n8 and n9 are the same or different and each is 0 or 1; $Rf^{12}$ and $Rf^{13}$ are the same or different and each is a fluorine-containing alkyl group having 1 to 5 carbon atoms; each of $R^{13}$ is a hydrogen atom or an alkyl group having 1 to 10 carbon atoms; n10 is 0 or an integer of from 1 to 5, and an exo-percentage of the atomic group contained therein and represented by the formula (8):

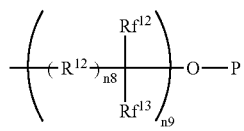

(8)

satisfies (Equation 3):

$$90\% \text{ by mole} \leq \frac{Exo\text{-form}}{(Exo\text{-form} + Endo\text{-form})} \times 100 \leq 100\% \text{ by mole;} \quad \text{(Equation 3)}$$

the structural unit N is a structural unit derived from a monomer (n) copolymerizable with the monomers (m1), (m2) and (m2-4b);

the proportions of the structural units M1, M2, M2-4B and N are from 24 to 70% by mole, from 0 to 69% by mole, from 1 to 70% by mole and from 0 to 20% by mole, respectively, and provided that (M1)+(M2)+(M2-4B) is 100% by mole, a percent by mole ratio of (M1)/((M2)+(M2-4B)) is 30/70 to 70/30.

The polymers of the formula (M-5) is characterized in that essential components are the structural units M1 and M2-4B, and the structural unit M2-4B is a structural unit derived from the norbornene derivative having a specific stereostructure.

In the structural unit M2-4B, a preferred exo-percentage:

$$\frac{Exo\text{-form (mole)}}{(Exo\text{-form} + Endo\text{-form)} \text{ (mole)}} \times 100\% \text{ by mole}$$

of the atomic group of the formula (8) is not less than 95% by mole, more preferably not less than 97% by mole, particularly preferably not less than 99% by mole, and particularly an exo-percentage of substantially 100% by mole is preferred.

The structural unit M2-4B is the structural unit derived from at least one selected from the protective-group-containing norbornene derivatives of the formula (m2-3b-1), concretely (m2-3b-2), (m2-3b-3), (m2-3b-4) and (m2-3b-5) like the fluorine-containing polymers (M-3) (or (M-4)) used for the above-mentioned resist composition, and has the specific stereostructure shown in Equation 3.

Examples of the structural unit M1 are preferably the same as those mentioned in the formula (M-3), and particularly preferred are structural units derived from tetrafluoroethylene and/or chlorotrifluoroethylene.

The structural unit M2 is the structural unit derived from the norbornene derivative and is an optional component. Examples thereof are the same as those exemplified in the above-mentioned fluorine-containing polymer having OH group of the formula (M-1). Particularly preferred is the structural unit derived from the OH-containing norbornene derivative.

Concretely the polymer is a fluorine-containing polymer which has a number average molecular weight of from 1,000 to 100,000 and is represented by the formula (M-6):

-(M1)-(M2-7A)-(M2-4B)-(M2)-(N)- (M-6)

wherein the structural unit M2-7A is a structural unit derived from a OH-containing norbornene derivative represented by the formula (m2-7a):

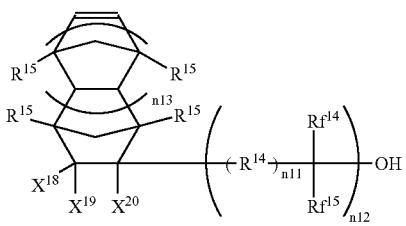

(m2-7a)

wherein $X^{20}$ is selected from a hydrogen atom, a fluorine atom or $CF_3$, and provided that n12 is 0, $X^{20}$ is $CF_3$; $X^{18}$ and $X^{19}$ are the same or different and each is a hydrogen atom or a fluorine atom; $R^{14}$ is a divalent organic group selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n11 and n12 are the same or different and each is 0 or 1; $Rf^{14}$ and $Rf^{15}$ are the same or different and each is a fluorine-containing alkyl group having 1 to 5 carbon atoms; each of $R^{15}$ is a hydrogen atom or an alkyl group having 1 to 10 carbon atoms; n13 is 0 or an integer of from 1 to 5;

the structural units M1, M2-4B, M2 and N are as defined in the formula (M-5);

the proportions of the structural units M1, M2-7A, M2-4B, M2 and N are from 24 to 70% by mole, from 1 to 69% by mole, from 1 to 69% by mole, from 0 to 68% by mole and from 0 to 20% by mole, respectively, and provided that (M1)+(M2-7A)+(M2-4B)+(M2) is 100% by mole, a percent by mole ratio of (M1)/((M2-7A)+(M2-4B)+(M2)) is 30/70 to 70/30.

The structural unit M2-7A in the fluorine-containing polymer (M-6) is preferably a structural unit derived from at least one selected from the OH-containing norbornene derivatives of the formula (m2-2a), concretely (m2-3a), (m2-4a) and (m2-5a) like the fluorine-containing polymer (M-1) having OH group in the above-mentioned method of forming a fine pattern, and also examples thereof are the same as those mentioned supra.

The structural units M1, M2-4B and N are preferably the same as in the formula (M-5).

The number average molecular weight of the fluorine-containing polymers (M-5) and (M-6) is from 1,000 to 100,000, preferably from 2,000 to 50,000, more preferably from 2,000 to 10,000, and the weight average molecular weight thereof is from 2,000 to 200,000, preferably from 3,000 to 50,000, more preferably from 3,000 to 10,000.

With respect to the proportions of each structural unit of the fluorine-containing polymer of the formula (M-6), provided that (M1)+(M2-7A)+(M2-4B)+(M2) is 100% by mole, a percent by mole ratio of (M1)/((M2-7A)+(M2-4B)+(M2)) is 30/70 to 70/30, preferably 35/65 to 65/35, more preferably 40/60 to 60/40, further preferably 40/60 to 50/50.

Too large proportion of the structural unit M1 is not preferred because solubility in a developing solution after the dissociation with an acid is lowered, and too small proportion of the structural unit M1 is not preferred because transparency to light having a wavelength of 157 nm is lowered.

Also in the fluorine-containing polymer of the formula (M-6), provided that (M2-7A)+(M2-4B) is 100% by mole, a percent by mole ratio of (M2-7A)/(M2-4B) is preferably 40/60 to 90/10, more preferably 50/50 to 85/15, particularly preferably 60/40 to 85/15, further preferably 65/35 to 80/20. Too large proportion of the structural unit M2-7A is not preferred because an un-exposed portion is dissolved by developing and a thickness of the un-exposed portion is decreased too much. Too large proportion of the structural unit M2-4B is not preferred because resolution becomes insufficient and the pattern becomes T-top in shape.

The fluorine-containing polymers (formulae (M-5) and (M-6)) having the structural unit of a protective-group-containing norbornene derivative which has a high exo-percentage may be prepared, as mentioned above, by firstly synthesizing the fluorine-containing polymer having OH group which has a high exo-percentage (not less than 90% by mole) by polymerization using a OH-containing norbornene derivative which has a high exo-percentage (not less than 90% by mole) and then introducing the protective group (—O—P) through polymer reaction. Also the fluorine-containing polymer having a protective group may be prepared by polymerization using a protective-group-containing norbornene derivative which has a high exo-percentage (not less than 90% by mole).

In the preparation of the fluorine-containing polymers (formulae (M-5) and (M-6)) using the protective-group-containing norbornene derivative which has a high exo-percentage, the polymerization method, polymerization initiator and its amount, polymerization solvent, polymerization temperature, chain transfer agent and its amount and preferred examples thereof are the same as in the above-mentioned preparation process of the fluorine-containing polymer having OH group.

In studying various fluorine-containing polymers having a structural unit of a OH-containing norbornene derivative which has a moiety represented by the formula (1):

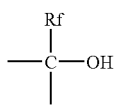

(1)

wherein Rf is a fluorine-containing alkyl group having 1 to 5 carbon atoms, the present inventors directed attention only to the structural unit of a OH-containing norbornene derivative and could obtain the fluorine-containing polymer in which the moiety of the formula (1) bonded to norbornene ring consisted of the exo-form or had a high exo-percentage.

Among the fluorine-containing polymers having a structural unit derived from a OH-containing norbornene derivative, when directing attention only to the moiety of the formula (1) bonded to norbornene ring, the fluorine-containing polymers which have the moiety of the formula (1) having not less than a specific exo-percentage in the exo-endo stereoisomers are also novel substances which have not been disclosed in any literatures and patent publications.

Namely, the present invention also relates to the fluorine-containing polymer which has a number average molecular weight of from 1,000 to 100,000 and is represented by the formula (M-7):

wherein the structural unit M1 is a structural unit derived from a fluorine-containing ethylenic monomer (m1) having 2 or 3 carbon atoms and at least one fluorine atom;

the structural unit M2-8A is a structural unit derived from a OH-containing norbornene derivative represented by the formula (m2-8a):

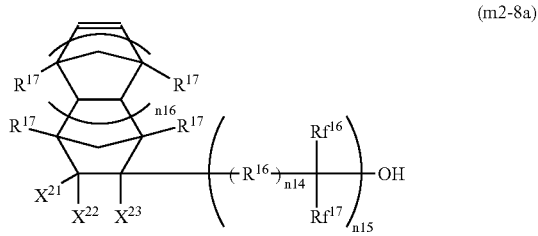

wherein $X^{23}$ is selected from a hydrogen atom, a fluorine atom or $CF_3$, and provided that n15 is 0, $X^{23}$ is $CF_3$; $X^{21}$ and $X^{22}$ are the same or different and each is a hydrogen atom or a fluorine atom; $R^{16}$ is a divalent organic group selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n14 and n15 are the same or different and each is 0 or 1; $Rf^{16}$ and $Rf^{17}$ are the same or different and each is a fluorine-containing alkyl group having 1 to 5 carbon atoms; each of $R^{17}$ is a hydrogen atom or an alkyl group having 1 to 10 carbon atoms; n16 is 0 or an integer of from 1 to 5, and an exo-percentage of the atomic group contained therein and represented by the formula (9):

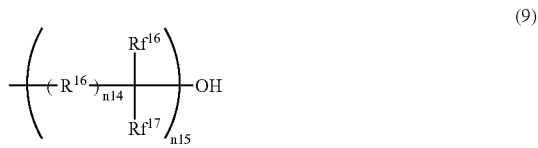

satisfies (Equation 4):

$$90\% \text{ by mole} \leq \frac{\textit{Exo-}\text{form}}{(\textit{Exo-}\text{form} + \textit{Endo-}\text{form})} \times 100 \leq 100\% \text{ by mole;} \quad \text{(Equation 4)}$$

the structural unit M2 is a structural unit derived from a norbornene derivative (m2) which may have fluorine atom;

the structural unit N is a structural unit derived from a monomer copolymerizable with the monomers (m1), (m2-8a) and (m2);

the proportions of the structural units M1, M2, M2-8A and N are from 24 to 70% by mole, from 0 to 69% by mole, from 1 to 70% by mole and from 0 to 20% by mole, respectively, and provided that (M1)+(M2)+(M2-8A) is 100% by mole, a percent by mole ratio of (M1)/((M2)+(M2-8A)) is 30/70 to 70/30.

Also there is the fluorine-containing polymer which has a number average molecular weight of from 1,000 to 100,000 and is represented by the formula (M-8):

-(M1)-(M2-8A)-(M2-5B)-(M2)-(N)-     (M-8)

wherein the structural unit M2-5B is a structural unit derived from a protective-group-containing norbornene derivative represented by the formula (m2-5b):

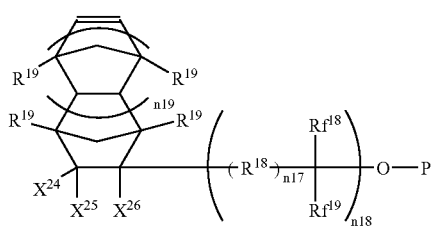

(m2-5b)

wherein $X^{26}$ is selected from a hydrogen atom, a fluorine atom or $CF_3$, and provided that n18 is 0, $X^{26}$ is $CF_3$; $X^{24}$ and $X^{25}$ are the same or different and each is a hydrogen atom or a fluorine atom; $R^{18}$ is a divalent organic group selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n17 and n18 are the same or different and each is 0 or 1; $Rf^{18}$ and $Rf^{19}$ are the same or different and each is a fluorine-containing alkyl group having 1 to 5 carbon atoms; each of $R^{19}$ is a hydrogen atom or an alkyl group having 1 to 10 carbon atoms; n19 is 0 or an integer of from 1 to 5, and an exo-percentage of the atomic group contained therein and represented by the formula (10):

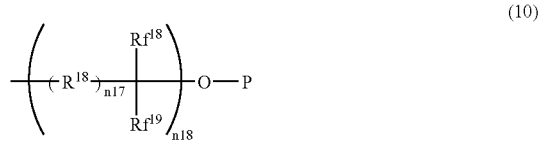

(10)

satisfies (Equation 7):

90% by mole ≤     (Equation 7)

$$\frac{Exo\text{-form}}{(Exo\text{-form} + Endo\text{-form})} \times 100 \leq 100\% \text{ by mole};$$

the structural units M1, M2, M2-8A and N are as defined in the formula (M-7);

the proportions of the structural units M1, M2-8A, M2-5B, M2 and N are from 24 to 70% by mole, from 1 to 69% by mole, from 1 to 69% by mole, from 0 to 68% by mole and from 0 to 20% by mole, respectively, and provided that (M1)+(M2-8A)+(M2-5B)+(M2) is 100% by mole, a percent by mole ratio of (M1)/((M2-8A)+(M2-5B)+(M2)) is 30/70 to 70/30. The polymer of the formula (M-8) is a novel polymer which has not been disclosed in any literatures and patent publications.

The fluorine-containing polymer (M-8) is the fluorine-containing polymer having the structural unit M2-8A which is derived from the OH-containing norbornene derivative and has a high exo-percentage and the structural unit M2-5B which is derived from the protective-group-containing norbornene derivative and has a high exo-percentage.

In the structural unit M2-8A derived from the OH-containing norbornene derivative which constitutes the fluorine-containing polymers (M-7) and (M-8), a preferred exo-percentage:

$$\frac{Exo\text{-form (mole)}}{(Exo\text{-form} + Endo\text{-form)} \text{(mole)}} \times 100\% \text{ by mole}$$

of the atomic group represented by the formula (9) is not less than 95% by mole, more preferably not less than 97% by mole, particularly preferably not less than 99% by mole. Particularly the structural unit having an exo-percentage of substantially 100% by mole is preferred.

Further in the structural unit M2-5B derived from the protective-group-containing norbornene derivative which constitutes the fluorine-containing polymer (M-8), a preferred exo-percentage:

$$\frac{Exo\text{-form (mole)}}{(Exo\text{-form} + Endo\text{-form)} \text{(mole)}} \times 100\% \text{ by mole}$$

of the atomic group represented by the formula (10) is not less than 95% by mole, more preferably not less than 97% by mole, particularly preferably not less than 99% by mole. Particularly the structural unit having an exo-percentage of substantially 100% by mole is preferred.

In the fluorine-containing polymers (M-7) and (M-8) of the present invention, the structural unit M2-8A is preferably a structural unit derived from at least one selected from the group consisting of the OH-containing norbornene derivatives of the formula (2-2a), concretely (2-3a), (2-4a) and (2-5a) like the fluorine-containing polymer (M-1) having OH group in the method of forming a fine pattern. Examples thereof are also the same as those exemplified supra, and the structural unit M2-8A is one having the specific stereostructure represented by the above-mentioned Equation 4.

The structural unit M2-5B is preferably a structural unit derived from at least one selected from the group consisting of the protective-group-containing norbornene derivatives of the formula (m2-3b-1), concretely the formulae (m2-3b-2), (m2-3b-3), (m2-3b-4) and (m2-3b-5) like the fluorine-containing polymer (M-3) (or (M-4)) used in the above-mentioned resist composition, and has the specific stereostructure represented by the above-mentioned Equation 7.

Examples of the structural unit M1 are the same as those exemplified in the above-mentioned formula (M-3), and it is particularly preferable that the structural unit M1 is a structural unit derived from tetrafluoroethylene and/or chlorotrifluoroethylene.

The structural unit M2 is the structural unit derived from a norbornene derivative and is an optional component. Examples of the structural unit M2 are the same as those exemplified in the above-mentioned fluorine-containing polymer having OH group of the formula (M-1).

A number average molecular weight of the fluorine-containing polymers (M-7) and (M-8) is from 1,000 to 100,000, preferably from 2,000 to 50,000, more preferably from 2,000 to 10,000, and a weight average molecular weight thereof is from 2,000 to 200,000, preferably from 3,000 to 50,000, more preferably from 3,000 to 10,000.

With respect to the proportions of each structural unit of the fluorine-containing polymer (M-8), provided that (M1)+(M2-8A)+(M2-5B)+(M2) is 100% by mole, a percent by mole ratio of (M1)/((M2-8A)+(M2-5B)+(M2)) is 30/70 to 70/30, preferably 35/65 to 65/35, more preferably 40/60 to 60/40, particularly preferably 40/60 to 50/50.

Too large proportion of the structural unit M1 is not preferred since solubility in a developing solution after the acid dissociation is lowered, and too small proportion of the structural unit M1 is not preferred since transparency to light of 157 nm is lowered.

Further in the fluorine-containing polymer of the formula (M-8), provided that (M2-8A)+(M2-5B) is 100% by mole, a percent by mole ratio of (M2-8A)/(M2-5B) is preferably 40/60 to 90/10, more preferably 50/50 to 85/15, particularly preferably 60/40 to 85/15, further preferably 65/35 to 80/20. Too large proportion of the structural unit M2-8A is not preferred because an un-exposed portion is dissolved by developing and a thickness of the un-exposed portion is decreased too much. Too large proportion of the structural unit M2-5B is not preferred because resolution becomes insufficient and the pattern easily becomes T-top in shape.

The fluorine-containing polymers of the formulae (M-7) and (M-8) are suitable for an anti-reflection material, particularly for an anti-reflection material for a resist because of excellent solubility in a developing solution in addition to the above-mentioned resist application. Further those polymers are suitable for optical materials by employing excellent transparency and low refractive index thereof, and particularly use for a clad material or a core material of optical fiber and optical disc is preferred since optical materials being excellent in heat resistance can be obtained.

The fluorine-containing polymer (M-7) of the present invention having the structural unit of a OH-containing norbornene derivative which has a high exo-percentage is usually prepared by firstly synthesizing the OH-containing norbornene derivative which has a high exo-percentage (not less than 90% by mole) and then carrying out polymerization using the norbornene derivative.

In the preparation of the fluorine-containing polymer (M-7) using the OH-containing norbornene derivative which has a high exo-percentage, the polymerization method, polymerization initiator and its amount, polymerization solvent, polymerization temperature, chain transfer agent and its amount and its amount and preferable examples thereof are the same as in the preparation process of the fluorine-containing polymer having OH group mentioned supra.

Further in preparing the fluorine-containing polymer (formula (M-8)) having the structural unit of the OH-containing norbornene derivative having a high exo-percentage and the structural unit of the protective-group-containing norbornene derivative having a high exo-percentage, as mentioned above, the protective group (—O—P) may be introduced through polymer reaction using the fluorine-containing polymer which is prepared by the mentioned method and has a structural unit of OH-containing norbornene derivative having a high exo-percentage. Also the fluorine-containing polymer having a protective group may be prepared by polymerization using a OH-containing norbornene derivative having a high exo-percentage (not less than 90% by mole) and a protective-group-containing norbornene derivative having a high exo-percentage (not less than 90% by mole).

In the preparation of the fluorine-containing polymer of the formula (M-8) using a OH-containing norbornene derivative having a high exo-percentage (not less than 90% by mole) and a protective-group-containing norbornene derivative having a high exo-percentage (not less than 90% by mole), the polymerization method, polymerization initiator and its amount, polymerization solvent, polymerization temperature, chain transfer agent and its amount and preferable examples thereof are the same as in the preparation process of the fluorine-containing polymer having OH group mentioned supra.

The present inventors have found that in those fluorine-containing polymers having OH group, solubility in a developing solution can be improved by increasing an exo-percentage in the exo-endo stereoisomers of the moiety having OH group. Therefore those fluorine-containing polymers are useful as a fluorine-containing polymer for a resist.

Namely, the present invention also relates to the resist composition comprising:

(a-2) a fluorine-containing polymer having a structural unit M2-9A derived from a OH-containing norbornene derivative which has a moiety represented by the formula (1):

wherein Rf is a fluorine-containing alkyl group having 1 to 5 carbon atoms and a structural unit M2-6B derived from a norbornene derivative which has a moiety represented by the formula (5):

wherein Rf is a fluorine-containing alkyl group having 1 to 5 carbon atoms; —O—P is a protective group which can be converted to OH group by dissociation reaction with an acid, (b-1) a photoacid generator and (c-1) a solvent, in which the structural unit M2-9A is a structural unit derived from a fluorine-containing norbornene derivative having OH group in which the atomic group having the moiety of the formula (1) is bonded to a carbon atom or carbon atoms of norbornene ring and/or the moiety of the formula (1) forms a part of norbornene ring, wherein an exo-percentage of the atomic group having the moiety of the formula (1) bonded to the carbon atom(s) of norbornene ring and/or the —OH group directly bonded to norbornene ring satisfies (Equation 5).

$$90\% \text{ by mole} \leq \frac{Exo\text{-form}}{(Exo\text{-form} + Endo\text{-form})} \times 100 \leq 100\% \text{ by mole} \quad \text{(Equation 5)}$$

In the structural unit M2-9A derived from the OH-containing norbornene derivative which constitutes the fluorine-containing polymer (a-2), a preferred exo-percentage:

$$\frac{Exo\text{-form (mole)}}{(Exo\text{-form} + Endo\text{-form}) \text{ (mole)}} \times 100\% \text{ by mole}$$

of the atomic group having the moiety of the formula (1) and/or the OH group is not less than 95% by mole, more preferably not less than 97% by mole, particularly preferably not less than 99% by mole. Particularly the structural unit having an exo-percentage of substantially 100% by mole is preferred.

In the fluorine-containing polymer (a-2), further it is preferable that also in the structural unit M2-6B of the protective-group-containing norbornene derivative, the moiety having the —O—P atomic group directly bonded to norbornene ring has a high exo-percentage.

Namely, in the fluorine-containing polymer (a-2), the structural unit M2-6B having a protective group is preferably the structural unit derived from the fluorine-containing norbornene derivative having a protective group in which the atomic group having the moiety of the formula (5) is bonded to a carbon atom or carbon atoms of norbornene ring or the moiety of the formula (5) forms a part of norbornene ring, wherein an exo-percentage of the atomic group having the moiety of the formula (5) bonded to the carbon atoms of norbornene ring and/or the —O—P atomic group directly bonded to norbornene ring satisfies (Equation 6):

$$90\% \text{ by mole} \leq \frac{Exo\text{-form}}{(Exo\text{-form} + Endo\text{-form})} \times 100 \leq 100\% \text{ by mole,} \quad \text{(Equation 6)}$$

thereby making it possible to form a fine pattern having higher resolution at forming the pattern.

In the structural unit M2-6B derived from a protective-group-containing norbornene derivative which constitutes the fluorine-containing polymer (a-2), a preferred exo-percentage:

$$\frac{Exo\text{-form (mole)}}{(Exo\text{-form} + Endo\text{-form}) \text{ (mole)}} \times 100\% \text{ by mole}$$

of the atomic group having the moiety of the formula (5) and/or the —O—P atomic group is not less than 95% by mole, more preferably not less than 97% by mole, particularly preferably not less than 99% by mole. Particularly the structural unit having an exo-percentage of substantially 100% by mole is preferred.

In the resist composition of the present invention, the fluorine-containing polymer (a-2) is preferably a fluorine-containing polymer represented by the formula (M-9):

$$-(M1)-(M2\text{-}9A)-(M2\text{-}6B)-(M2)-(N)- \quad \text{(M-9)}$$

in which the structural unit M1 is a structural unit derived from a fluorine-containing ethylenic monomer (m1) having 2 or 3 carbon atoms and at least one fluorine atom;

the structural unit M2 is a structural unit derived from a norbornene derivative (m2) which may have fluorine atom;

the structural unit M2-9A is a structural unit derived from the OH-containing norbornene derivative (m2-9a) which has the moiety of the formula (1);

the structural unit M2-6B is a structural unit derived from the protective-group-containing norbornene derivative (m2-6b) which has the moiety of the formula (5);

the structural unit N is a structural unit derived from a monomer (n) copolymerizable with the monomers (m1), (m2), (m2-9a) and (m2-6b);

the proportions of the structural units M1, M2-9A, M2-6B, M2 and N are from 24 to 70% by mole, from 1 to 69% by mole, from 1 to 69% by mole, from 0 to 68% by mole and from 0 to 20% by mole, respectively, and provided that (M1)+(M2-9A)+(M2-6B)+(M2) is 100% by mole, a percent by mole ratio of (M1)/((M2-9A)+(M2-6B)+(M2)) is 30/70 to 70/30.

Further preferred is a fluorine-containing polymer represented by the formula (M-10):

$$-(M1)-(M2\text{-}9A)-(M2\text{-}6B)-(M2)-(N)- \quad \text{(M-10)}$$

in which the structural unit M2-9A is a structural unit derived from a OH-containing norbornene derivative represented by the formula (m2-9a-1):

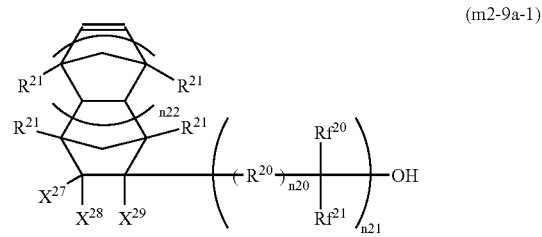

(m2-9a-1)

wherein $X^{29}$ is selected from a hydrogen atom, a fluorine atom or $CF_3$, and provided that n21 is 0, $X^{29}$ is $CF_3$; $X^{27}$ and $X^{28}$ are the same or different and each is a hydrogen atom or a fluorine atom; $R^{20}$ is a divalent organic group selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n20 and n21 are the same or different and each is 0 or 1; $Rf^{20}$ and $Rf^{21}$ are the same or different and each is a fluorine-containing alkyl group having 1 to 5 carbon atoms; each of $R^{21}$ is a hydrogen atom or an alkyl group having 1 to 10 carbon atoms; n22 is 0 or an integer of from 1 to 5, and an exo-percentage of the atomic group contained therein and represented by the formula (11):

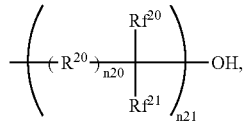
(11)

satisfies (Equation 5-1):

$$90\% \text{ by mole} \leq \frac{\text{Exo-form}}{(\text{Exo-form} + \text{Endo-form})} \times 100 \leq 100\% \text{ by mole;} \quad \text{(Equation 5-1)}$$

the structural unit M2-6B is a structural unit derived from a protective-group-containing norbornene derivative represented by the formula (m2-6b-1):

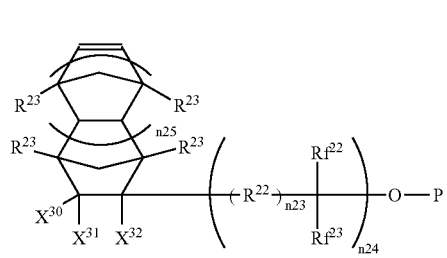
(m2-6b-1)

wherein $X^{32}$ is selected from a hydrogen atom, a fluorine atom or $CF_3$, and provided that n24 is 0, $X^{32}$ is $CF_3$; $X^{30}$ and $X^{31}$ are the same or different and each is a hydrogen atom or a fluorine atom; $R^{22}$ is a divalent organic group selected from divalent hydrocarbon groups which have 1 to 5 carbon atoms and may have ether bond and divalent hydrocarbon groups which have 1 to 5 carbon atoms and may have ether bond in which a part or the whole of hydrogen atoms are substituted with fluorine atoms; n23 and n24 are the same or different and each is 0 or 1; $Rf^{22}$ and $Rf^{23}$ are the same or different and each is a fluorine-containing alkyl group having 1 to 5 carbon atoms; each of $R^{23}$ is a hydrogen atom or an alkyl group having 1 to 10 carbon atoms; n25 is 0 or an integer of from 1 to 5, and an exo-percentage of the atomic group contained therein and represented by the formula (12):

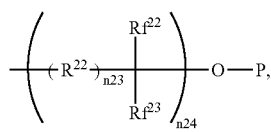
(12)

satisfies (Equation 6-1):

$$90\% \text{ by mole} \leq \frac{\text{Exo-form}}{(\text{Exo-form} + \text{Endo-form})} \times 100 \leq 100\% \text{ by mole;} \quad \text{(Equation 6-1)}$$

the structural units M1, M2 and N are as defined in the formula (M-9);

the proportions of the structural units M1, M2-9A, M2-6B, M2 and N are from 24 to 70% by mole, from 1 to 69% by mole, from 1 to 69% by mole, from 0 to 68% by mole and from 0 to 20% by mole, respectively, and provided that (M1)+(M2-9A)+(M2-6B)+(M2) is 100% by mole, a percent by mole ratio of (M1)/((M2-9A)+(M2-6B)+(M2)) is 30/70 to 70/30.

In the structural unit M2-9A derived from the OH-containing norbornene derivative which constitutes the fluorine-containing polymers (M-9) and (M-10), a preferred exo-percentage:

$$\frac{\text{Exo-form (mole)}}{(\text{Exo-form} + \text{Endo-form}) \text{ (mole)}} \times 100\% \text{ by mole}$$

of the atomic group of the formula (11) is not less than 95% by mole, more preferably not less than 97% by mole, particularly preferably not less than 99% by mole. Particularly the structural unit having an exo-percentage of substantially 100% by mole is preferred.

Further in the structural unit M2-6B derived from the protective-group-containing norbornene derivative which constitutes the fluorine-containing polymer (M-10), a preferred exo-percentage:

$$\frac{\text{Exo-form (mole)}}{(\text{Exo-form} + \text{Endo-form}) \text{ (mole)}} \times 100\% \text{ by mole}$$

of the atomic group of the formula (12) is not less than 95% by mole, more preferably not less than 97% by mole, particularly preferably not less than 99% by mole. Particularly the structural unit having an exo-percentage of substantially 100% by mole is preferred.

In the fluorine-containing polymer (a-2), the structural unit M2-9A is preferably a structural unit derived from at least one selected from the group consisting of the OH-containing norbornene derivatives of the formula (m2-2a), concretely (m2-3a), (m2-4a) and (m2-5a) like the fluorine-containing polymer (M-1) having OH group in the method of forming a fine pattern explained supra. Also examples thereof are the same as those mentioned supra, and the structural unit M2-9A has a specific stereostructure represented by the above-mentioned (Equation 5-1).

The structural unit M2-6B is preferably a structural unit derived from at least one selected from the group consisting of the protective-group-containing norbornene derivatives of the formula (m2-3b-1), concretely the formulae (m2-3b-2), (m2-3b-3), (m2-3b-4) and (m2-3b-5) like the fluorine-containing polymer (M-3) (or (M-4)) used in the above-mentioned resist composition. The structural unit M2-6B has a specific stereostructure represented by the above-mentioned (Equation 6-1).

Examples of the structural unit M1 are the same as those exemplified in the formula (M-3), and particularly preferred are structural units derived from tetrafluoroethylene and/or chlorotrifluoroethylene.

The structural unit M2 is the structural unit derived from a norbornene derivative and is an optional component. Examples of the structural unit M2 are the same as those exemplified in the fluorine-containing polymer having OH group of the formula (M-1) mentioned supra.

The number average molecular weight of the fluorine-containing polymer (a-2) is from 1,000 to 100,000, preferably from 2,000 to 50,000, more preferably from 2,000 to 10,000, and the weight average molecular weight of the fluorine-containing polymer (a-2) is from 2,000 to 200,000, preferably from 3,000 to 50,000, more preferably from 3,000 to 10,000.

With respect to the proportions of each structural unit in the fluorine-containing polymers of the formulae (M-9) and (M-10), provided that (M1)+(M2-9A)+(M2-6B)+(M2) is 100% by mole, a percent by mole ratio of (M1)/((M2-9A)+ (M2-6B)+(M2)) is 30/70 to 70/30, preferably 35/65 to 65/35, more preferably 40/60 to 60/40, further preferably 40/60 to 50/50.

Too large proportion of the structural unit M1 is not preferred since solubility in a developing solution after the acid dissociation is lowered, and too small proportion of the structural unit M1 is not preferred since transparency to light having a wavelength of 157 nm is lowered.

Also in the fluorine-containing polymer (a-2) used in the resist composition of the present invention, provided that (M2-9A)+(M2-6B) is 100% by mole, a percent by mole ratio of (M2-9A)/(M2-6B) is preferably 40/60 to 90/10, more preferably 50/50 to 85/15, particularly preferably 60/40 to 85/15, further preferably 65/35 to 80/20. Too large proportion of the structural unit M2-9A is not preferred because an un-exposed portion is dissolved by developing and a thickness of the un-exposed portion is decreased too much. Too large proportion of the structural unit M2-6B is not preferred because resolution becomes insufficient and the pattern easily becomes T-top in shape.

The fluorine-containing polymer (a-2) used in the resist composition of the present invention is excellent in transparency at a wavelength of 157 nm, and it is preferable that the polymer has an absorption coefficient at 157 nm of not more than 2.0 $\mu m^{-1}$, preferably not more than 1.5 $\mu m^{-1}$, particularly preferably not more than 1.0 $\mu m^{-1}$, further preferably not more than 0.5 $\mu m^{-1}$. The polymer is preferred since as the absorption coefficient at a wavelength of 157 nm decreases, a good resist pattern can be formed when the polymer is used for a $F_2$ photoresist composition.

In the resist composition of the present invention, with respect to the photoacid generator (b-1) and the solvent (c-1), those disclosed supra in the preparation step (III) of the resist composition in the method of forming a fine pattern can be similarly used preferably.

Further the resist composition of the present invention may contain optional additives other than the components mentioned above, for example, various additives which have been usually used in this field, such as a base, dissolution inhibitor, sensitizer, dye, adhesion betterment material and water storage material as mentioned above.

A fine pattern having higher resolution can be formed using the resist composition of the present invention by carrying out:

(IV) the step for forming a resist film of the above-mentioned resist composition on a substrate or on a specific layer on the substrate;

(V) the step for exposing by selectively irradiating given areas of the resist film with energy rays, and (VI) the step for subjecting the exposed resist film to developing treatment and selectively removing the exposed portions of the resist film to form a fine pattern, in the same manner as mentioned supra.

With respect to the methods of the above-mentioned steps (IV), (V) and (VI), conditions therefor, substrate and equipment to be used, those mentioned supra in the method of forming a fine pattern can be used similarly.

In the method of forming a fine pattern, a fine pattern having resolution higher than that of conventional patterns can be formed by using the fluorine-containing polymer (a-2) of the present invention having a specific stereostructure in the resist composition.

The present invention is then explained by means of examples and comparative examples, but is not limited to them.

PREPARATION EXAMPLE 1

(Synthesis of Copolymer Comprising TFE and OH-containing Norbornene Derivative (NB-1))

A 3-liter autoclave equipped with a valve, pressure gauge, stirrer and thermometer was subjected to replacing with nitrogen gas several times and evacuating and was charged with 266 g of fluorine-containing norbornene derivative (NB-1) having OH group:

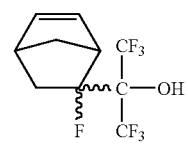

(NB-1)

and 1.51 g of HCFC-141b. Then 350 g of tetrafluoroethylene (TFE) gas was introduced through the valve and 96 g of perfluorohexane solution of 10.0% by weight of heptafluorobutanoyl peroxide: $(CF_3CF_2CF_2COO)_2$ was introduced to initiate reaction with stirring and the inside temperature was maintained at 35° C.

With the advance of the reaction, the inside pressure was decreased, and every time when the inside pressure was decreased from 0.9 MPaG (9.2 kgf/cm$^2$G) before the reaction to 0.85 MPaG (8.7 kgf/cm$^2$G), TFE was additionally introduced to elevate the inside pressure to 0.9 MPaG (9.2 kgf/cm$^2$G). Decreasing of the inside pressure due to the reaction and increasing of the inside pressure by introducing TFE were repeated and the polymerization reaction was continued for 30 hours.

During the polymerization, 48 g of perfluorohexane solution of 10.0% by weight of heptafluorobutanoyl peroxide: $(CF_3CF_2CF_2COO)_2$ was introduced five times every six hours after starting of the reaction.

After completion of the reaction, the un-reacted monomer was released, and the polymerization solution was taken out, followed by concentration and re-precipitation with hexane to separate a copolymer. Until a constant weight was reached, vacuum drying was continued and 150 g of copolymer was obtained.

As a result of $^1$H-NMR and $^{19}$F-NMR analyses, the copolymer was one comprising TFE/the above-mentioned OH-containing norbornene derivative (NB-1) in a percent by mole ratio of 50/50.

According to GPC analysis, a weight average molecular weight of the copolymer was 4,500.

Equipment used for evaluation of physical properties and measuring conditions are as follows.

(1) NMR: Available from BRUKER

Measuring conditions of $^1$H-NMR: 300 MHz (tetramethylsilane=0 ppm)

Measuring conditions of $^{19}$F-NMR: 282 MHz (trichlorofluoromethane=0 ppm)

(2) A weight average molecular weight is calculated from the data measured by gel permeation chromatography (GPC) by using GPC HLC-8020 available from Toso Kabushiki Kaisha and columns available from Shodex (one GPC KF-801, one GPC KF-802 and two GPC KF-806M were connected in series) and flowing tetrahydrofuran (THF) as a solvent at a flowing rate of 1 ml/min.

PREPARATION EXAMPLE 2

(Synthesis of Copolymer Comprising TFE, OH-containing Norbornene Derivative (NB-1) and Norbornene Derivative (NB-2) Having OCH$_2$OCH$_2$CH$_3$ Group)

A reaction was carried out in the same manner as in Preparation Example 1 except that 176 g of (NB-1) and 120 g of norbornene derivative (NB-2) having —OCH$_2$OCH$_2$CH$_3$ group:

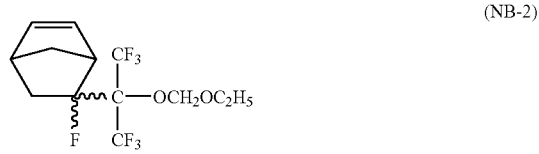

(NB-2)

were used, and 140 g of copolymer was obtained.

As a result of $^1$H-NMR and $^{19}$F-NMR analyses, the copolymer was one comprising TFE/the above-mentioned OH-containing norbornene derivative (NB-1)/the above-mentioned norbornene derivative (NB-2) having OCH$_2$OCH$_2$CH$_3$ group in a percent by mole ratio of 50/33/17.

According to GPC analysis, a weight average molecular weight thereof was 4,000.

EXAMPLE 1

(Introduction of Protective Group Through Polymer Reaction in Acetonitrile Solvent)

Into a 500 ml four-necked glass flask equipped with a stirrer, thermometer and dropping funnel was poured 20 g (53 mmol) of fluorine-containing polymer (A) having OH group prepared in Preparation Example 1. After replacing the inside of a reaction system with nitrogen gas, 200 ml of acetonitrile was added to completely dissolve the fluorine-containing polymer (A) having OH group therein.

Then 2.02 g (21.4 mmol) of chloromethyl ethyl ether was added, and after sufficiently stirring, 4.16 g (32.2 mmol) of diisopropyl ethyl amine was added dropwise over one hour with cooling to 0° C. to 5° C. After completion of the addition, stirring was continued at 25° C. for six hours. During the stirring, production of a solid was not recognized in the reaction system. After completion of the reaction, pure water and HCFC-141b were introduced in the reaction system to terminate the reaction.

After completion of the reaction, the mixture was subjected to extraction using the dropping funnel to remove a layer of HCFC-141b. Then magnesium sulfate was added and after drying, the solvent was distilled off at room temperature under reduced pressure to obtain a solid. The solid was again dissolved in HCFC-141b, followed by re-precipitation in 3-liter n-hexane, and the precipitated solid was separated by filtration. After vacuum drying, 16.6 g of fluorine-containing polymer (B) having a protective group was obtained.

As a result of $^1$H-NMR and $^{19}$F-NMR analyses, the copolymer was one comprising TFE/the above-mentioned OH-containing norbornene derivative (NB-1)/the above-mentioned norbornene derivative having —OCH$_2$OCH$_2$CH$_3$ group in a percent by mole ratio of 50/33/17.

According to GPC analysis, a weight average molecular weight thereof was 5,300.

COMPARATIVE EXAMPLE 1

(Introduction of Protective Group Through Polymer Reaction in THF Solvent)

The fluorine-containing polymer (A) having OH group prepared in Preparation Example 1 was reacted with chloromethyl ethyl ether and diisopropyl ethyl amine in the same manner as in Example 1 except that tetrahydrofuran was used instead of acetonitrile. After adding diisopropyl ethyl amine dropwise and increasing to room temperature, when about one hour had elapsed while stirring, insoluble substance was precipitated from the homogeneous solution in the reaction system. After six-hour stirring, a portion of homogeneous solution and insoluble substance were separated from each other.

A solid was taken out from the portion of homogeneous solution in the same manner as in Example 1 and was subjected to refining. As a result of $^1$H-NMR and $^{19}$F-NMR analyses, the resultant product was a copolymer comprising TFE/the above-mentioned OH-containing norbornene derivative (NB-1)/the above-mentioned norbornene derivative having —OCH$_2$OCH$_2$CH$_3$ group in a percent by mole ratio of 50/45/5. The copolymer was low in a protection ratio (intended ratio was 17% by mole). Also yield was as low as 8 g.

Further the solid obtained by vacuum drying of the insoluble substance was subjected to $^{19}$F-NMR analysis, and it was found that the reaction for protection had been hardly advanced.

COMPARATIVE EXAMPLE 2

(Introduction of Protective Group Through Polymer Reaction in t-butyl Methyl Ether Solvent)

The fluorine-containing polymer (A) having OH group prepared in Preparation Example 1 was reacted with chloromethyl ethyl ether and diisopropyl ethyl amine in the same manner as in Example 1 except that t-butyl methyl ether was used instead of acetonitrile. After adding diisopropyl ethyl amine dropwise and increasing to room temperature, insoluble substance soon came to be precipitated from the homogeneous solution in the reaction system while stirring. After six-hour stirring, a portion of homogeneous solution and insoluble substance were separated from each other.

A reaction solid was taken out from the portion of homogeneous solution in the same manner as in Example 1 and was subjected to refining. As a result of $^1$H-NMR and $^{19}$F-NMR analyses, the resultant product was a copolymer comprising TFE/the above-mentioned OH-containing norbornene derivative (NB-1)/the above-mentioned norbornene derivative having —OCH$_2$OCH$_2$CH$_3$ group in a percent by mole ratio of 50/49.5/0.5 (intended ratio was 17% by mole). The reaction for protection had been hardly advanced. Also yield was as low as 2 g.

Further the solid obtained by vacuum drying of the insoluble substance was subjected to $^{19}$F-NMR analysis, and it was found that the reaction for protection had been hardly advanced.

EXAMPLE 2

(Introduction of Protective Group Through Polymer Reaction in Dimethylformamide Solvent Using NaH as a Base)

Into a 300 ml four-necked flask equipped with a stirrer, thermometer and dropping funnel was poured 3.18 g (79.5 mmol) of 60% sodium hydride, and after washing with n-hexane and allowing to stand, a separated n-hexane layer was removed.

Then 10 ml of dimethylformamide (DMF) was added thereto, followed by cooling with ice.

A solution obtained by mixing 20 g of fluorine-containing polymer (A) having OH group prepared in Preparation Example 1 to 40 ml of DMF was added dropwise with stirring in nitrogen gas stream by using the dropping funnel so that the inside temperature became not more than 10° C., followed by stirring for 30 minutes.

Then 2.3 g (23 mmol) of chloromethyl ethyl ether was added dropwise using the dropping funnel so that the inside temperature became not more than 20° C., and after completion of the addition, stirring was continued at room temperature for four hours.

After completion of the reaction, 50 ml of pure water was added to the reaction mixture and a precipitated solid was separated by filtration. The solid was dissolved in 100 ml of ethyl acetate and washed once with 50 ml of pure water. To the ethyl acetate layer was added 3 ml of acetic acid, followed by washing with 50 ml of pure water until a pH value became not less than 5.

To the washed ethyl acetate layer was added 20 ml of dioxane, and the solvent was distilled off in a hot bath under reduced pressure to obtain a solid. The solid was dissolved in HCFC-141b, followed by re-precipitation in 500 ml of n-hexane. The precipitated solid was separated by filtration, and after vacuum drying, 13.2 g of fluorine-containing polymer (B) having a protective group was obtained.

As a result of $^1$H-NMR and $^{19}$F-NMR analyses, the copolymer was one comprising TFE/the above-mentioned OH-containing norbornene derivative (NB-1)/the above-mentioned norbornene derivative (NB-2) having —OCH$_2$OCH$_2$CH$_3$ group in a percent by mole ratio of 50/27/23. According to GPC analysis, a weight average molecular weight thereof was 4,900.

EXAMPLE 3

(Introduction of Protective Group Through Polymer Reaction in Tetrahydrofuran Solvent Using Triethylamine as a Base)

Into a 2-liter four-necked flask equipped with a stirrer, thermometer and dropping funnel was poured 60 g of fluorine-containing polymer (A) having OH group prepared in Preparation Example 1, and after replacing the inside of a reaction system with N$_2$, 600 ml of tetrahydrofuran (THF) was added to completely dissolve the polymer therein.

Then 12 g (127 mmol) of chloromethyl ethyl ether was added, and 60 g (594 mmol) of triethylamine was added dropwise so that the inside temperature became not more than 20° C., and after completion of the addition, stirring was continued at room temperature for three hours.

After completion of the reaction, 600 ml of pure water was added to the reaction mixture with stirring and a solid was precipitated. Therefore the mixture was allowed to stand and a top solution layer was removed by decantation. Further 600 ml of pure water was added thereto, and the same procedure was repeated once again.

The obtained solid of the lower layer was dissolved in 300 ml of 2-heptanone (MAK) and thereto was added a solution obtained by dissolving 21 g of oxalic acid in 600 ml of pure water for neutralizing (not more than 4 in a pH value) and washing.

The MAK layer was further washed with 600 ml of pure water until a pH value became not less than 5. The washed MAK layer was subjected to concentration under reduced pressure to adjust the concentration of the polymer to be 30 mass %, and the MAK solution of fluorine-containing polymer (B) having a protective group was obtained.

As a result of $^1$H-NMR and $^{19}$F-NMR analyses, the copolymer was one comprising TFE/the above-mentioned OH-containing norbornene derivative (NB-1)/the above-mentioned norbornene derivative (NB-2) having OCH$_2$OCH$_2$CH$_3$ group in a percent by mole ratio of 50/34/16.

According to GPC analysis, a number average molecular weight of the copolymer was 3,800.

EXAMPLE 4

(Introduction of Protective Group Through Polymer Reaction in Tetrahydrofuran Solvent Using Diisopropyl Ethylamine as a Base)

The same procedures as in Example 3 were carried out except that 60 g (465 mmol) of diisopropyl ethylamine was used instead of triethylamine and the stirring after the addition of organic amine was carried out for 16 hours.

As a result of $^1$H-NMR and $^{19}$F-NMR analyses, the copolymer was one comprising TFE/the above-mentioned OH-containing norbornene derivative (NB-1)/the above-mentioned norbornene derivative (NB-2) having OCH$_2$OCH$_2$CH$_3$ group in a percent by mole ratio of 50/34/16.

According to GPC analysis, a number average molecular weight thereof was 3,700.

EXAMPLE 5

(Introduction of Protective Group Through Polymer Reaction in Dioxane Solvent Using NaH as a Base)

Into a 1-liter sufficiently dry four-necked flask equipped with a stirrer, thermometer and dropping funnel was poured 3.18 g (79.5 mmol) of 60% sodium hydride, and after washing with n-hexane and allowing to stand, a separated n-hexane layer was removed.

Then 200 ml of 1,4-dioxane was added, followed by cooling with ice.

A solution obtained by mixing 20 g of fluorine-containing polymer (A) having OH group prepared in Preparation Example 1 to 300 ml of 1,4-dioxane was added dropwise with stirring in nitrogen gas stream by using the dropping funnel so that the inside temperature became not more than 10° C., followed by stirring for 30 minutes.

Then 2.3 g (23 mmol) of chloromethyl ethyl ether was added dropwise using the dropping funnel so that the inside temperature became not more than 20° C., and after completion of the addition, stirring was further continued at room temperature for four hours.

After completion of the reaction, 300 ml of pure water was added to the reaction mixture with stirring and a solid was precipitated. Therefore the mixture was allowed to stand and a top solution layer was removed by decantation. Further 300 ml of pure water was added thereto, and the same procedure was repeated once again.

The obtained solid of the lower layer was dissolved in 100 ml of 2-heptanone (MAK) and thereto was added a solution obtained by dissolving 7 g of oxalic acid in 200 ml of pure water for neutralizing (not more than 4 in a pH value) and washing.

The MAK layer was further washed with 200 ml of pure water until a pH value became not less than 5. The washed MAK layer was subjected to concentration under reduced pressure to adjust the concentration of the polymer to be 30 mass %, and the MAK solution of fluorine-containing polymer (B) having a protective group was obtained.

As a result of $^1$H-NMR and $^{19}$F-NMR analyses, the copolymer was one comprising TFE/the above-mentioned OH-containing norbornene derivative (NB-1)/the above-mentioned norbornene derivative (NB-2) having OCH$_2$OCH$_2$CH$_3$ group in a percent by mole ratio of 50/29/21.

According to GPC analysis, a number average molecular weight thereof was 4,000.

PREPARATION EXAMPLE 3

(Deprotection Reaction of —OCH$_2$OCH$_2$CH$_3$ Group)

Into a 200 ml four-necked flask equipped with a reflux tube, stirrer and thermometer were poured 10 g of fluorine-containing polymer (B) having a protective group obtained in Example 1 and 100 ml of methanol to dissolve the polymer in methanol. Thereto was added 2 ml of 35% concentrated hydrochloric acid, followed by stirring at 25° C. for 48 hours. Then pure water and HCFC-141b were added in the reaction system to terminate the reaction.

After completion of the reaction, extraction was carried out using the dropping funnel to take out the HCFC-141b layer, followed by adding magnesium sulfate, and after drying, the solvent was distilled off at room temperature under reduced pressure to obtain a solid. The solid was then dissolved again in HCFC-141b, followed by re-precipitation in n-hexane, and the precipitated solid was separated by filtration. The solid was then subjected to vacuum drying to obtain 8 g of fluorine-containing polymer.

As a result of $^1$H-NMR and $^{19}$F-NMR analyses, the copolymer was one comprising TFE/the above-mentioned fluorine-containing norbornene derivative (NB-1) having OH group/the above-mentioned fluorine-containing norbornene derivative (NB-2) having OCH$_2$OCH$_2$CH$_3$ group in a percent by mole ratio of 50/50/0.

PREPARATION EXAMPLE 4

(Deprotection Reaction of —OCH$_2$OCH$_2$CH$_3$ Group)

Deprotection reaction and isolation and refining of a polymer were carried out in the same manner as in Preparation Example 3 except that the fluorine-containing polymer having a protective group obtained in Preparation Example 2 was used instead of the fluorine-containing polymer (B) having a protective group obtained in Example 1, and 7 g of fluorine-containing polymer was obtained.

As a result of $^1$H-NMR and $^{19}$F-NMR analyses, the copolymer was one comprising TFE/the above-mentioned fluorine-containing norbornene derivative (NB-1) having OH group/the above-mentioned fluorine-containing norbornene derivative (NB-2) having OCH$_2$OCH$_2$CH$_3$ group in a percent by mole ratio of 50/48/2.

PREPARATION EXAMPLE 5

(Deprotection Reaction of —OCH$_2$OCH$_2$CH$_3$ Group)

Deprotection reaction and isolation and refining of a polymer were carried out in the same manner as in Preparation Example 3 except that the fluorine-containing polymer (B) having a protective group obtained in Example 5 was used instead of the fluorine-containing polymer (B) having a protective group obtained in Example 1, and 8.5 g of fluorine-containing copolymer was obtained.

As a result of $^1$H-NMR and $^{19}$F-NMR analyses, the copolymer was one comprising TFE/the above-mentioned OH-containing norbornene derivative (NB-1) having OH group/the above-mentioned norbornene derivative (NB-2) having OCH$_2$OCH$_2$CH$_3$ group in a percent by mole ratio of 50/50/0.

EXPERIMENTAL EXAMPLES 1 TO 7

(Determination of Solubility in a Developing Solution)

A rate of dissolution in a developing solution was measured in the manner mentioned below by the quartz crystal oscillation method (QCM method) using the fluorine-containing polymers obtained in Preparation Examples 1 to 5 and Examples 1 and 5.

(1) Production of sample: Solutions (concentration of polymer: 1 to 10% by weight) obtained by dissolving the fluorine-containing polymers prepared in Preparation Examples 1 to 4 and Example 1 in PGMEA are applied on a 24 mm diameter quarts crystal oscillation panel coated with gold, and dried at 110° C. for 90 seconds to make a 100 nm thick coating film.

(2) Measurement of rate of dissolution: A coating film thickness is calculated by converting the number of oscillations of the quarts crystal oscillation panel.

The above-mentioned quarts crystal oscillation panel coated with the fluorine-containing polymer is immersed in an aqueous solution of 2.38% by weight of tetramethylammonium hydroxide (TMAH) which is a standard developing solution. A change in a coating film thickness with a lapse of time after the immersing is measured by a change in the number of oscillations and a rate of dissolution (nm/sec) per unit time is calculated (Reference bulletin: Advances in Resist Technology and Proceedings of SPIE Vol. 4690, 904 (2002)). The results are shown in Table 1.

TABLE 1

|  | Fluorine-containing polymer | Rate of dissolution in a developing solution (nm/sec) |
|---|---|---|
| Exp. Ex. 1 (Reference) | Prep. Ex. 1 | 560 |
| Exp. Ex. 2 (Present invention) | Ex. 1 | Insoluble |
| Exp. Ex. 3 (Present invention) | Prep. Ex. 3 | 400 |
| Exp. Ex. 4 (Reference) | Prep. Ex. 2 | Insoluble |
| Exp. Ex. 5 (Comparison) | Prep. Ex. 4 | 160 |
| Exp. Ex. 6 (Reference) | Ex. 5 | Insoluble |
| Exp. Ex. 7 (Present invention) | Prep. Ex. 5 | 405 |
| Exp. Ex. 6 (Reference) | Ex. 5 | Insoluble |
| Exp. Ex. 7 (Present invention) | Prep. Ex. 5 | 405 |

ANALYSIS EXAMPLE 1

(Analysis of Stereostructure of Norbornene (NB-2) Having —OCH$_2$OCH$_2$CH$_3$ Group)

With respect to the norbornene (NB-2) having —OCH$_2$OCH$_2$CH$_3$ group:

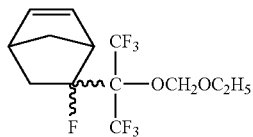
(NB-2)

which was used in Preparation Example 2, a ratio of exo-form to endo-form was calculated by $^{19}$F-NMR analysis and gas chromatography analysis.

First, for determining the exo-endo form of the OH-containing norbornene, a signal of CF$_3$ in the $^{19}$F-NMR analysis using trichlorofluoromethane as internal standard (0 ppm) at 63.6 ppm is assumed to be of exo-form (NB-2-exo), and the signal at 64.3 ppm is assumed to be of endo-form (NB-2-endo). As a result, it was confirmed that the norbornene was one having a high exo-percentage.

Further the above-mentioned NB-2 was subjected to analysis by gas chromatography (under the conditions mentioned below) equipped with a capillary column, and two peaks of the exo-form and endo-form could be separated. The exo/endo ratio obtained from the area ratio of those two peaks was 70/30% by mole.

Analyzing Conditions of Gas Chromatography:
Equipment: SHIMADZU GC17A
Column: Capillary column DB-WAX (inner diameter: 0.32 mm, length: 30 m) available from Scientific Instrument Services, Inc.
Analyzing conditions: Detector; FID, Injection temperature; 250° C., Detector temperature; 250° C., Flow rate of carrier gas; 1.0 ml/min, Split ratio; 30:1, Column temperature conditions; Measurement is carried out by elevating the temperature from 100° C. to 250° C. at a heating rate of 10° C./min.

ANALYSIS EXAMPLE 2

(Analysis of Stereostructure of OH-containing Norbornene Derivative (NB-1))

The OH-containing norbornene derivative (NB-1):

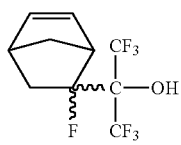
(NB-1)

which was used in Preparation Examples 1 and 2 was subjected to analysis by gas chromatography in the same manner as in the above-mentioned Analysis Example 1, and two peaks of an area ratio of 70:30 corresponding to the above-mentioned exo-endo ratio of the norbornene derivative (NB-2) having —OCH$_2$OCH$_2$CH$_3$ group were obtained.

Therefore the exo-endo ratio of the OH-containing norbornene derivative (NB-1) was determined to be 70:30 in % by mole ratio.

PREPARATION EXAMPLE 6

(Isolation of Exo-form (NB-1-exo) of OH-containing Norbornene Derivative by Distillation)

Into a 1-liter egg-plant flask equipped with a rectifier, thermometer and receiver was poured 600 g of OH-containing norbornene derivative (NB-1) (exo-endo ratio of 70:30 in % by mole) used in Preparation Example 1, followed by distilling under reduced pressure of 46 mmHg. The distilled component was divided by about 20 ml. A part of the distilled component of 90° to 92° C. at 46 mmHg was taken out and subjected to gas chromatography analysis in the same manner as in Analysis Example 1 and was found to be a OH-containing norbornene of exo-form having a purity of not less than 99%. The distillate was collected and 107 g of OH-containing norbornene (NB-1-exo) of exo-form:

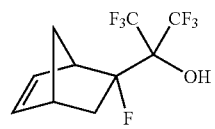

having a purity of not less than 99% was obtained.

PREPARATION EXAMPLE 7

(Synthesis of Norbornene Derivative (NB-2-exo) Having —OCH$_2$OCH$_2$CH$_3$ Group of Exo-form)

Into a 300 ml four-necked flask equipped with a stirrer, thermometer and dropping funnel was poured 4.4 g of 60% sodium hydride, followed by washing with n-hexane and allowing to stand. Then n-hexane layer separated by allowing to stand was removed. After that, 100 ml of THF was added, followed by cooling with ice.

Thereto was added dropwise 27 g of the OH-containing norbornene (NB-1-exo) of exo-form obtained in Preparation Example 6 through the dropping funnel with stirring in nitrogen gas stream so that the inside temperature became not more than 10° C., and the stirring was continued for one hour.

Then 10 g of chloromethyl ethyl ether was added thereto dropwise through the dropping funnel so that the inside temperature became not more than 20° C., and after the addition, the stirring was continued for four hours at room temperature. After completion of the reaction, 50 ml of 1N hydrochloric acid and 50 ml of ether were added to the reaction system to terminate the reaction.

The reaction mixture was poured into the dropping funnel to separate an organic layer, and then the organic layer was washed once with 1N hydrochloric acid and twice with saturated brine. After drying with magnesium sulfate, the organic layer was concentrated and distilled with an evaporator to obtain 29 g of norbornene derivative (NB-2-exo) having —OCH$_2$OCH$_2$CH$_3$ group of exo-form:

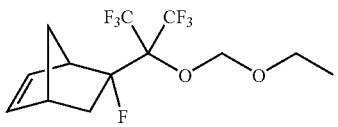

having a purity of not less than 99%. The boiling point thereof was 76° to 79° C. at 2 mmHg.

EXAMPLE 6

(Synthesis of Copolymer Comprising TFE, OH-containing Norbornene Derivative (NB-1) and Norbornene Derivative (NB-2-exo) Having —OCH$_2$OCH$_2$CH$_3$ Group of Exo-form)

After the inside of a 500 ml autoclave equipped with a valve, pressure gauge, stirrer and thermometer was replaced with nitrogen gas several times and was evacuated, the autoclave was charged with 27 g of the same OH-containing norbornene derivative (NB-1) (exo-endo ratio of 70:30 in % by mole) as in Preparation Example 2, 15.5 g of norbornene derivative (NB-2-exo) having —OCH$_2$OCH$_2$CH$_3$ group of exo-form obtained in Preparation Example 7 and 250 ml of HCFC-141b.

Then 52 g of tetrafluoroethylene (TFE) gas was introduced through the valve and 17 g of perfluorohexane solution of 10.0% by weight of heptafluorobutanoyl peroxide (CF$_3$CF$_2$CF$_2$COO)$_2$ was introduced to initiate a reaction with stirring. The inside temperature was maintained at 30° C.

With the advance of the reaction, the inside pressure decreased, and every time when the inside pressure decreased from 0.9 MPaG (9.2 kgf/cm$^2$G) before the reaction to 0.85 MPaG (8.7 kgf/cm$^2$G), TFE was introduced additionally to increase the inside pressure to 0.9 MPaG (9.2 kgf/cm$^2$G). Thus decreasing of the inside pressure due to the reaction and increasing thereof by introducing TFE were repeated and the polymerization reaction was continued for 30 hours.

During the polymerization, 8.5 g of perfluorohexane solution of 10.0% by weight of heptafluorobutanoyl peroxide (CF$_3$CF$_2$CF$_2$COO)$_2$ was introduced five times in total every six hours after the initiation of the reaction.

After completion of the reaction, the un-reacted monomer was released and the polymerization solution was taken out, followed by concentrating and then re-precipitating with hexane to separate a copolymer. Until a constant weight was reached, vacuum drying was continued to obtain 22 g of copolymer.

As a result of $^1$H-NMR and $^{19}$F-NMR analyses, the copolymer was one comprising TFE/OH-containing norbornene derivative (NB-1)/norbornene derivative (NB-2-exo) having OCH$_2$OCH$_2$CH$_3$ group in a percent by mole ratio of 50/33/17.

According to GPC analysis, a weight average molecular weight thereof was 4,100.

EXAMPLE 7

(Synthesis of Copolymer Comprising TFE, OH-containing Norbornene Derivative (NB-1) and Norbornene Derivative (NB-2-1) Having OCH$_2$OCH$_2$CH$_3$ Group of Exo-form)

A hundred grams of norbornene derivative (NB-2-1) having —OCH$_2$OCH$_2$CH$_3$ group having an exo-endo ratio of 80:20 in % by mole was prepared by mixing 66.7 g of norbornene derivative (NB-2) having —OCH$_2$OCH$_2$CH$_3$ group (exo-endo ratio of 70:30 in % by mole) used in Analysis Example 1 to 33.3 g of norbornene derivative (NB-2-exo) having —OCH$_2$OCH$_2$CH$_3$ group of exo-form obtained in Preparation Example 7.

The polymerization reaction and isolation and refining of the polymer were carried out in the same manner as in Example 6 except that 15.5 g of the above-mentioned norbornene derivative (NB-2-1) having —OCH$_2$OCH$_2$CH$_3$ group having an exo-endo ratio of 80:20 in % by mole was used instead of the norbornene derivative (NB-2-exo) having —OCH$_2$OCH$_2$CH$_3$ group of exo-form obtained in Preparation Example 7, and 21 g of copolymer was obtained.

As a result of $^1$H-NMR and $^{19}$F-NMR analyses, the copolymer was one comprising TFE/OH-containing norbornene derivative (NB-1)/norbornene derivative (NB-2-1) having OCH$_2$OCH$_2$CH$_3$ group in a percent by mole ratio of 50/34/16.

According to GPC analysis, a weight average molecular weight thereof was 3,900.

EXAMPLE 8

(Synthesis of Copolymer Comprising TFE, OH-containing Norbornene Derivative (NB-1) and Norbornene Derivative (NB-2-2) Having OCH$_2$OCH$_2$CH$_3$ Group of Exo-form)

A hundred grams of norbornene derivative (NB-2-2) having —OCH$_2$OCH$_2$CH$_3$ group having an exo-endo ratio of 90:10 in % by mole was prepared by mixing 33.3 g of norbornene derivative (NB-2) having —OCH$_2$OCH$_2$CH$_3$ group (exo-endo ratio of 70:30 in % by mole) used in Analysis Example 1 to 66.7 g of norbornene derivative (NB-2-exo) having —OCH$_2$OCH$_2$CH$_3$ group of exo-form obtained in Preparation Example 7.

The polymerization reaction and isolation and refining of the polymer were carried out in the same manner as in Example 6 except that 15.5 g of the above-mentioned norbornene derivative (NB-2-2) having —OCH$_2$OCH$_2$CH$_3$ group having an exo-endo ratio of 90:10 in % by mole was used instead of the norbornene derivative (NB-2-exo) having —OCH$_2$OCH$_2$CH$_3$ group of exo-form obtained in Preparation Example 7, and 21 g of copolymer was obtained.

As a result of $^1$H-NMR and $^{19}$F-NMR analyses, the copolymer was one comprising TFE/OH-containing norbornene derivative (NB-1)/norbornene derivative (NB-2-2) having OCH$_2$OCH$_2$CH$_3$ group in a percent by mole ratio of 50/34/16.

According to GPC analysis, a weight average molecular weight thereof was 4,000.

ANALYSIS EXAMPLES 3 TO 8

(Calculation of Exo-endo Ratio of Protective Group in Norbornene Structural Unit Having Protective Group)

The fluorine-containing polymers obtained in Examples 1 and 5 to 8 and Preparation Example 2 were dissolved separately in deutride-substituted acetone, and by $^{19}$F-NMR analysis using trichlorofluoromethane as internal standard (0 ppm), exo-endo ratios of the structural units derived from the norbornene derivatives having —OCH$_2$OCH$_2$CH$_3$ group of the respective polymers were calculated.

For determining the exo-endo form of the norbornene structural unit having —OCH$_2$OCH$_2$CH$_3$ group, a signal of $CF_3$ at −56 to −60 ppm is assumed to be of exo-form (NB-2-exo), and the signal at −60 to −64 ppm is assumed to be of endo-form (NB-2-endo). The results of the analyses are shown in Table 2.

TABLE 2

| | Fluorine-containing polymer | Exo-endo ratio of protective group in norbornene structural unit having a protective group (% by mole) |
|---|---|---|
| Analysis Ex. 3 | Prep. Ex. 2 (Comp. Ref. Ex.) | 86.4/13.6 |
| Analysis Ex. 4 | Ex. 1 (Protection by polymer reaction) | 100/0 |
| Analysis Ex. 5 | Ex. 5 (Protection by polymer reaction) | 100/0 |
| Analysis Ex. 6 | Ex. 6 (Polymerization of NB-2 of exo-form) | 100/0 |
| Analysis Ex. 7 | Ex. 7 (Polymerization of NB-2 of exo-form) | 91.0/9.0 |
| Analysis Ex. 8 | Ex. 8 (Polymerization of NB-2 of exo-form) | 95.5/4.5 |

PREPARATION EXAMPLE 8

(Deprotection Reaction of —$OCH_2OCH_2CH_3$ Group)

Deprotection reaction and isolation and refining of polymer were carried out in the same manner as in Preparation Example 3 except that the fluorine-containing polymer having a protective group obtained in Example 6 was used instead of the fluorine-containing polymer (B) having a protective group obtained in Example 1, and 7.1 g of fluorine-containing polymer was obtained.

As a result of $^1$H-NMR and $^{19}$F-NMR analyses, the copolymer was one comprising TFE/fluorine-containing norbornene derivative having OH group/fluorine-containing norbornene derivative having $OCH_2OCH_2CH_3$ group in a percent by mole ratio of 50/50/0.

PREPARATION EXAMPLE 9

(Deprotection Reaction of —$OCH_2OCH_2CH_3$ Group)

Deprotection reaction and isolation and refining of polymer were carried out in the same manner as in Preparation Example 3 except that the fluorine-containing polymer having a protective group obtained in Example 7 was used instead of the fluorine-containing polymer (B) having a protective group obtained in Example 1, and 7.2 g of fluorine-containing polymer was obtained.

As a result of $^1$H-NMR and $^{19}$F-NMR analyses, the copolymer was one comprising TFE/OH-containing norbornene derivative/norbornene derivative having $OCH_2OCH_2CH_3$ group in a percent by mole ratio of 50/48.8/1.2.

PREPARATION EXAMPLE 10

(Deprotection Reaction of —$OCH_2OCH_2CH_3$ Group)

Deprotection reaction and isolation and refining of polymer were carried out in the same manner as in Preparation Example 3 except that the fluorine-containing polymer having a protective group obtained in Example 8 was used instead of the fluorine-containing polymer (B) having a protective group obtained in Example 1, and 6.9 g of fluorine-containing polymer was obtained.

As a result of $^1$H-NMR and $^{19}$F-NMR analyses, the copolymer was one comprising TFE/OH-containing norbornene derivative/norbornene derivative having $OCH_2OCH_2CH_3$ group in a percent by mole ratio of 50/49.2/0.8.

EXPERIMENTAL EXAMPLES 8 TO 13

(Determination of Solubility in Developing Solution)

A rate of dissolution in a developing solution was measured by the quartz crystal oscillation method (QCM method) in the same manner as in Experimental Example 1 except that the fluorine-containing polymers obtained in Examples 6 to 8 and Preparation Examples 8 to 10, respectively were used. The results are shown in Table 3. In Table 3, the data of Experimental Examples 1, 5 and 7 are also referred to for reference.

TABLE 3

| | Fluorine-containing polymer before deprotection reaction | Fluorine-containing polymer after deprotection reaction | Rate of dissolution in a developing solution after deprotection reaction (nm/sec) |
|---|---|---|---|
| Exp. Ex. 8 | Ex. 6 (present invention) | — | Insoluble |
| Exp. Ex. 9 | Ex. 6 | Prep. Ex. 8 | 440 |
| Exp. Ex. 10 | Ex. 7 (present invention) | — | Insoluble |
| Exp. Ex. 11 | Ex. 7 | Prep. Ex. 9 | 284 |
| Exp. Ex. 12 | Ex. 8 (present invention) | — | Insoluble |
| Exp. Ex. 13 | Ex. 8 | Prep. Ex. 10 | 365 |
| Exp. Ex. 7 | Ex. 5 | Prep. Ex. 5 | 405 |
| Exp. Ex. 5 | Prep. Ex. 2 (comparison) | Prep. Ex. 4 | 160 |
| Exp. Ex. 1 | Prep. Ex. 1 (reference) | — | 560 |

ANALYSIS EXAMPLES 9 TO 11

With respect to the fluorine-containing polymers of Preparation Examples 4, 9 and 10 after the deprotection reaction, exo/endo ratios of the structural units derived from the norbornene derivatives having —$OCH_2OCH_2CH_3$ group which remained in the polymers were calculated in the same manner as in Analysis Example 3. The results are shown in Table 4.

TABLE 4

| Fluorine-containing polymer before deprotection reaction | Proportions of TFE/NB-1/NB-2 of fluorine-containing polymer after deprotection reaction (% by mole) | | Exo-endo ratio of protective group after deprotection reaction (% by mole) | |
|---|---|---|---|---|
| Prep. Ex. 2 | Prep. Ex. 4 | 50/48/2 | Analysis Ex. 9 | 0/100 |
| Ex. 5 | Prep. Ex. 5 | 50/50/0 | — | — |
| Ex. 6 | Prep. Ex. 8 | 50/50/0 | — | — |
| Ex. 7 | Prep. Ex. 9 | 50/48.8/1.2 | Analysis Ex. 10 | 0/100 |
| Ex. 8 | Prep. Ex. 10 | 50/49.2/0.8 | Analysis Ex. 11 | 0/100 |

EXAMPLE 9

(Synthesis of Copolymer Comprising TFE and OH-containing Norbornene (NB-1-exo) of Exo-form)

After the inside of a 500 ml autoclave equipped with a valve, pressure gauge, stirrer and thermometer was replaced with nitrogen gas several times and was evacuated, the autoclave was charged with 40 g of fluorine-containing norbornene (NB-1-exo) having OH group prepared in Preparation Example 6 and 250 ml of HCFC-141b. Then 52 g of tetrafluoroethylene (TFE) gas was introduced through the valve and 17 g of perfluorohexane solution of 10.0% by weight of heptafluorobutanoyl peroxide $(CF_3CF_2CF_2COO)_2$ was introduced to initiate a reaction with stirring. The inside temperature was maintained at 30° C.

With the advance of the reaction, the inside pressure decreased, and every time when the inside pressure decreased from 0.9 MPaG (9.2 kgf/cm$^2$G) before the reaction to 0.85 MPaG (8.7 kgf/cm$^2$G), TFE was introduced additionally to increase to 0.9 MPaG (9.2 kgf/cm$^2$G). Thus decreasing of the inside pressure due to the reaction and increasing thereof by introducing TFE were repeated and the polymerization reaction was continued for 30 hours.

During the polymerization, 8.5 g of perfluorohexane solution of 10.0% by weight of heptafluorobutanoyl peroxide $(CF_3CF_2CF_2COO)_2$ was introduced five times in total every six hours after the initiation of the reaction.

After completion of the reaction, the un-reacted monomer was released and the polymerization solution was taken out, followed by concentrating and then re-precipitating with hexane to separate a copolymer. Until a constant weight was reached, vacuum drying was continued to obtain 26 g of copolymer.

As a result of $^1$H-NMR and $^{19}$F-NMR analyses, the copolymer was one comprising TFE/OH-containing norbornene derivative (NB-1-exo) of exo-form in a percent by mole ratio of 50/50.

According to GPC analysis, a weight average molecular weight thereof was 4,600.

EXAMPLE 10

(Introduction of Protective Group Through Polymer Reaction)

Introduction of a protective group ($-OCH_2OCH_2CH_3$ group) through polymer reaction and isolation and refining of copolymer were carried out in the same manner as in Example 3 except that the copolymer of TFE/OH-containing norbornene (NB-1-exo) of exo-form prepared in Example 9 was used instead of the fluorine-containing polymer (A) having OH group prepared in Preparation Example 1.

As a result of $^1$H-NMR and $^{19}$F-NMR analyses, the copolymer was one comprising TFE/OH-containing norbornene derivative (NB-1-exo) of exo-form/norbornene having $-OCH_2OCH_2CH_3$ group in a percent by mole ratio of 50/33/17.

According to GPC analysis, a weight average molecular weight thereof was 4,700.

EXAMPLE 11

(Synthesis of Copolymer Comprising TFE, OH-containing Norbornene (NB-1-exo) of Exo-form and Norbornene Derivative (NB-2-exo) Having $OCH_2OCH_2CH_3$ Group of Exo-form)

Polymerization reaction and isolation and refining of polymer were carried out in the same manner as in Example 9 except that 27 g of OH-containing norbornene (NB-1-exo) of exo-form prepared in Preparation Example 6 and 15.5 g of norbornene derivative (NB-2-exo) having $-OCH_2OCH_2CH_3$ group of exo-form prepared in Preparation Example 7 were used instead of a single use of 40 g of OH-containing norbornene (NB-1-exo) prepared in Preparation Example 6, and 20 g of copolymer was obtained.

As a result of $^1$H-NMR and $^{19}$F-NMR analyses, the copolymer was one comprising TFE/OH-containing norbornene derivative (NB-1-exo)/norbornene derivative (NB-2-exo) having $OCH_2OCH_2CH_3$ group in a percent by mole ratio of 50/33/17.

According to GPC analysis, a weight average molecular weight thereof was 4,100.

ANALYSIS EXAMPLES 12 AND 13

(Calculation of Exo-endo Ratio of Protective Group in Norbornene Structural Unit Having Protective Group)

Exo/endo ratios of the structural units derived from the norbornenes having $-OCH_2OCH_2CH_3$ group in the fluorine-containing polymers of Examples 10 and 11 were calculated in the same manner as in Analysis Example 3. The results are shown in Table 5.

ANALYSIS EXAMPLE 14

(Measurement of Stereostructure of $-C(CF_3)_2OH$ Group in Structural Unit Derived from (NB-1) in Copolymer of TFE/OH-containing Norbornene (NB-1))

The stereostructure of $-C(CF_3)_2OH$ group in the structural unit derived from OH-containing norbornene in the copolymer of TFE/OH-containing norbornene (NB-1) obtained in Preparation Example 1 was determined as mentioned below.

According to Analysis Example 2, the exo/endo ratio of the OH-containing norbornene (NB-1) as a starting material was 70/30 in % by mole.

The polymerization solution (reaction mixture) of Preparation Example 1 after terminating the polymerization reaction and then releasing the un-reacted gas monomer (TFE) was directly subjected to gas chromatography analysis in the same manner as in Analysis Example 1, and it was found that the exo/endo ratio of the remaining un-reacted OH-containing norbornene (NB-1) was 70/30 in % by mole.

Therefore it was assumed that the exo/endo ratio of the $-C(CF_3)_2OH$ group in the structural unit derived from (NB-1) of the copolymer of TFE/OH-containing norbornene (NB-1) which was contained in the polymerization solution after the polymerization reaction in Preparation Example 1 was 70/30 in % by mole.

TABLE 5

| Fluorine-containing polymer | Exo/endo ratio of moiety having OH group (% by mole) | | Exo/endo ratio of protective group (% by mole) | |
|---|---|---|---|---|
| Prep. Ex. 1 (Ref. Ex.) | Analysis Ex. 14 | 70/30 | — | |
| Ex. 9 | 100/0 | | — | |
| Ex. 10 | 100/0 | | Analysis Ex. 12 | 100/0 |
| Ex. 11 | 100/0 | | Analysis Ex. 13 | 100/0 |

PREPARATION EXAMPLE 11

(Deprotection Reaction of —OCH$_2$OCH$_2$CH$_3$ Group)

Deprotection reaction and isolation and refining of polymer were carried out in the same manner as in Preparation Example 3 except that the fluorine-containing polymer having a protective group obtained in Example 10 was used instead of the fluorine-containing polymer (B) having a protective group obtained in Example 1, and 6.8 g of fluorine-containing polymer was obtained.

As a result of $^1$H-NMR and $^{19}$F-NMR analyses, the copolymer was one comprising TFE/OH-containing norbornene derivative/norbornene derivative having OCH$_2$OCH$_2$CH$_3$ group in a percent by mole ratio of 50/50/0.

PREPARATION EXAMPLE 12

(Deprotection Reaction of —OCH$_2$OCH$_2$CH$_3$ Group)

Deprotection reaction and isolation and refining of polymer were carried out in the same manner as in Preparation Example 3 except that the fluorine-containing polymer having a protective group obtained in Example 11 was used instead of the fluorine-containing polymer (B) having a protective group obtained in Example 1, and 6.9 g of fluorine-containing polymer was obtained.

As a result of $^1$H-NMR and $^{19}$F-NMR analyses, the copolymer was one comprising TFE/OH-containing norbornene derivative/norbornene derivative having OCH$_2$OCH$_2$CH$_3$ group in a percent by mole ratio of 50/50/0.

EXPERIMENTAL EXAMPLES 14 TO 18

(Determination of Solubility in a Developing Solution)

With respect to the fluorine-containing polymers obtained in Examples 9 to 11 and Preparation Examples 11 and 12, rates of dissolution thereof in a developing solution were measured by the quartz crystal oscillation method (QCM method) in the same manner as in Experimental Example 1. The results are shown in Table 6.

TABLE 6

| | Fluorine-containing polymer before deprotection reaction | Fluorine-containing polymer after deprotection reaction | Rate of dissolution in a developing solution after deprotection reaction (nm/sec) |
|---|---|---|---|
| Exp. Ex. 14 | Ex. 9 (present invention) | — | 680 |
| Exp. Ex. 15 | Ex. 10 (present invention) | — | Insoluble |
| Exp. Ex. 16 | Ex. 10 | Prep. Ex. 11 | 510 |
| Exp. Ex. 17 | Ex. 11 (present invention) | — | Insoluble |
| Exp. Ex. 18 | Ex. 11 | Prep. Ex. 12 | 545 |
| Exp. Ex. 1 | Prep. Ex. 1 (reference) | — | 560 |

According to the method of forming a fine pattern of the present invention, a resist pattern having high resolution can be formed at forming a fine pattern by using the fluorine-containing polymer having a protective group which is obtained by introducing a protective group being capable of acting for a positive resist to a specific fluorine-containing polymer having OH group by a specific method.

Also according to the process for preparing the polymer of the present invention, the fluorine-containing polymer having a protective group can be prepared efficiently.

Further the dissociation reaction (deprotection reaction) of the protective group advances rapidly, the developing can be achieved at high rate and high resolution can be obtained when the resist composition comprising the fluorine-containing polymer having the structural unit derived from the protective-group-containing norbornene derivative and having a high exo-percentage is used.

What is claimed is:

1. A process for preparing a fluorine-containing polymer (B1) having a protective group by using a fluorine-containing polymer (A1) having OH group which has a moiety represented by the formula (1):

wherein Rf is a fluorine-containing alkyl group having 1 to 5 carbon atoms, and converting the moiety of the formula (1) to a moiety represented by the formula (2):

wherein Rf is as defined in said formula (1), R is a hydrocarbon group having 1 to 30 carbon atoms, in which a part or the whole of hydrogen atoms may be substituted with fluorine atoms, said process for preparing the fluorine-containing polymer (B1) having the moiety of the formula (2) is characterized in that at least one base selected from ammonia and organic amines and a compound of the formula (3):

X—CH$_2$OR (3)

wherein X is Cl, Br or I; R is as defined in the formula (2), are reacted with the fluorine-containing polymer (A1) having OH group in a solvent which can uniformly dissolve a mixture of the fluorine-containing polymer (A1) having OH group and ammonia or organic amines.

2. The process for preparing the fluorine-containing polymer (B1) having a protective group of claim 1, wherein the solvent which can uniformly dissolve the mixture of the fluorine-containing polymer (A1) having OH group and ammonia or organic amines is at least one selected from nitrile solvents.

3. The process for preparing the fluorine-containing polymer (B1) having a protective group of claim 1, wherein the solvent which can uniformly dissolve the mixture of the fluorine-containing polymer (A1) having OH group and ammonia or organic amines is at least one selected from ketone solvents.

4. The process for preparing the fluorine-containing polymer (B1) having a protective group of claim 1, wherein the base is at least one selected from tertiary amines.

5. The process for preparing the fluorine-containing polymer (B1) having a protective group of claim 2, wherein the base is at least one selected from tertiary amines.

6. The process for preparing the fluorine-containing polymer (B1) having a protective group of claim 3, wherein the base is at least one selected from tertiary amines.

7. The process for preparing the fluorine-containing polymer (B1) having a protective group of claim 4, wherein the tertiary amines are represented by the formula (4):

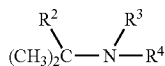
(4)

wherein $R^2$ is H or $CH_3$; $R^3$ and $R^4$ are the same or different and each is a hydrocarbon group having 1 to 6 carbon atoms.

8. The process for preparing the fluorine-containing polymer (B1) having a protective group of claim 5, wherein the tertiary amines are represented by the formula (4):

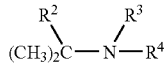
(4)

wherein $R^2$ is H or $CH_3$; $R^3$ and $R^4$ are the same or different and each is a hydrocarbon group having 1 to 6 carbon atoms.

9. The process for preparing the fluorine-containing polymer (B1) having a protective group of claim 6, wherein the tertiary amines are represented by the formula (4):

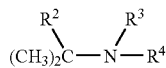
(4)

wherein $R^2$ is H or $CH_3$; $R^3$ and $R^4$ are the same or different and each is a hydrocarbon group having 1 to 6 carbon atoms.

10. The process for preparing the fluorine-containing polymer (B1) having a protective group of claim 7, wherein $R^2$ is H and $R^3$ is $(CH_3)_2CH$—.

11. The process for preparing the fluorine-containing polymer (B1) having a protective group of claim 8, wherein $R^2$ is H and $R^3$ is $(CH_3)_2CH$—.

12. The process for preparing the fluorine-containing polymer (B1) having a protective group of claim 9, wherein $R^2$ is H and $R^3$ is $(CH_3)_2CH$—.

* * * * *

UNITED STATES PATENT AND TRADEMARK OFFICE
CERTIFICATE OF CORRECTION

PATENT NO. : 7,163,982 B2 Page 1 of 1
APPLICATION NO. : 10/914203
DATED : January 16, 2007
INVENTOR(S) : Takayuki Araki, Tetsuhiro Kodani and Takuji Ishikawa It is certified that error appears in the above-identified patent and that said Letters Patent is hereby corrected as shown below:

On the title page item (73) Assignee: delete "Daiki Industries, Ltd." and insert --Daikin Industries, Ltd.--

Signed and Sealed this

Twenty-second Day of May, 2007

JON W. DUDAS
*Director of the United States Patent and Trademark Office*